US012029025B2

(12) United States Patent
Lin et al.

(10) Patent No.: US 12,029,025 B2
(45) Date of Patent: Jul. 2, 2024

(54) SEMICONDUCTOR DEVICE STRUCTURE

(71) Applicant: Taiwan Semiconductor Manufacturing Company, Ltd., Hsinchu (TW)

(72) Inventors: Ta-Chun Lin, Hsinchu (TW); Kuo-Hua Pan, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/839,047

(22) Filed: Jun. 13, 2022

(65) Prior Publication Data

US 2022/0320116 A1 Oct. 6, 2022

Related U.S. Application Data

(63) Continuation of application No. 16/838,198, filed on Apr. 2, 2020, now Pat. No. 11,362,096.

(Continued)

(51) Int. Cl.
*H10B 10/00* (2023.01)
*H01L 21/02* (2006.01)
(Continued)

(52) U.S. Cl.
CPC ..... *H10B 10/125* (2023.02); *H01L 21/02532* (2013.01); *H01L 21/02603* (2013.01); *H01L 21/30604* (2013.01); *H01L 21/308* (2013.01); *H01L 21/823807* (2013.01); *H01L 21/823814* (2013.01); *H01L 21/82385* (2013.01);
(Continued)

(58) Field of Classification Search
CPC ............ H01L 27/0922; H01L 27/0688; H01L 27/092; H01L 27/0924; H01L 27/1054; H01L 27/66439; H01L 27/66795; H01L 27/785; H01L 29/0649; H01L 29/0673; H01L 29/42392; H01L 29/78618; H01L 29/78696; H01L 21/02603; H10B 10/125
See application file for complete search history.

(56) References Cited

U.S. PATENT DOCUMENTS 9,209,247 B2 12/2015 Colinge et al.
9,236,267 B2 1/2016 De et al.
(Continued)

FOREIGN PATENT DOCUMENTS

DE 112015007207 T5 9/2018
KR 10-2015-0033496 A 4/2015
(Continued)

*Primary Examiner* — Dao H Nguyen
(74) *Attorney, Agent, or Firm* — Birch, Stewart, Kolasch & Birch, LLP

(57) ABSTRACT

A semiconductor device structure is provided. The semiconductor device structure includes a first device formed over a substrate, wherein the first device includes a first fin structure and a first S/D structure formed over the first fin structure. The semiconductor device structure includes a second device formed over or below the first device, and the second device includes a plurality of second nanostructures stacked in a vertical direction. The semiconductor device structure also includes a second S/D structure formed over the second nanostructures, and the second S/D structure is directly above or below the first S/D structure.

20 Claims, 48 Drawing Sheets

Related U.S. Application Data

(60) Provisional application No. 62/954,191, filed on Dec. 27, 2019.

(51) Int. Cl.
    *H01L 21/306*      (2006.01)
    *H01L 21/308*      (2006.01)
    *H01L 21/8238*     (2006.01)
    *H01L 27/092*      (2006.01)
    *H01L 29/06*       (2006.01)
    *H01L 29/423*      (2006.01)
    *H01L 29/66*       (2006.01)
    *H01L 29/786*      (2006.01)

(52) U.S. Cl.
    CPC ............... *H01L 21/823864* (2013.01); *H01L 21/823878* (2013.01); *H01L 27/0922* (2013.01); *H01L 29/0649* (2013.01); *H01L 29/0673* (2013.01); *H01L 29/42392* (2013.01); *H01L 29/66545* (2013.01); *H01L 29/66553* (2013.01); *H01L 29/66742* (2013.01); *H01L 29/78618* (2013.01); *H01L 29/78696* (2013.01)

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 9,627,540 B1 | 4/2017 | Chen et al. |
| 10,141,403 B1 | 11/2018 | Cheng et al. |
| 10,170,484 B1 | 1/2019 | Sung et al. |
| 10,229,971 B1 | 3/2019 | Cheng et al. |
| 2011/0014769 A1 | 1/2011 | Pouydebasque et al. |
| 2017/0140996 A1 | 5/2017 | Lin et al. |
| 2017/0141112 A1 | 5/2017 | Ching et al. |
| 2019/0131394 A1* | 5/2019 | Reznicek .......... H01L 21/30604 |
| 2019/0172755 A1 | 6/2019 | Smith et al. |
| 2019/0172828 A1* | 6/2019 | Smith ................ B82Y 10/00 |
| 2019/0326286 A1* | 10/2019 | Xie .................. H01L 29/401 |
| 2020/0006340 A1* | 1/2020 | Lilak ............... H01L 29/78696 |
| 2020/0098756 A1* | 3/2020 | Lilak ............... H01L 29/78696 |
| 2020/0126987 A1* | 4/2020 | Rubin ............... H01L 29/0847 |
| 2020/0294969 A1 | 9/2020 | Rachmady et al. |
| 2020/0294998 A1 | 9/2020 | Lilak et al. |
| 2021/0098306 A1* | 4/2021 | Smith ................ H01L 27/092 |

FOREIGN PATENT DOCUMENTS

| | | |
|---|---|---|
| KR | 10-2017-0113171 A | 10/2017 |
| KR | 10-2018-0070316 A | 6/2018 |
| KR | 10-2019-0024600 A | 3/2019 |
| KR | 10-2019-0024625 A | 3/2019 |
| KR | 10-2019-0032150 A | 3/2019 |
| KR | 10-1959625 B1 | 3/2019 |
| KR | 10-2019-0038282 A | 4/2019 |
| TW | 201916113 A | 4/2019 |
| WO | WO 2019/132893 A1 | 7/2019 |

* cited by examiner

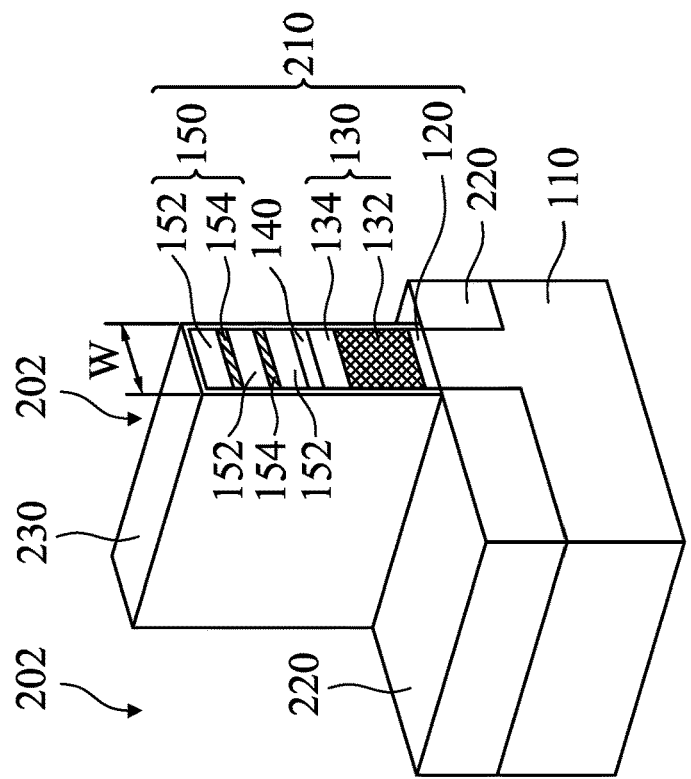
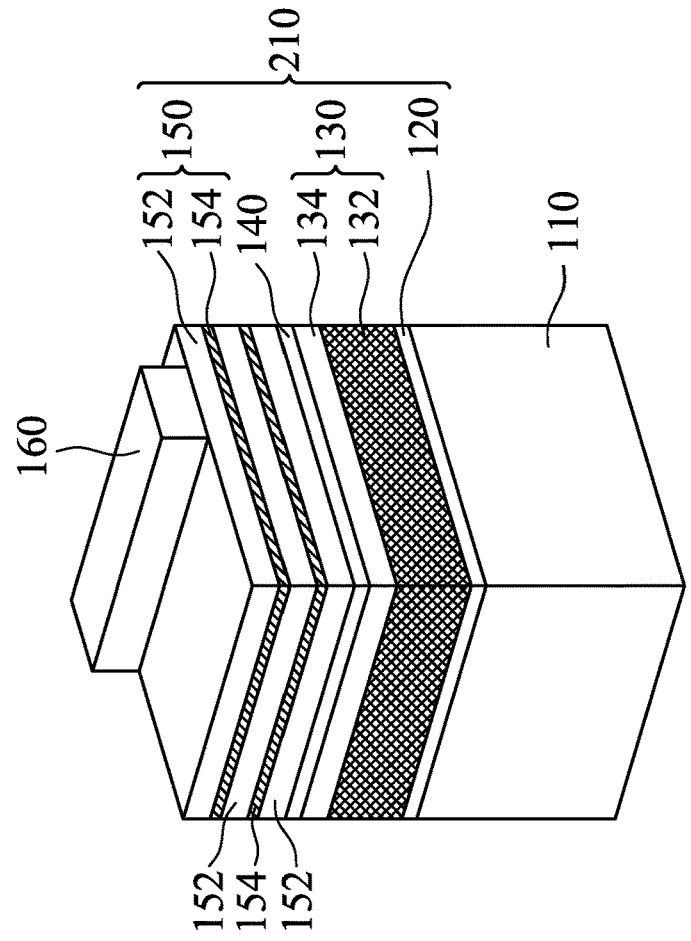
Fig. 1B
Fig. 1A

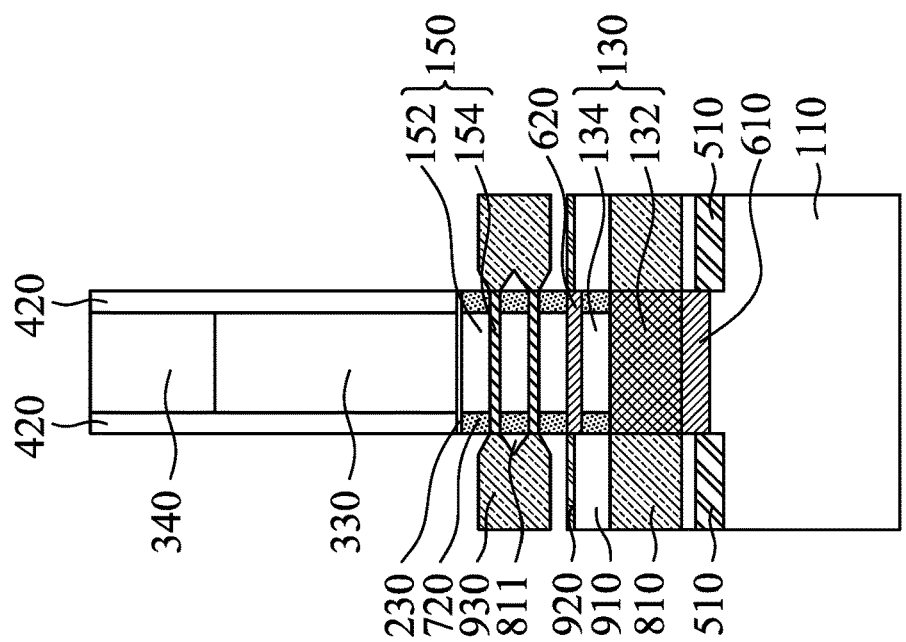
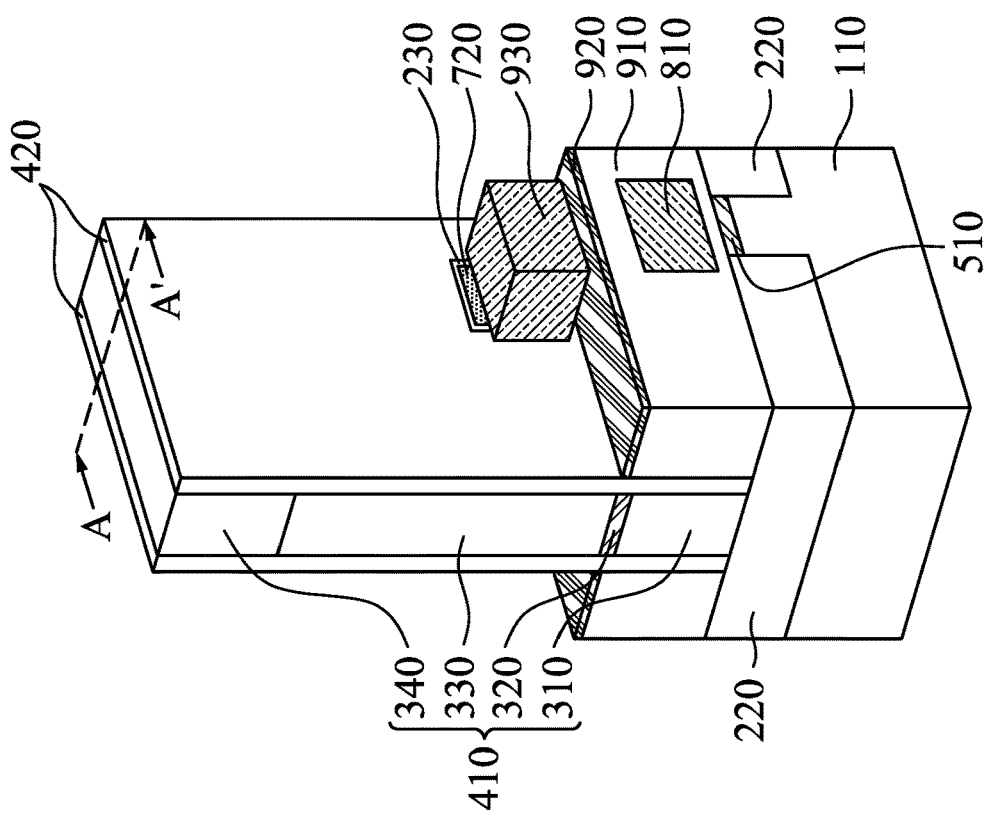
Fig. 1I-1
Fig. 1I-2

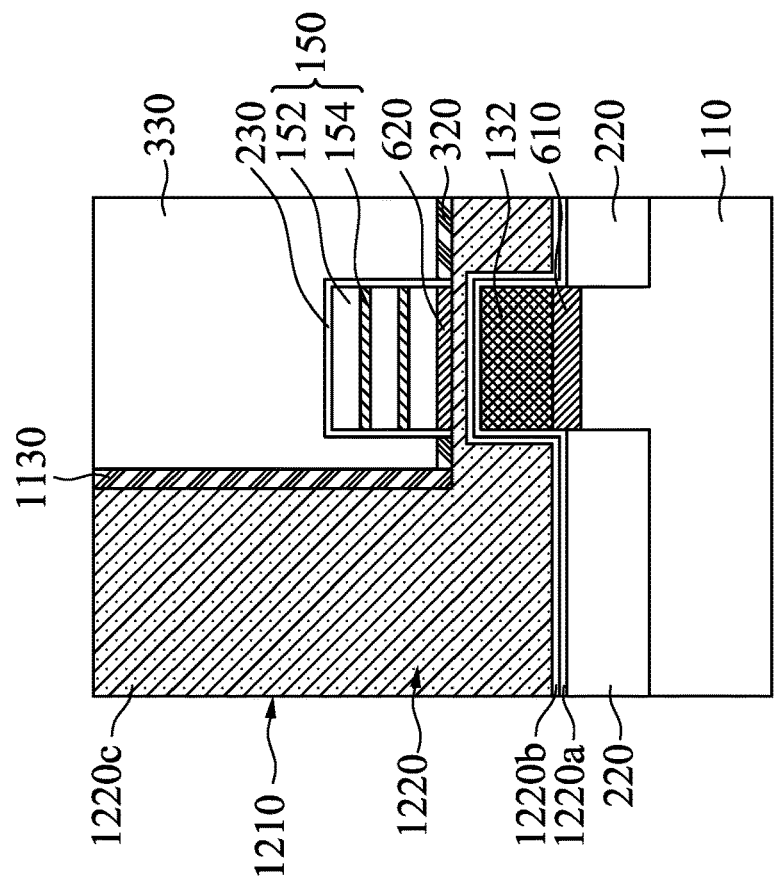
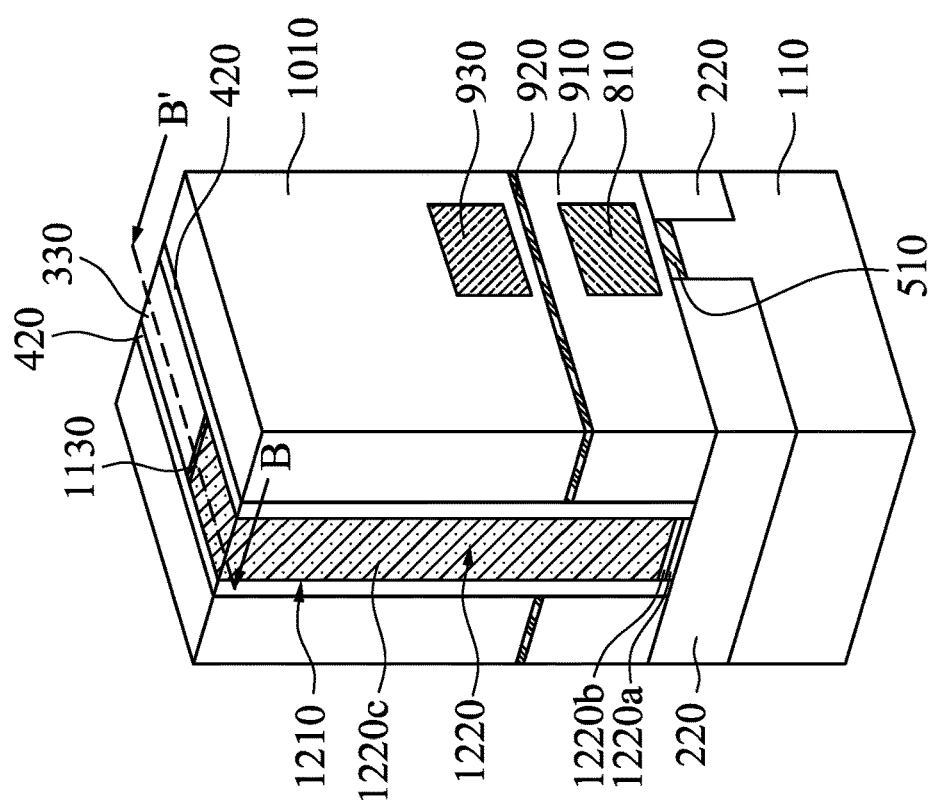
Fig. 1L-2
Fig. 1L-1

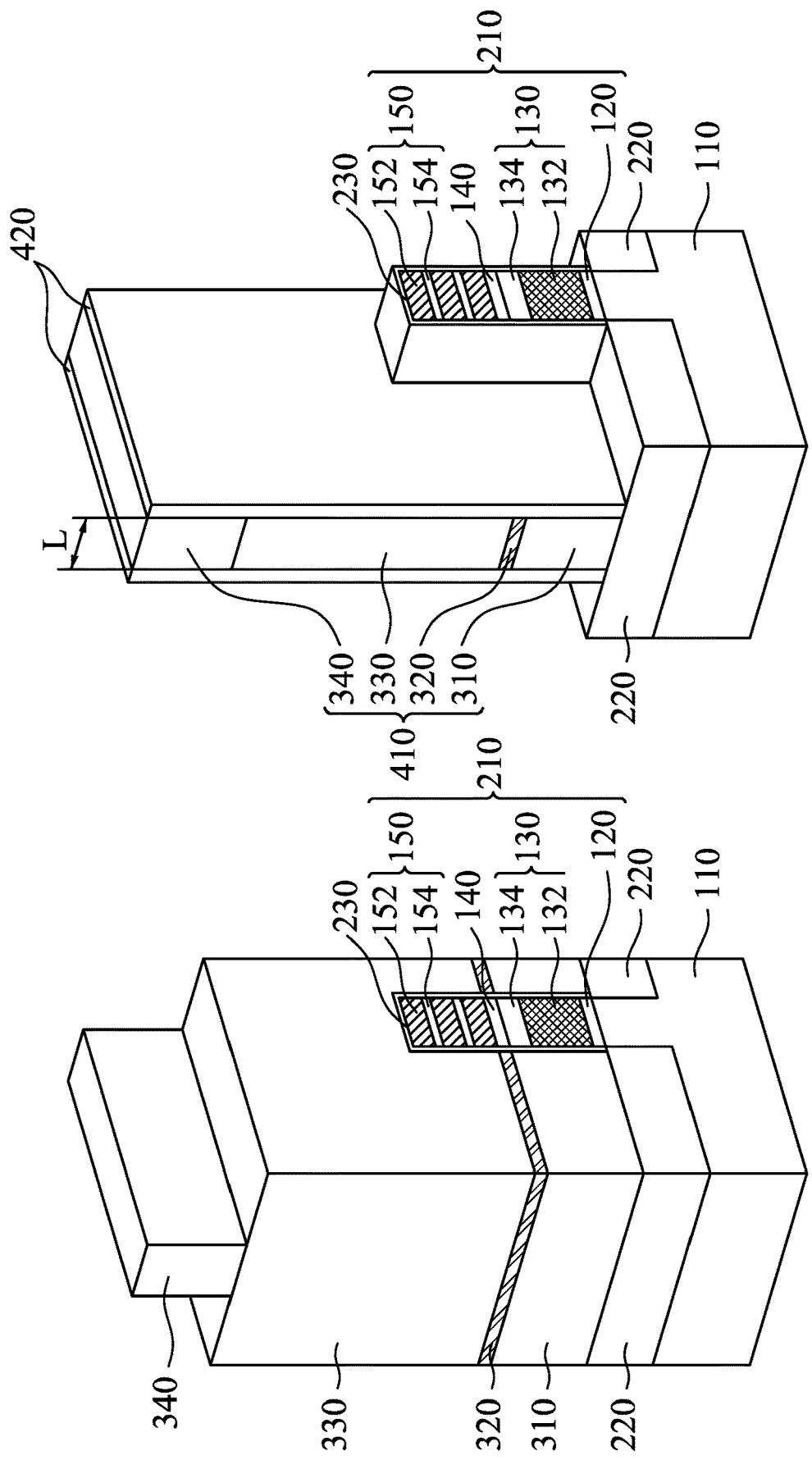

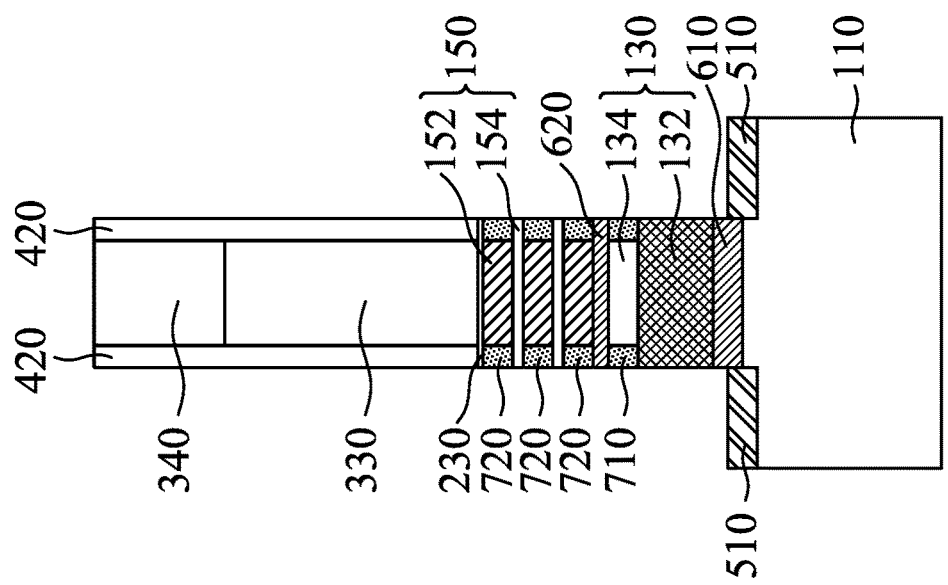
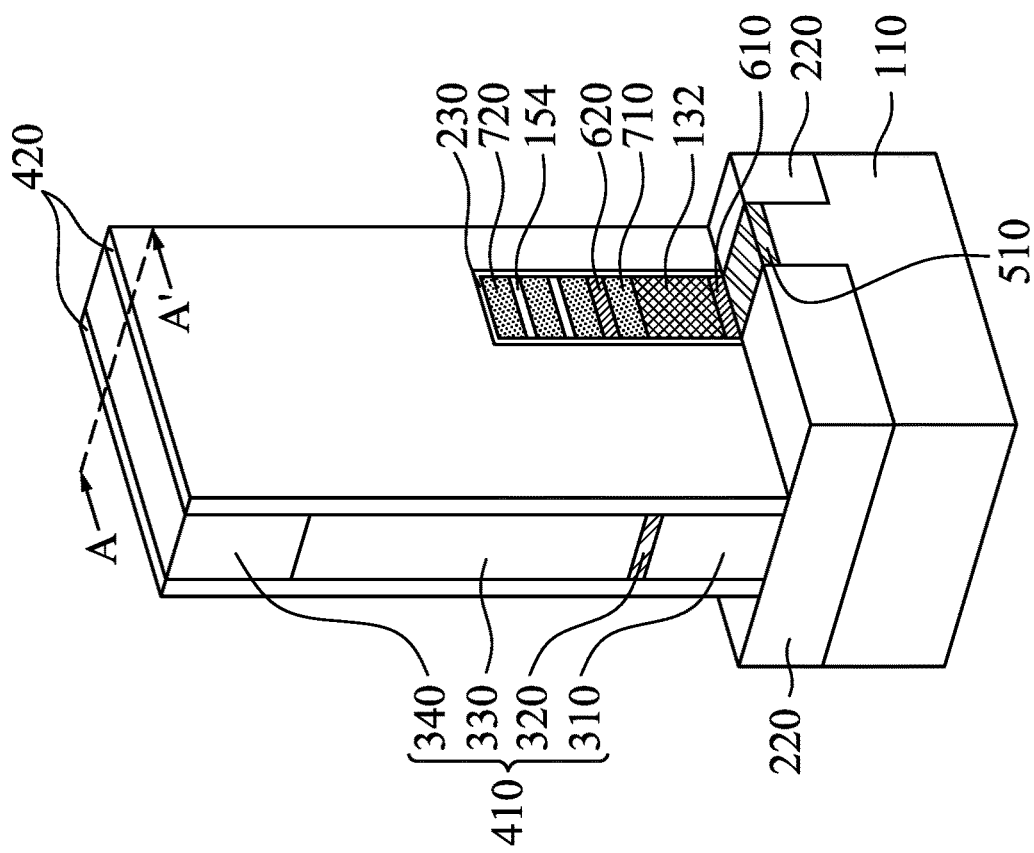
Fig. 2G-1
Fig. 2G-2

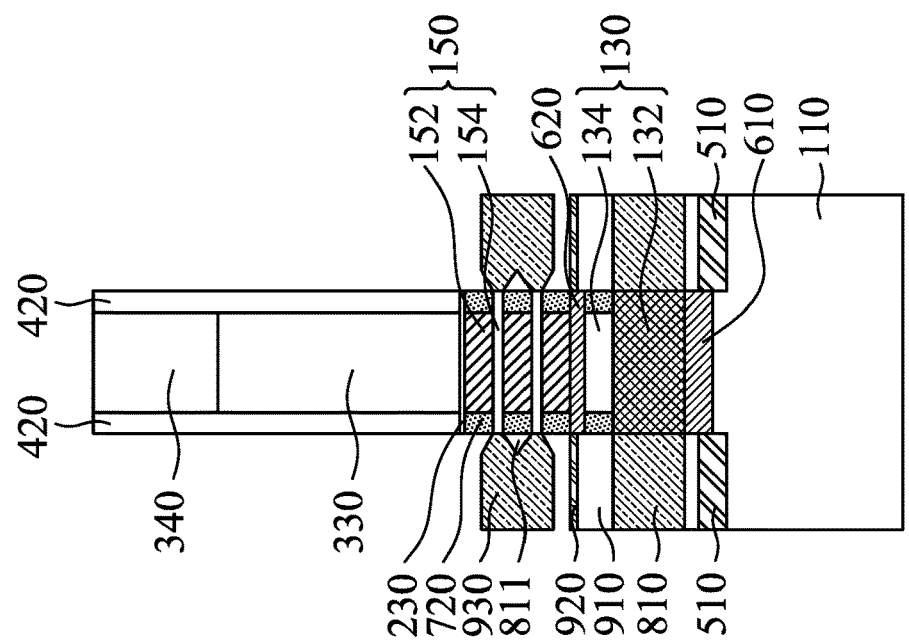
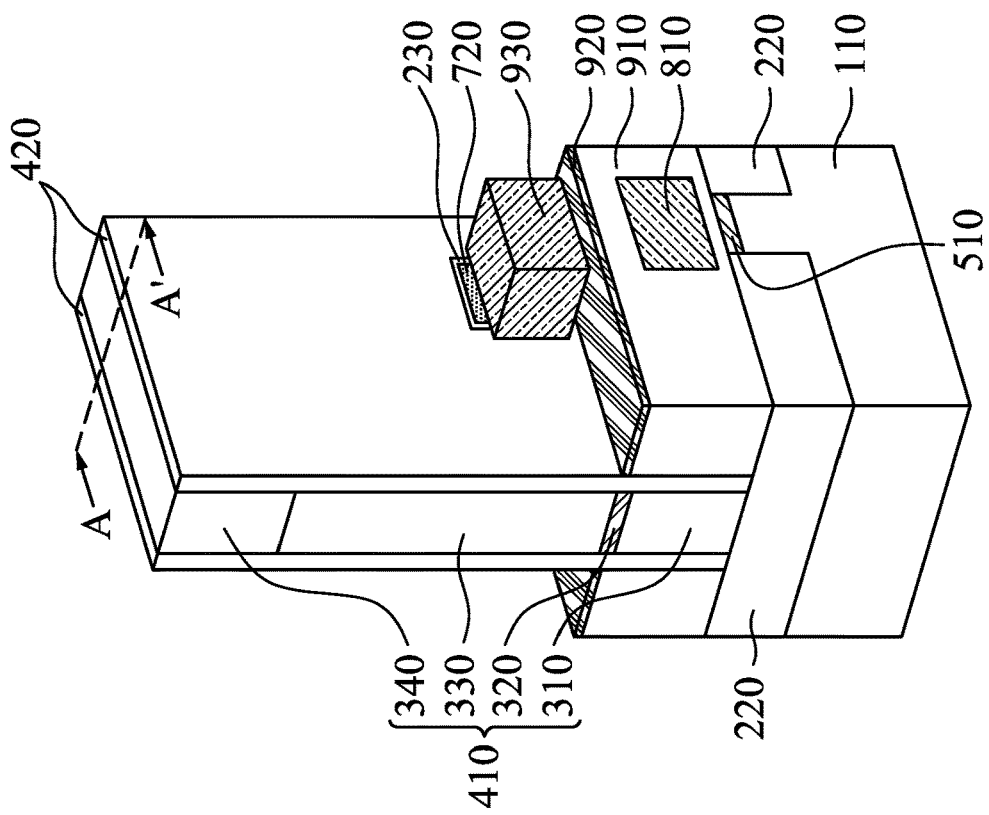
Fig. 2I-1
Fig. 2I-2

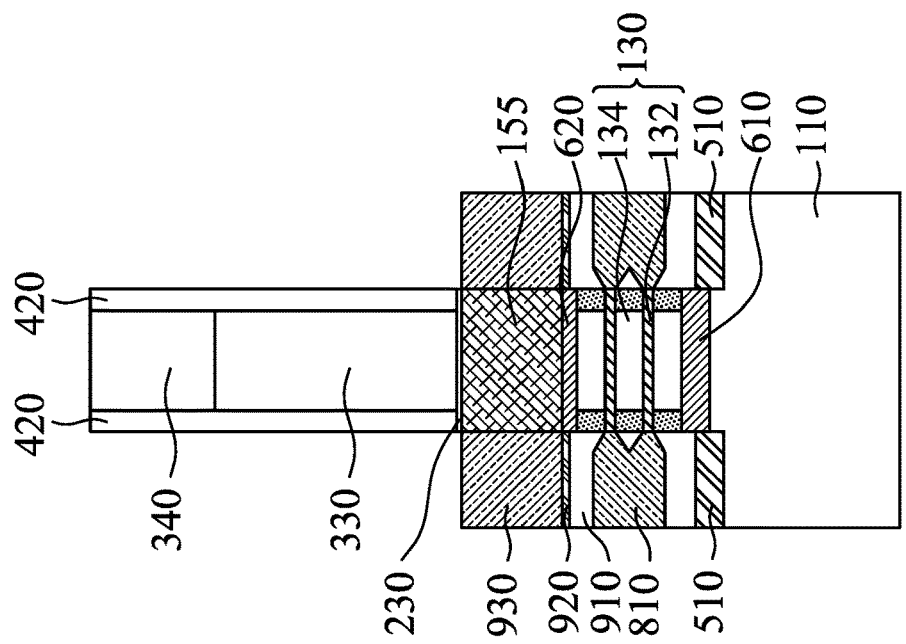
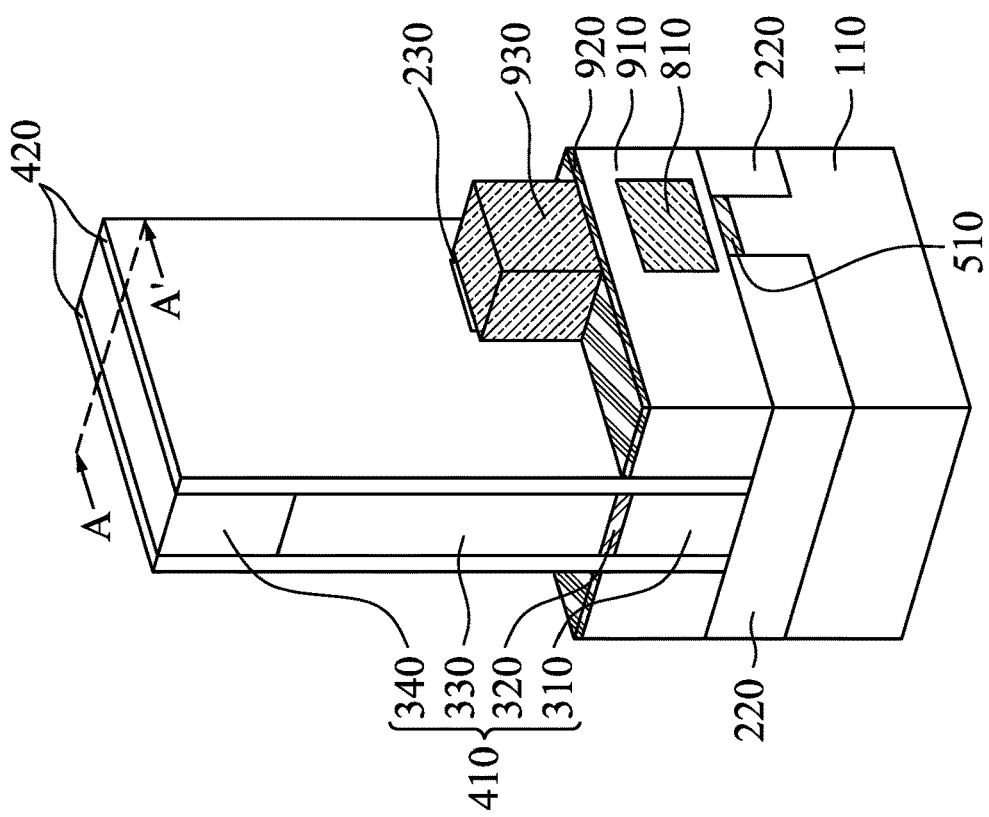
Fig. 3I-1
Fig. 3I-2

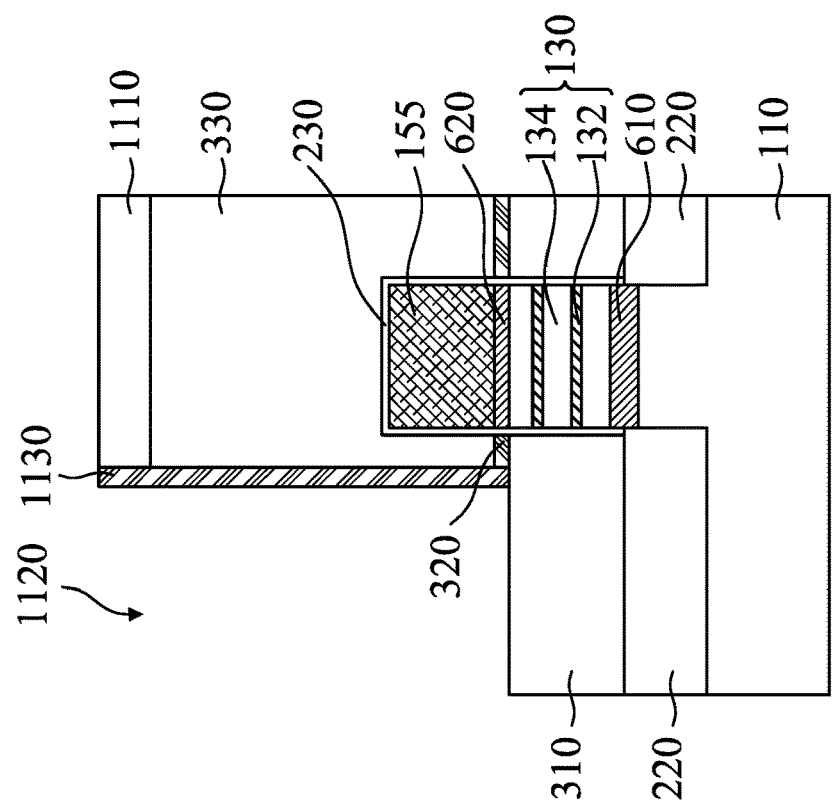
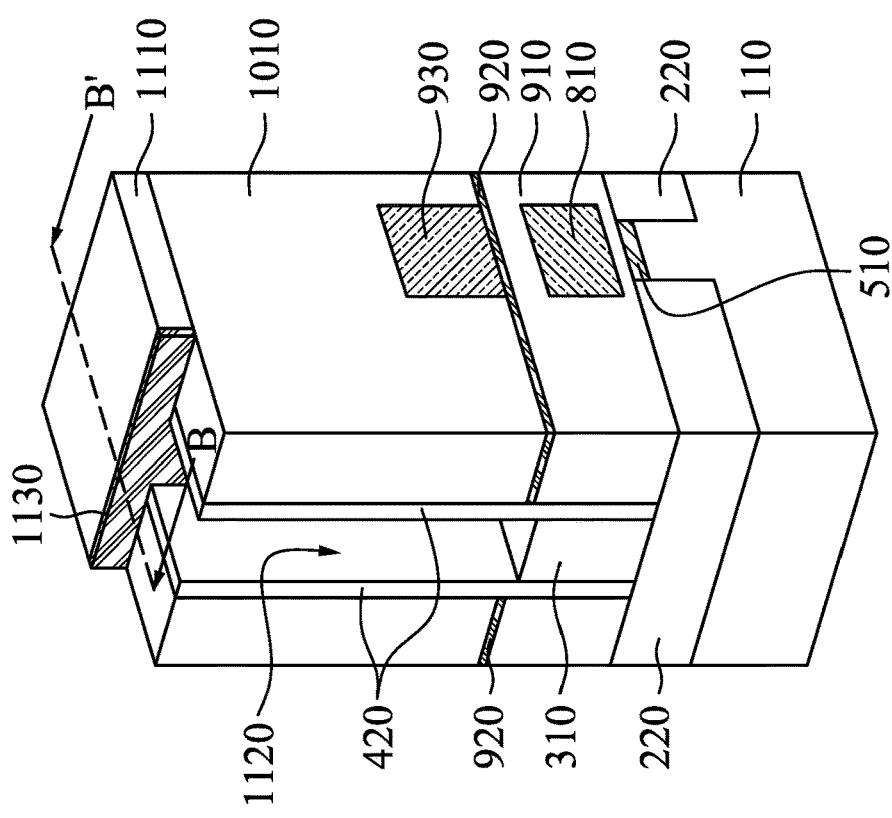
Fig. 3K-2
Fig. 3K-1

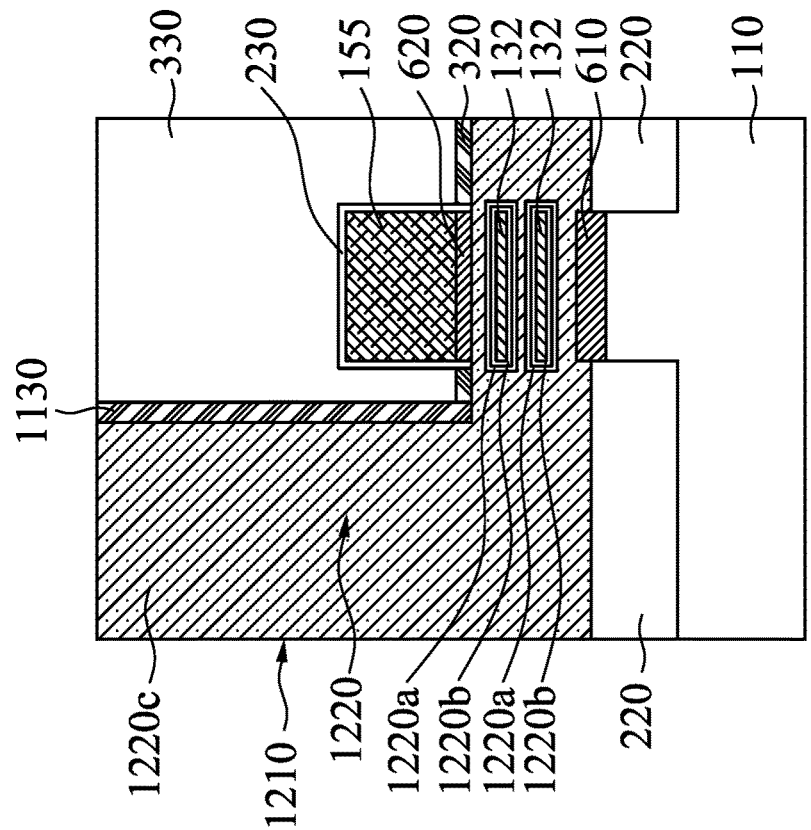
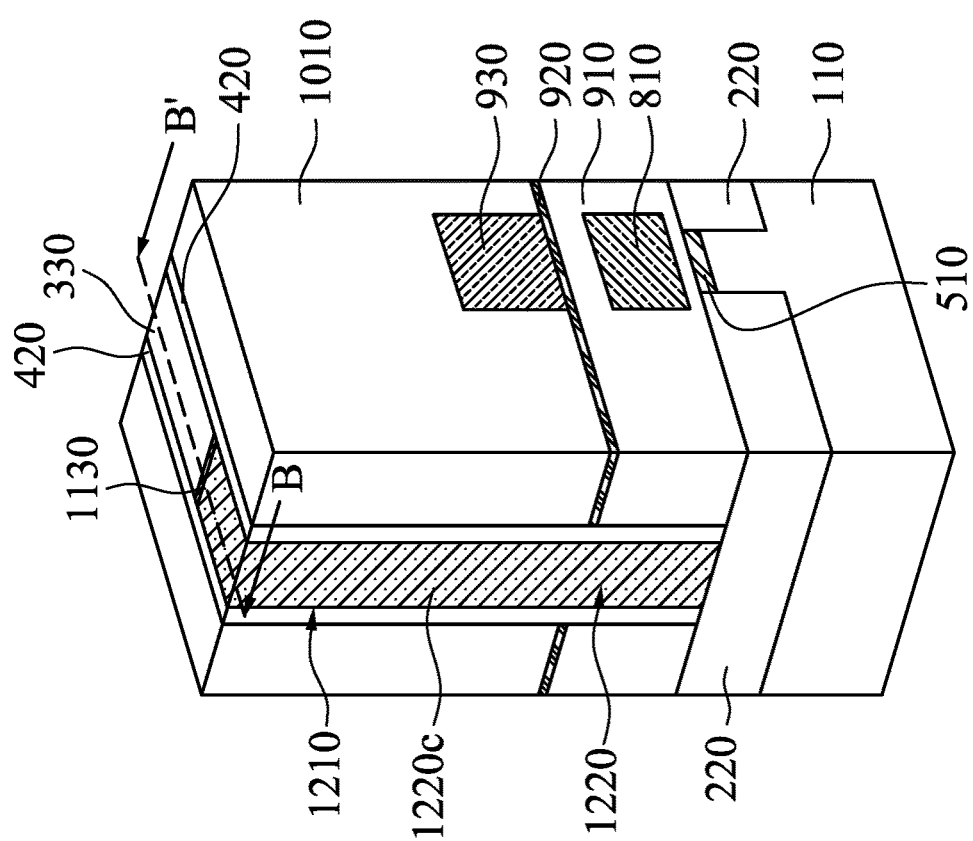
Fig. 3L-2
Fig. 3L-1

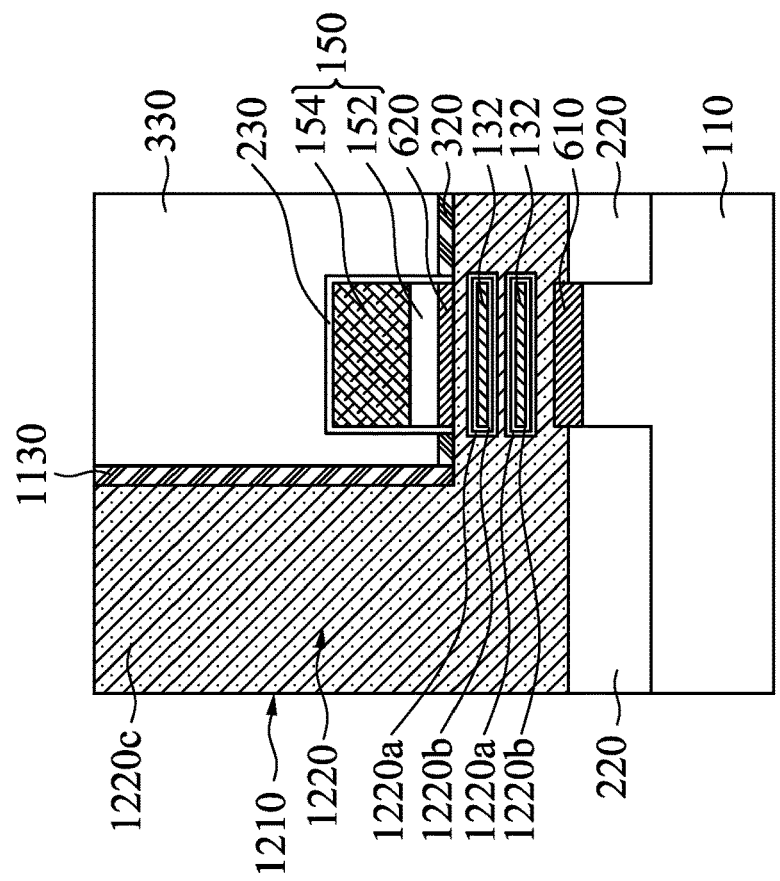
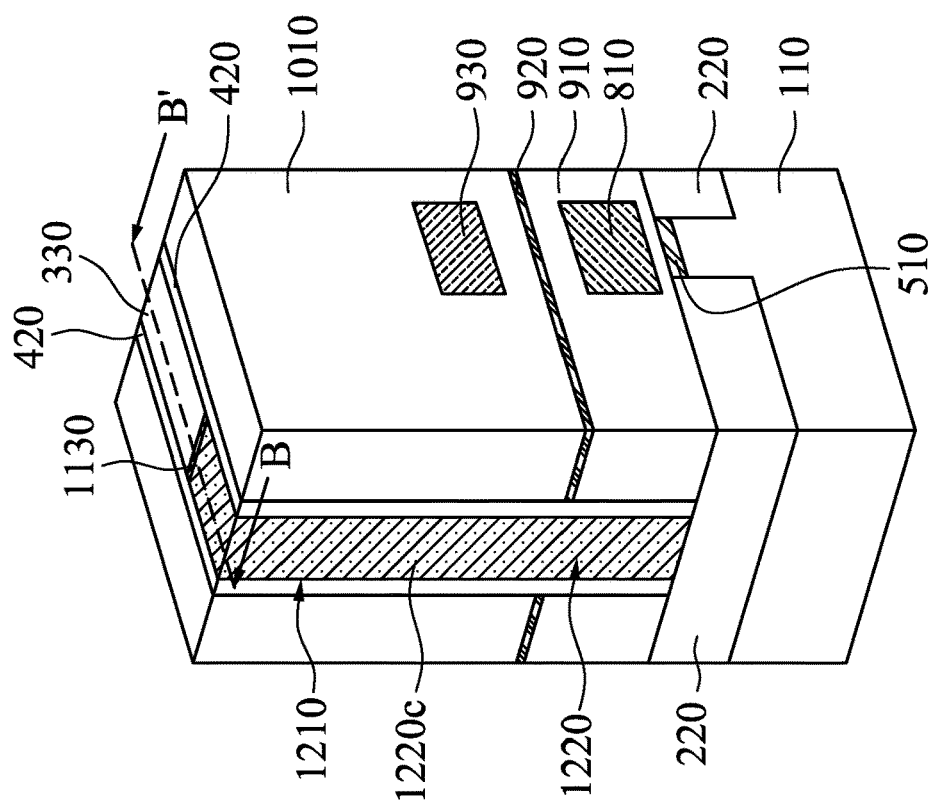
Fig. 4L-2
Fig. 4L-1

SEMICONDUCTOR DEVICE STRUCTURE

CROSS REFERENCE TO RELATED APPLICATIONS

This application is a Continuation application of U.S. patent application Ser. No. 16/838,198, filed on Apr. 2, 2020, the entire of which is incorporated by reference herein. This application claims the benefit of U.S. Provisional Application No. 62/954,191 filed on Dec. 27, 2019, the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semi-conductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

As the semiconductor industry has progressed into nanometer technology process nodes in pursuit of higher device density, higher performance, and lower costs, challenges from both fabrication and design issues have resulted in the development of three-dimensional designs.

Although existing semiconductor devices have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 1A-1F, 1G-1, 1G-2, 1H-1, 1H-2, 1I-1, 1I-2, 1J, 1K-1, 1K-2, 1L-1, 1L-2, 1M-1, 1M-2, 1N-1Q show perspective representations of various stages of forming a semiconductor device structure, in accordance with some embodiments of the disclosure.

FIGS. 2A-2F, 2G-1, 2G-2, 2H-1, 2H-2, 2I-1, 2I-2, 2J, 2K-1, 2K-2, 2L-1, 2L-2, 2M-1, 2M-2, 2N-2Q show perspective representations of various stages of forming a semiconductor device structure, in accordance with some embodiments of the disclosure.

FIGS. 3A-3F, 3G-1, 3G-2, 3H-1, 3H-2, 3I-1, 3I-2, 3J, 3K-1, 3K-2, 3L-1, 3L-2, 3M-1, 3M-2, 3N-3Q show perspective representations of various stages of forming a semiconductor device structure, in accordance with some embodiments of the disclosure.

FIGS. 4A-4F, 4G-1, 4G-2, 4H-1, 4H-2, 4I-1, 4I-2, 4J, 4K-1, 4K-2, 4L-1, 4L-2, 4M-1, 4M-2, 4N-4Q show perspective representations of various stages of forming a semiconductor device structure, in accordance with some embodiments of the disclosure.

DETAILED DESCRIPTION

Figures 1C, 1D:
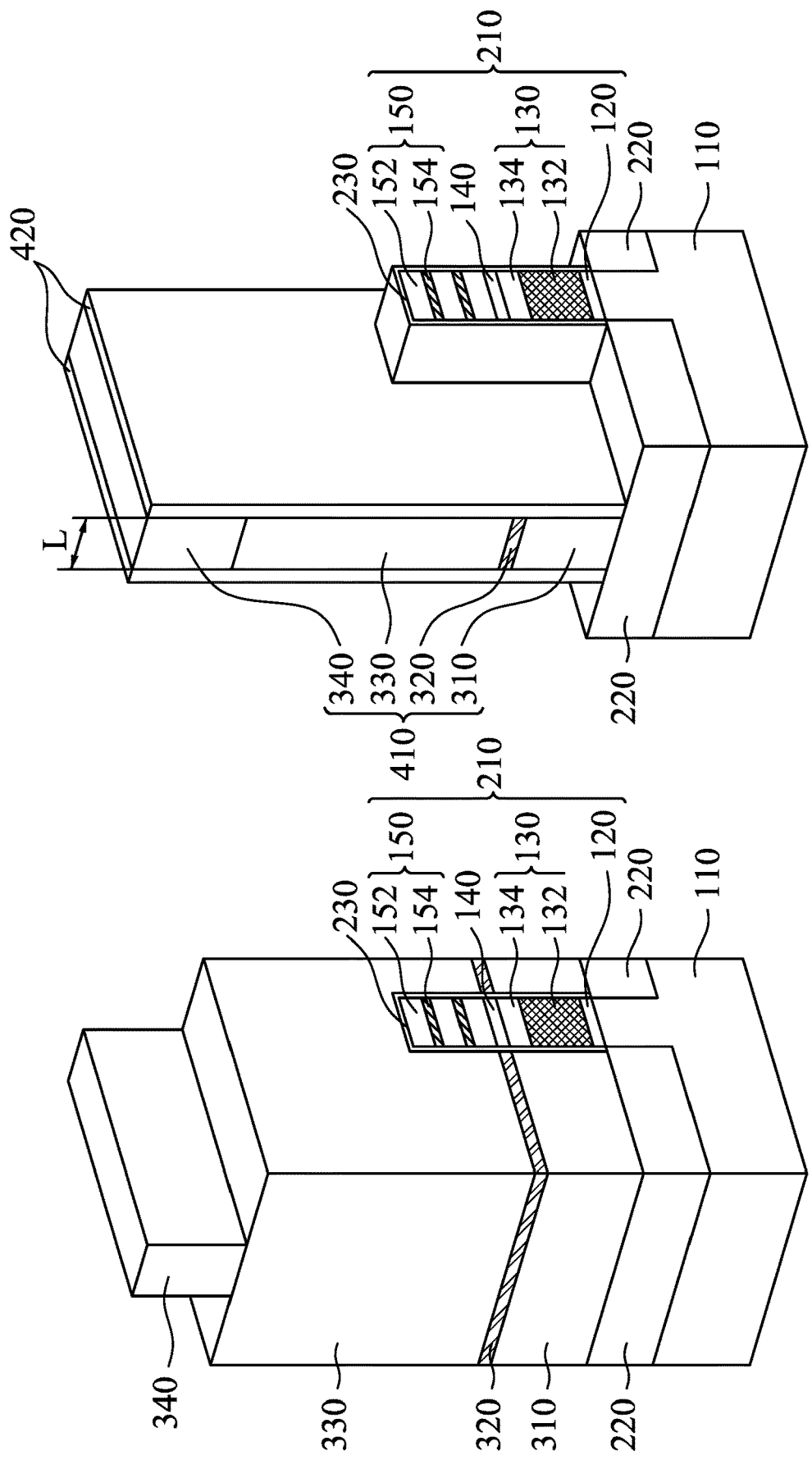

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

The nanostructure transistor, for example, gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA device.

The present disclosure is related to semiconductor devices and methods of forming the same. More particularly, the present disclosure is related to a nanostructure device integrated with a FinFET device. A nanostructure device, for example, gate-all-around (GAA), includes a device that has its gate structure, or portions thereof, formed on four-sides of a channel region (e.g., surrounding a portion of a channel region). The channel region of a nanostructure device may include nanostructure channels, for example, nanowire channels, bar-shaped channels, and/or other suitable channel configurations. In some embodiments, the channel region of a GAA device may have multiple horizontal nanostructures (such as horizontal nanowires or horizontal bars) vertically spaced, making the GAA device a stacked horizontal GAA (S-HGAA) device. Further, the GAA devices may have one or more nanostructures channel regions (e.g. nanowires, nanosheets) associated with a single, contiguous gate structure, or multiple gate structures. One of ordinary skill may recognize other examples of semiconductor devices that may benefit from aspects of the present disclosure.

Embodiments for forming a semiconductor device structure 100a are provided. FIGS. 1A-1Q show perspective representations of various stages of forming a semiconductor device structure 100a, in accordance with some embodiments of the disclosure. The semiconductor device structure may include a static random access memory (SRAM) and/or logic circuits, passive components (such as resistors, capacitors, and inductors), and active components (such as p-type field effect transistors (PFETs), n-type FETs (NFETs), multi-gate FETs), metal-oxide semiconductor field effect transistors (MOSFETs), complementary metal-oxide semiconductor (CMOS) transistors, bipolar transistors, high voltage transistors, high frequency transistors, other memory cells, and combinations thereof.

As shown in FIG. 1A, a substrate 110 is provided. The substrate 110 may be made of silicon or other semiconductor materials. Alternatively or additionally, the substrate 110 may include other elementary semiconductor materials such as germanium. In some embodiments, the substrate 110 is made of a compound semiconductor such as silicon carbide, gallium arsenic, indium arsenide, or indium phosphide. In some embodiments, the substrate 110 is made of an alloy semiconductor such as silicon germanium, silicon germanium carbide, gallium arsenic phosphide, or gallium indium phosphide. In some embodiments, the substrate 110 includes an epitaxial layer. For example, the substrate 110 has an epitaxial layer overlying a bulk semiconductor.

A first sacrificial layer 120 is formed on the substrate 110. The first sacrificial layer 120 may be epitaxially grown on the substrate 110, such that the first sacrificial layer 120 forms a crystalline layer. In some embodiments, the first sacrificial layer 120 and the substrate 110 have different materials and/or components, such that the first sacrificial layer 120 and the substrate 110 have different etching rates. In some embodiments, the first sacrificial layer 120 is made of silicon germanium (SiGe). The germanium percentage (atomic percentage) of the first sacrificial layer 120 is in a range between about 40 percent and about 60 percent, while higher or lower germanium percentages may be used. It is noted that the values recited throughout the description are examples, and may be changed to different values. In some embodiments, the thickness of the first sacrificial layer 120 is in a range between about 20 nm to about 100 nm.

A first semiconductor stack 130 is formed over the first sacrificial layer 120. The first semiconductor stack 130 includes a first fin structure 132 and a semiconductor layer 134. The first fin structure 132 is formed over the first sacrificial layer 120. In some embodiments, the first fin structure 132 is made of silicon (Si). In some embodiments, the first fin structure 132 is made of silicon that is free from germanium (Ge). In some embodiments, the first fin structure 132 is substantially pure silicon layers, for example, with a germanium percentage lower than about 1 percent. Furthermore, the first fin structure 132 may be intrinsic, which are not doped with p-type and n-type impurities.

The semiconductor layer 134 is formed over the first fin structure 132. In some embodiments, the semiconductor layer 134 is made of SiGe layers having a germanium percentage lower than the germanium percentage in the first sacrificial layer 120. In some embodiments, the germanium percentage of the semiconductor layer 134 is in a range between about 20 percent and about 30 percent. Furthermore, a difference between the germanium percentages of the first sacrificial layer 120 and the germanium percentage of the semiconductor layer 134 may be greater than about 20 percent or higher. In some embodiments, the thickness of the semiconductor layer 134 is in a range between about 10 nm and about 20 nm.

A second sacrificial layer 140 is formed on the first semiconductor stack 130. The second sacrificial layer 140 may be epitaxially grown on the first semiconductor stack 130, such that the second sacrificial layer 140 forms a crystalline layer. In some embodiments, the second sacrificial layer 140 and the substrate 110 have different materials and/or components, such that the second sacrificial layer 140 and the substrate 110 have different etching rates. Furthermore, the second sacrificial layer 140 and the first sacrificial layer 120 have substantially the same material and/or component, such that the second sacrificial layer 140 and the first sacrificial layer 120 have substantially the same etching rate. In some embodiments, the second sacrificial layer 140 is made of silicon germanium (SiGe). The germanium percentage (atomic percentage) of the second sacrificial layer 140 is in a range between about 40 percent and about 60 percent, while higher or lower germanium percentages may be used. It is noted that the values recited throughout the description are examples, and may be changed to different values. In some embodiments, the thickness of the second sacrificial layer 140 is in a range between about 20 nm to about 100 nm.

A second semiconductor stack 150 is formed over the second sacrificial layer 140 through epitaxy, such that the second semiconductor stack 150 forms crystalline layers. The second semiconductor stack 150 includes a number of semiconductor layers 152 and 154 stacked alternatively. The semiconductor layers 152 can be SiGe layers having a germanium percentage lower than the germanium percentage in the second sacrificial layer 140. In some embodiments, the germanium percentage of the semiconductor layers 152 is in a range between about 20 percent and about 30 percent. Furthermore, a difference between the germanium percentage of the second sacrificial layer 140 and the germanium percentage of the semiconductor layers 152 may be greater than about 20 percent or higher. In some embodiments, the thickness of each of the semiconductor layers 152 is in a range between about 10 nm and about 20 nm.

The semiconductor layers 154 may be pure silicon layers that are free from germanium. The semiconductor layers 154 may also be substantially pure silicon layers, for example, with a germanium percentage lower than about 1 percent. Furthermore, the semiconductor layers 154 may be intrinsic, which are not doped with p-type and n-type impurities. There may be two, three, four, or more of the semiconductor layers 154. In some embodiments, the thickness of each of the semiconductor layers 154 is in a range between about 3 nm and about 10 nm. In some other embodiments, however, the semiconductor layers 154 can be silicon germanium or germanium for p-type semiconductor device, or can be III-V materials, such as InAs, InGaAs, InGaAsSb, GaAs, InPSb, or another suitable material.

A patterned hard mask 160 is formed over the second semiconductor stack 150. In some embodiments, the patterned hard mask 160 is made of silicon nitride, silicon oxynitride, silicon carbide, silicon carbo-nitride, or the like. The patterned hard mask 160 covers a portion of the second semiconductor stack 150 while leaves another portion of the second semiconductor stack 150 uncovered.

Afterwards, as shown in FIG. 1B, the substrate 110, the first sacrificial layer 120, the first semiconductor stack 130, the second sacrificial layer 140, and the second semiconductor stack 150 are patterned by using the patterned hard mask 160 to form a semiconductor strip 210, in accordance with some embodiments of the disclosure. As a result, trenches 202 are formed. In some embodiments, the width W of the semiconductor strip 210 is in a range of about 10 nm to about 100 nm.

Next, an insulating material is formed over the substrate 110 and over the semiconductor strip 210. Next, a portion of the insulating material is removed to form an isolation structure 220, in accordance with some embodiments. As a result, the top portion of the semiconductor strip 210 is above the isolation structure 220.

In some embodiments, the insulating material is made of silicon oxide, silicon nitride, silicon oxynitride (SiON), another applicable insulating material, or a combination thereof. In some embodiments, the insulating material is formed by a LPCVD process, plasma enhanced CVD (PECVD) process, high density plasma CVD (HDP-CVD) process, high aspect ratio process (HARP) process, flowable CVD (FCVD) process, atomic layer deposition (ALD) process, another suitable method, or a combination thereof.

A dummy dielectric layer 230 is conformally formed to cover the semiconductor strip 210 and the top surface of the isolation layer 220. Afterwards, a portion of the dummy dielectric layer 230 is removed. The dummy dielectric layer 230 can be used to protect the semiconductor strip 210 from being damaged by the subsequent processing (e.g., subsequent formation of the dummy gate structure). In some embodiments, the dummy dielectric layer 230 includes silicon dioxide, silicon nitride, a high-k dielectric material or another suitable material. In some embodiments, the dummy dielectric layer 230 is deposited by an ALD process, a CVD process, a subatmospheric CVD (SACVD) process, a flowable CVD process, a PVD process, or another suitable process.

Figure 1F:
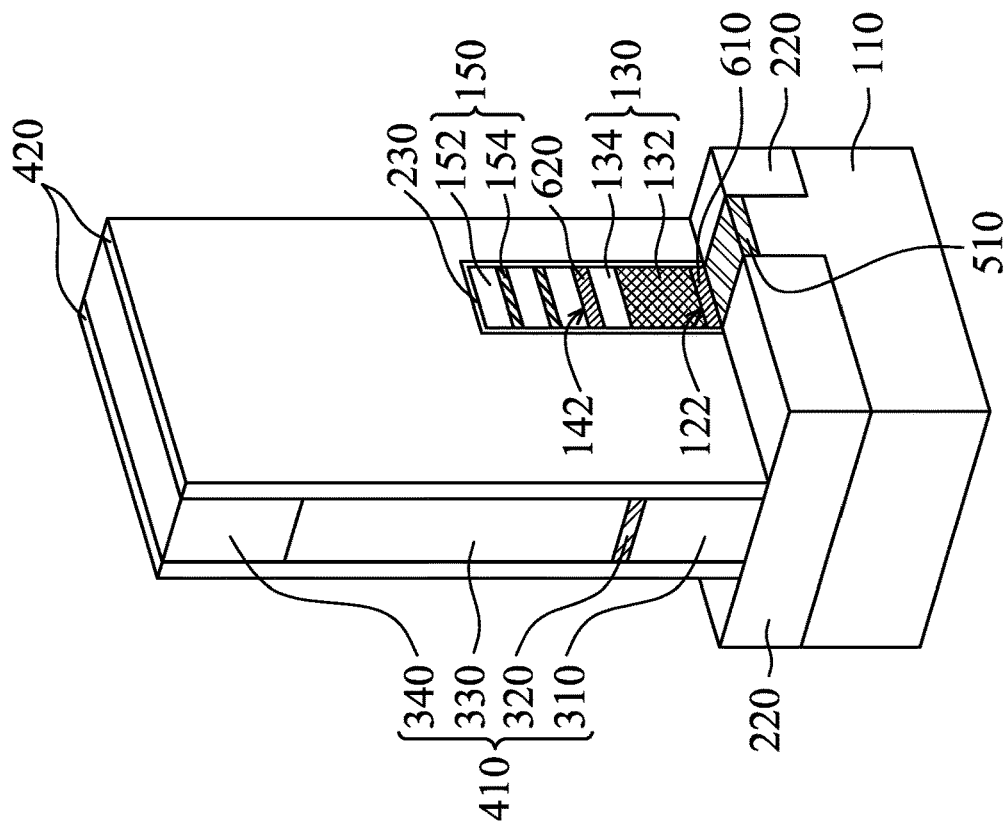

Afterwards, as shown in FIG. 1C, a first dummy gate layer 310 is formed on the isolation structure 220 and at least on opposite sides of the semiconductor strip 210.

In some embodiments, the first dummy gate layer 310 includes polycrystalline silicon (polysilicon). In some embodiments, the first dummy gate layer 310 is formed by various process operations such as deposition, planarization, etching, as well as other suitable processing operations. The deposition processes includes CVD (including both low-pressure CVD and plasma-enhanced CVD), PVD, ALD, thermal oxidation, e-beam evaporation, another suitable deposition technique, or a combination thereof. A planarization process, such as a chemical mechanical planarization (CMP) process, may then be performed to expose the top surface of the dummy dielectric layer 230. The CMP process may remove portions of the first dummy gate layer 310 overlying the semiconductor strip 210 and may planarize the top surface of the structure. Then, an etching back process is performed to reduce the thickness of the first dummy gate layer 310 until the top surface of the first dummy gate layer 310 is substantially leveled with the top surface, the bottom surface, or intermediate level of the second sacrificial layer 140. In some embodiments, the etching process includes dry etching (e.g., RIE etching), wet etching, and/or other etching methods.

An etch stop layer 320 is formed on the first dummy gate layer 310. In some embodiments, the top surface of the etch stop layer 320 is substantially leveled with the top surface of the second sacrificial layer 240. In some embodiments, the etch stop layer 320 is made of silicon dioxide. In some embodiments, the etch stop layer 320 is formed by implanting the oxygen ions into portions of the first dummy gate layer 310 beneath the top surface of the first dummy gate layer 310, and performing a thermal operation (such as a thermal operation) to anneal the first dummy gate layer 310. Therefore, a reaction occurs between the implanted oxygen and the surrounding the first dummy gate layer 310 to provide the etch stop layer 320 on the first dummy gate layer 310. That is, the etch stop layer 320 can be made of silicon dioxide. In some embodiments, the anneal process is a rapid thermal annealing (RTA) process, laser spike annealing (LSA) process, or another suitable annealing process. In some other embodiments, the etch stop layer 320 is made of dielectric materials such as oxide, SiN, SiOCN, and is formed by a deposition and then etching back process.

A second dummy gate layer 330 is formed on the etch stop layer 320 and covers the semiconductor strip 210. In some embodiments, the second dummy gate layer 330 includes polycrystalline silicon (polysilicon). In some embodiments, the second dummy gate layer 330 is formed by various process operations, such as deposition, planarization, as well as other suitable processing operations. The deposition processes includes CVD (including both low-pressure CVD and plasma-enhanced CVD), PVD, ALD, thermal oxidation, e-beam evaporation, or another suitable deposition technique, or a combination thereof. A planarization process, such as a CMP process, may then be performed. The CMP process may remove portions of the second dummy gate layer 330 and may planarize the top surface of the structure.

A patterned hard mask 340 is formed over the second dummy gate layer 330. In some embodiments, the patterned hard mask 340 is made of silicon nitride, silicon oxynitride, silicon carbide, silicon carbo-nitride, or the like. The patterned hard mask 340 covers a portion of the second dummy gate layer 330 while leaves another portion of the second dummy gate layer 330 uncovered.

Afterwards, as shown in FIG. 1D, the first dummy gate layer 310, the etch stop layer 320 and the second dummy gate layer 330 are patterned by using the patterned hard mask 340 as a mask to form at least one dummy gate stack 410 crossing the semiconductor strip 210, in accordance with some embodiments of the disclosure.

The dummy gate stack 410 covers a portion of the semiconductor strip 210 and leaves other portions of the semiconductor strip 210 uncovered. The portion of the semiconductor strip 210 covered by the dummy gate stack 410 can be referred to as a channel region of the semiconductor strip 210, and the portions of the semiconductor strip 210 uncovered by the dummy gate stack 410 can be referred to as source/drain regions of the semiconductor strip 210. In some embodiments, the length L of the dummy gate stack 410 is in a range of about 5 nm to about 500 nm.

A number of gate spacers 420 are respectively formed on sidewalls of the dummy gate stack 410. The gate spacers 420 may include a seal spacer and a main spacer (not shown). The gate spacers 420 include one or more dielectric materials, such as silicon oxide, silicon nitride, silicon oxynitride, SiCN, SiCxOyNz, or a combination thereof. The gate spacers 420 can be formed by using a deposition method, such as plasma enhanced chemical vapor deposition (PECVD), low-pressure chemical vapor deposition (LPCVD), subatmospheric chemical vapor deposition (SACVD), or the like. The formation of the gate spacers 420 may include blanket forming spacer layers, and then performing etching operations to remove the horizontal portions of the spacer layers. The remaining vertical portions of the gate spacer layers form the gate spacers 420.

Figure 1E:
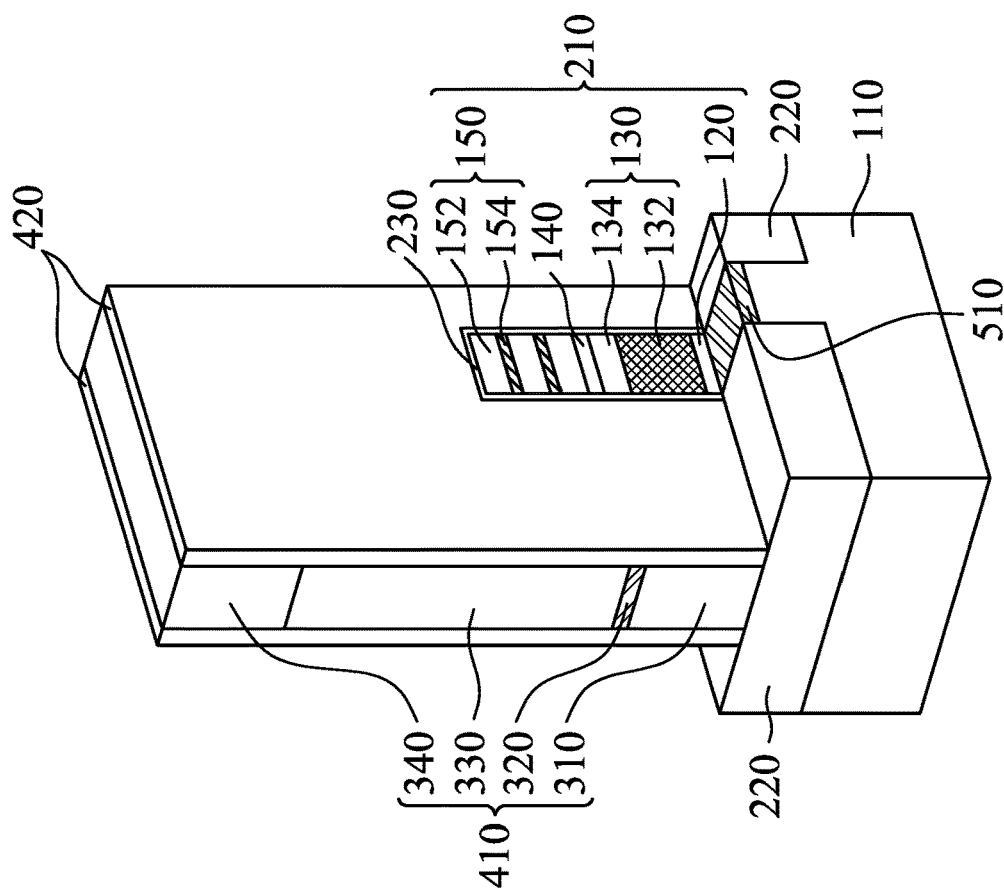

Afterwards, as shown in FIG. 1E, a portion of the semiconductor strip 210 and the dummy dielectric layer 230 uncovered by the dummy gate stack 410 and the gate spacers 420 are removed, in accordance with some embodiments of the disclosure. As such, the channel portion of the semiconductor strip 210 and the top surface of the substrate 110 are exposed. In some embodiments, the semiconductor strip 210 and the dummy dielectric layer 230 are etched by using the dummy gate stack 410 and the gate spacers 420 as an etching mask. The etching process includes a dry etching process, a wet etching process, or a combination thereof.

An insulation layer 510 is formed on the top surface of the substrate 110. In some embodiments, the insulating layer 510 is made of silicon dioxide, dielectric materials, or other applicable materials. In some embodiments, oxygen ions are implanted into portions of the substrate 110 beneath the top surface of the substrate 110, and a thermal operation (such as a thermal operation) is performed to anneal the substrate 110. Therefore, a reaction occurs between the implanted oxygen and the surrounding substrate 110 to provide the insulation layer 510 on the substrate 110. That is, the insulating layer 510 can be made of silicon dioxide. In some embodiments, the anneal process includes a rapid thermal annealing (RTA) process, laser spike annealing (LSA) process, or another suitable annealing process. In some other embodiments, the insulating layer 510 is made of dielectric materials, and formed by a deposition and then etching back process. In some embodiments, the thickness of the insulating layer 510 is in a range of about 20 nm to about 100 nm.

Afterwards, as shown in FIG. 1F, the first sacrificial layer 120 and the second sacrificial layer 140 are removed, in accordance with some embodiments of the disclosure. As a result, an opening 122 is formed between the first semiconductor stack 130 and the substrate 110, and an opening 142 is formed between the second semiconductor stack 150 and the first semiconductor stack 130.

In some embodiments, the first sacrificial layer 120 and the second sacrificial layer 140 are removed by performing an etching process. In some embodiments, the etching process can be a wet etch process which has high etching selectivity between germanium and silicon. Since the materials of the first sacrificial layer 120 and the second sacrificial layer 140 are different from the first semiconductor stack 130 and the second semiconductor stack 150, etching rates thereof are different, and the first semiconductor stack 130 and the second semiconductor stack 150 remain in place while the first sacrificial layer 120 and the second sacrificial layer 140 are removed.

A first inner gate spacer 610 is formed in the opening 122 and between the first semiconductor stack 130 and the substrate 110, and a second inner gate spacer 620 is formed in the opening 142 and between the second semiconductor stack 150 and the first semiconductor stack 130. In some other embodiments, the second inner gate spacer 620 is not formed but the first inner gate spacer 610 is formed. In some embodiments, the top surface of the first inner gate spacer 610 is higher than the top surface of the isolation structure 220. In some embodiments, the top surface of the first inner gate spacer 610 is higher than the top surface of the insulating layer 510.

The first inner gate spacer 610 and the second inner gate spacer 620 may be made of silicon nitride, oxide, metal oxide, or other dielectric such as SiCxOyNz. In some embodiments, the first inner gate spacer 610 and the second inner gate spacer 620 are formed by performing an ALD process or another suitable process. In some embodiments, a trimming process is performed after the first inner gate spacer 610 and the second inner gate spacer 620 are deposited to remove portions of the first inner gate spacer 610 and the second inner gate spacer 620 outside the openings 122 and 142.

Figures 1, 1G, 2:
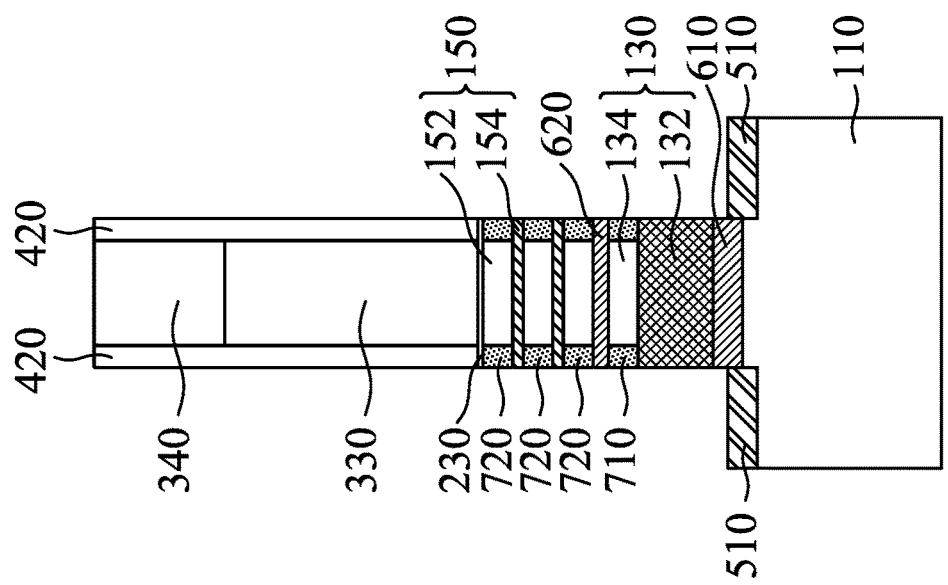
Figures 1, 1G:
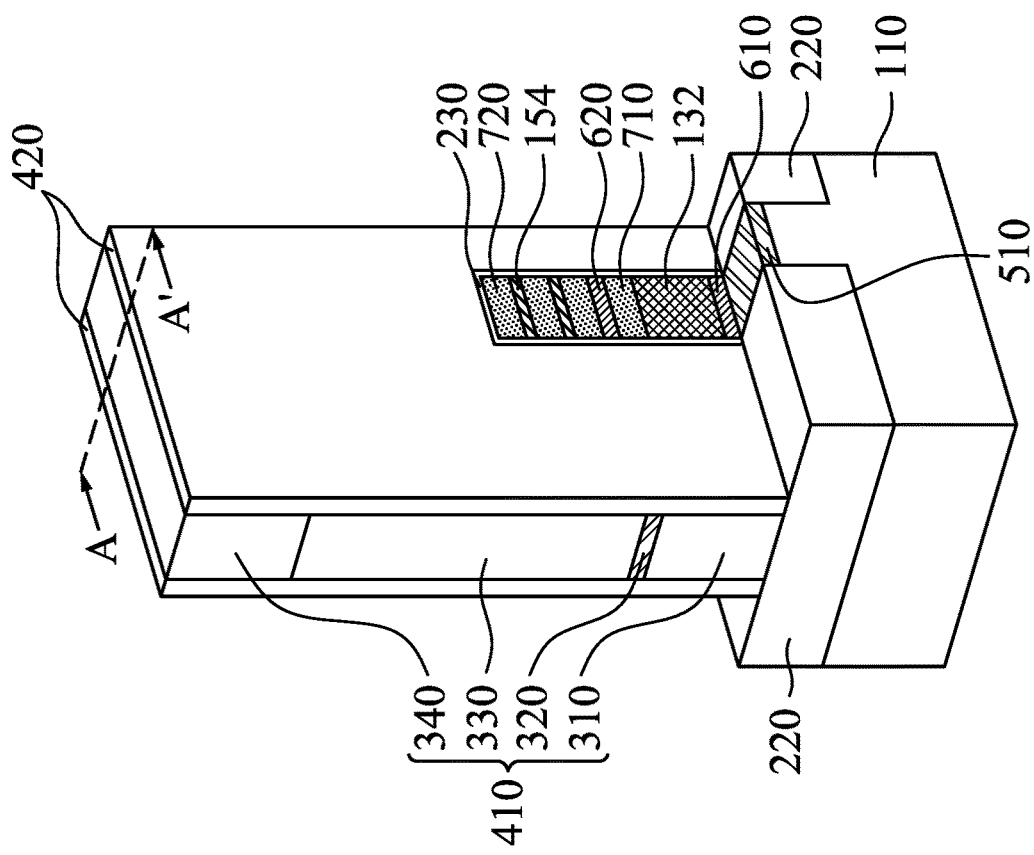

Afterwards, as shown in FIGS. 1G-1 and 1G-2, the semiconductor layer 134 and the semiconductor layers 152 are trimmed to form a number of first sidewall spacers 710 on opposite sides of the semiconductor layer 134, and a number of second sidewall spacers 720 on opposite sides of the semiconductor layers 152, in accordance with some embodiments of the disclosure. FIG. 1G-2 shows a cross-sectional view taking along line A-A' of FIG. 1G-1.

In some embodiments, the semiconductor layer 134 and the semiconductor layers 152 are removed by performing an etching process. In some embodiments, the etching process is a wet etch process which has high etching selectivity between germanium and silicon. Since the materials of the semiconductor layer 134 and semiconductor layers 152 are different from the first fin structure 132 and the semiconductor layers 154, etching rates thereof are different, and the first fin structure 132 and the semiconductor layers 154 remain in place while portions of the semiconductor layer 134 and the semiconductor layers 152 are trimmed.

In some embodiments, the first sidewall spacers 710 and the second sidewall spacers 720 are respectively made of silicon nitride, oxide, metal oxide, or other dielectric such as SiCxOyNz. In some embodiments, the first sidewall spacers 710 and the second sidewall spacers 720 are formed by an ALD process or another applicable process. In some embodiments, a trimming process is performed after the first sidewall spacers 710 and the second sidewall spacers 720 are deposited in order to remove portions of the first sidewall spacers 710 and the second sidewall spacers 720 external to the gate spacers 420.

Figures 1, 1H, 2:
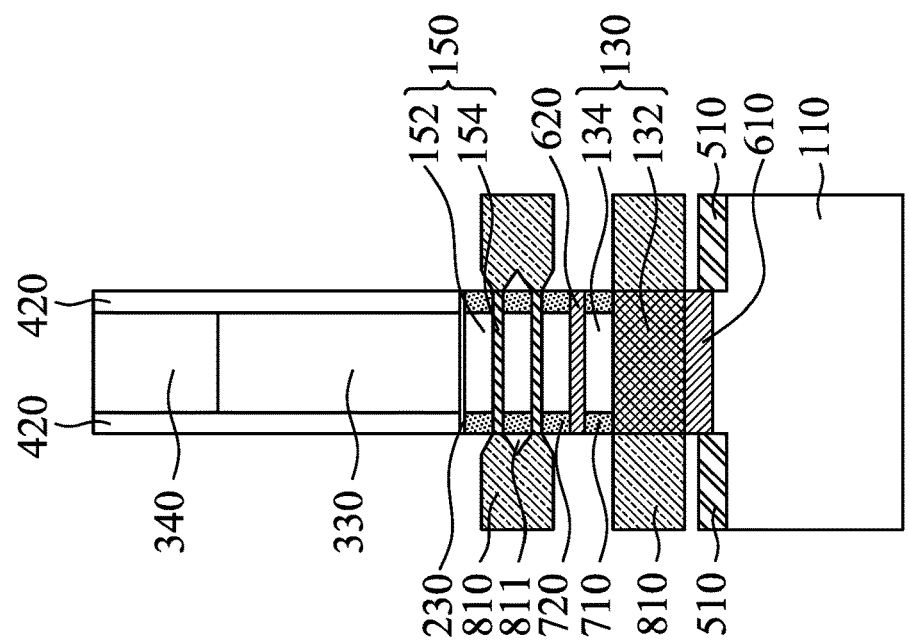
Figures 1, 1H:
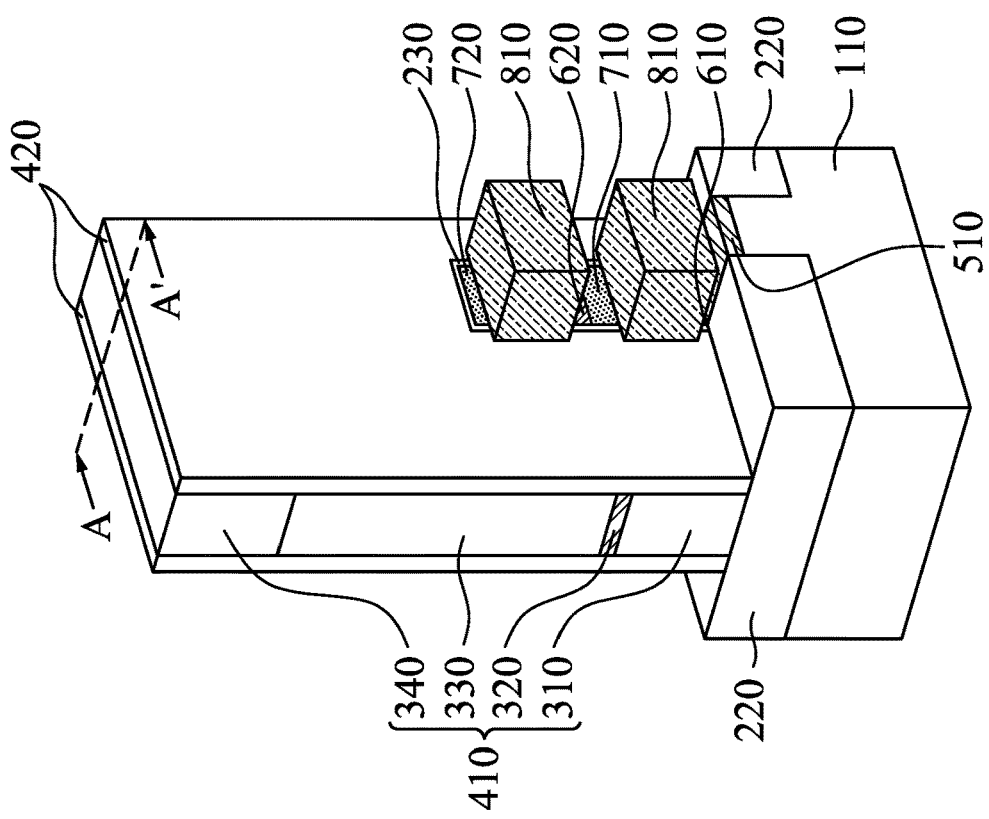

Afterwards, as shown in FIGS. 1H-1 and 1H-2, a number of first epitaxy structures 810 are formed on opposite sidewalls of the first fin structure 132 and the semiconductor layers 154, in accordance with some embodiments of the disclosure. FIG. 1H-2 shows a cross-sectional view taking along line A-A' of FIG. 1H-1. In addition, the second sidewall spacers 720 are between two adjacent semiconductor layers 154.

It should be noted that since the first epitaxy structures 810 are not in direct contact with the outer sidewall of the second sidewall spacers 720, and therefore there is an air space 811 between the first epitaxy structures 810 and the second sidewall spacers 720. In some embodiments, the first epitaxy structures 810 is in direct contact with the outer sidewall of the first fin structure 132. The interface between the first epitaxy structures 810 and the first fin structure 132 is substantially aligned with the outer sidewall of the first sidewall spacer 710.

In some embodiments, the first epitaxy structures 810 are formed by performing a selectively growing process. Therefore, the first epitaxy structures 810 are in contact with the first fin structure 132. The first epitaxy structures 810 are formed by epitaxially growing a semiconductor material. The semiconductor material includes single element semiconductor material such as germanium (Ge) or silicon (Si); or compound semiconductor materials, such as gallium arsenide (GaAs), aluminum gallium arsenide (AlGaAs); or semiconductor alloy, such as silicon germanium (SiGe), gallium arsenide phosphide (GaAsP). The first epitaxy structures 810 have suitable crystallographic orientations (e.g., a (100), (110), or (111) crystallographic orientation). In some embodiments, the first epitaxy structures 810 include source/drain epitaxial structures. In some embodiments, where a PFET device is desired, the first epitaxy structures 810 may include an epitaxially growing silicon germanium (SiGe). The epitaxial processes include CVD deposition techniques (e.g., vapor-phase epitaxy (VPE) and/or ultra-high vacuum CVD (UHV-CVD)), molecular beam epitaxy, and/or another suitable process.

In some embodiments, the germanium concentration is tuned if the first epitaxy structures 810 are made of silicon germanium. In some embodiments, the first epitaxy structures 810 is doped, for example, boron-doped, and the dopant concentration can be tuned. The sizes and/or the shapes of the first epitaxy structures 810 can be tuned. In some embodiments, the first epitaxy structures 810 can be cube-shaped as shown in FIG. 1H-1, or be diamond shaped in some other embodiments.

Afterwards, as shown in FIGS. 1I-1 and 1I-2, a bottom interlayer dielectric (ILD) 910 is formed on the isolation structures 220, the insulation layer 510, and at least on opposite sides of the dummy gate stack 410, in accordance with some embodiments of the disclosure. FIG. 1I-2 shows a cross-sectional view taking along line A-A' of FIG. 1I-1. The bottom ILD 910 surrounds the first epitaxy structures 810 in contact with the first fin structure 132 and exposes the first epitaxy structures 810 in contact with the semiconductor layers 154.

In some embodiments, the bottom ILD 910 includes amorphous silicon (a-Si) or amorphous germanium (a-Ge). In some embodiments, the bottom ILD 910 is formed by various process operations, such as deposition, planarization, etching, as well as other suitable processing operations. The deposition processes includes CVD, PVD, ALD, thermal oxidation, e-beam evaporation, another suitable deposition technique, or a combination thereof. A planarization process, such as a CMP process, may then be performed to expose the top surface of the patterned hard mask 340. The CMP process may remove portions of the bottom ILD 910 overlying the patterned hard mask 340 and may planarize the top surface of the structure. Then, an etch back process is performed to reduce the thickness of the bottom ILD 910 until the top surface of the bottom ILD 910 is substantially leveled with the top surface, the bottom surface, or intermediate level of the second inner gate spacer 620. In some embodiments, the etching process includes dry etching (e.g., RIE etching), wet etching, and/or other etching methods.

It should be noted that, during the bottom ILD 910 is etched back, the first epitaxy structures 810 in contact with the semiconductor layers 154 is also be removed. As such, the semiconductor layers 154 and the second sidewall spacers 720 are exposed.

Subsequently, an etch stop layer 920 is formed on the bottom ILD 910. In some embodiments, oxygen ions are implanted into portions of the bottom ILD 910 beneath the top surface of the bottom ILD 910, and a thermal operation (such as a thermal operation) is performed to anneal the bottom ILD 910. Therefore, a reaction occurs between the implanted oxygen and the surrounding the bottom ILD 910 to provide the etch stop layer 920 on the bottom ILD 910. That is, the etch stop layer 920 can be made of silicon dioxide. In some embodiments, the anneal process includes a rapid thermal annealing (RTA) process, laser spike annealing (LSA) process, or another suitable annealing process. In some other embodiments, the etch stop layer 920 is made of dielectric materials such as oxide, SiN, SiOCN, and is formed by a deposition and then etching back process.

A number of second epitaxy structures 930 are formed on opposite sidewalls of the semiconductor layers 154 by performing, for example, a selectively growing process. Therefore, the second epitaxy structures 930 are in direct contact with the semiconductor layers 154 and separated from the first epitaxy structures 810. The second epitaxy structures 930 are formed by epitaxially growing a semiconductor material. The semiconductor material includes single element semiconductor material such as germanium (Ge) or silicon (Si); or compound semiconductor materials, such as gallium arsenide (GaAs), aluminum gallium arsenide (AlGaAs); or semiconductor alloy, such as silicon germanium (SiGe), gallium arsenide phosphide (GaAsP).

The second epitaxy structures 930 have suitable crystallographic orientations (e.g., a (100), (110), or (111) crystallographic orientation). In some embodiments, the second epitaxy structures 930 include source/drain epitaxial structures. In some embodiments, where an NFET device is desired, the second epitaxy structures 930 may include an epitaxially growing silicon phosphorus (SiP) or silicon carbon (SiC). The epitaxial processes include CVD deposition techniques (e.g., vapor-phase epitaxy (VPE) and/or ultra-high vacuum CVD (UHV-CVD)), molecular beam epitaxy, and/or another suitable process.

In some embodiments, the second epitaxy structures 930 is doped, for example, P-doped or As-doped, and the dopant concentration can be tuned. The sizes and/or the shapes of the second epitaxy structures 930 can be tuned. For example, the second epitaxy structures 930 can be cube-shaped as shown in FIG. 1I-1, or be diamond shaped in some other embodiments.

In some embodiments, the first epitaxy structures 810 are p-type epitaxy structures, and the second epitaxy structures 930 are n-type epitaxy structures. In some other embodiments, the first epitaxy structures 810 can be n-type epitaxy structures, and the second epitaxy structures 930 can be p-type epitaxy structures. Embodiments fall within the present disclosure if the first epitaxy structures 810 and the second epitaxy structures 930 are different types or the same type of epitaxy structures. The first epitaxy structures 810 and the second epitaxy structures 930 are formed by different steps, and therefore the first epitaxy structures 810 and the second epitaxy structures 930 can have different types.

Figure 1J:
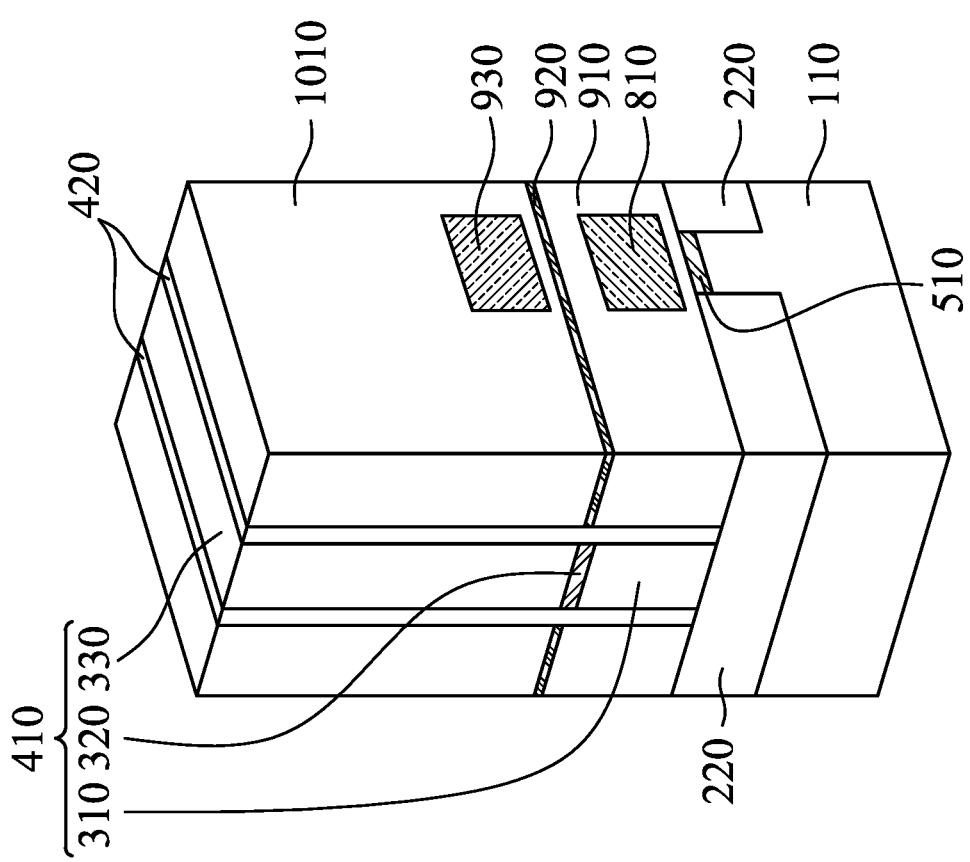

Afterwards, as shown in FIG. 1J, a top ILD 1010 is formed on the etch stop layer 920 and at least on opposite sides of the dummy gate stack 410, in accordance with some embodiments of the disclosure.

In some embodiments, the top ILD 1010 includes materials different from the bottom ILD 910. In some embodiments, the top ILD 1010 is made of dielectric materials, such as an oxide layer. In some embodiments, the top ILD 1010 is formed by various process operations such as deposition, planarization, as well as other suitable processing operations. The deposition processes includes Flowable Chemical Vapor Deposition (FCVD), low-pressure CVD, plasma-enhanced CVD, PVD, ALD, thermal oxidation, e-beam evaporation, another suitable deposition technique, or a combination thereof. A planarization process, such as a CMP process, may then be performed to expose the top surface of the second dummy gate layer 330. The CMP process may remove portions of the top ILD 1010 and the patterned hard mask 340 overlying the second dummy gate layer 330 and may planarize the top surface of the structure.

Figures 1, 1K, 2:
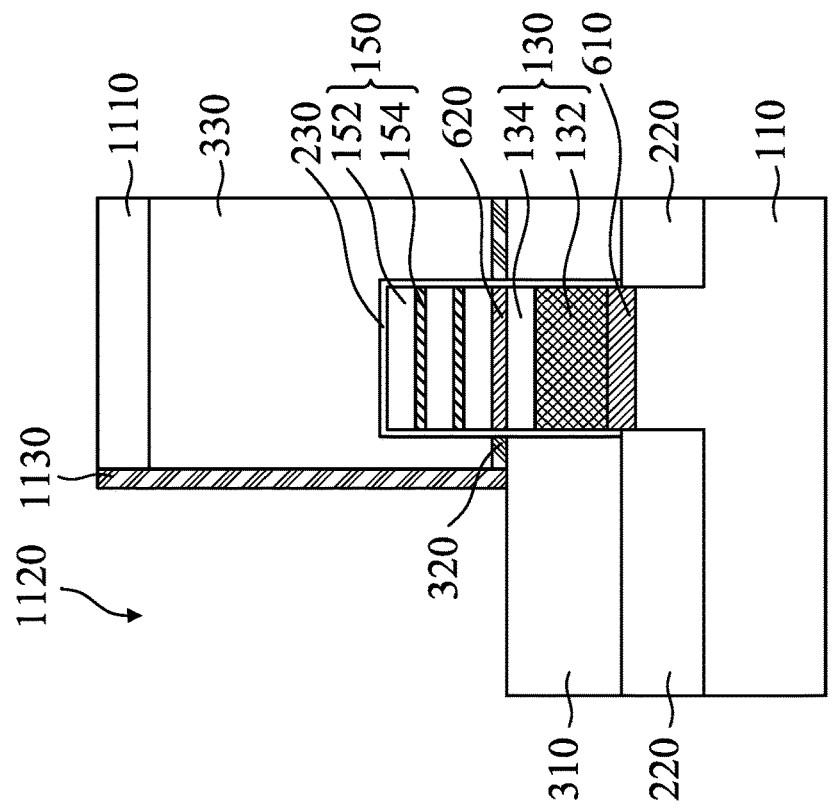
Figures 1, 1K:
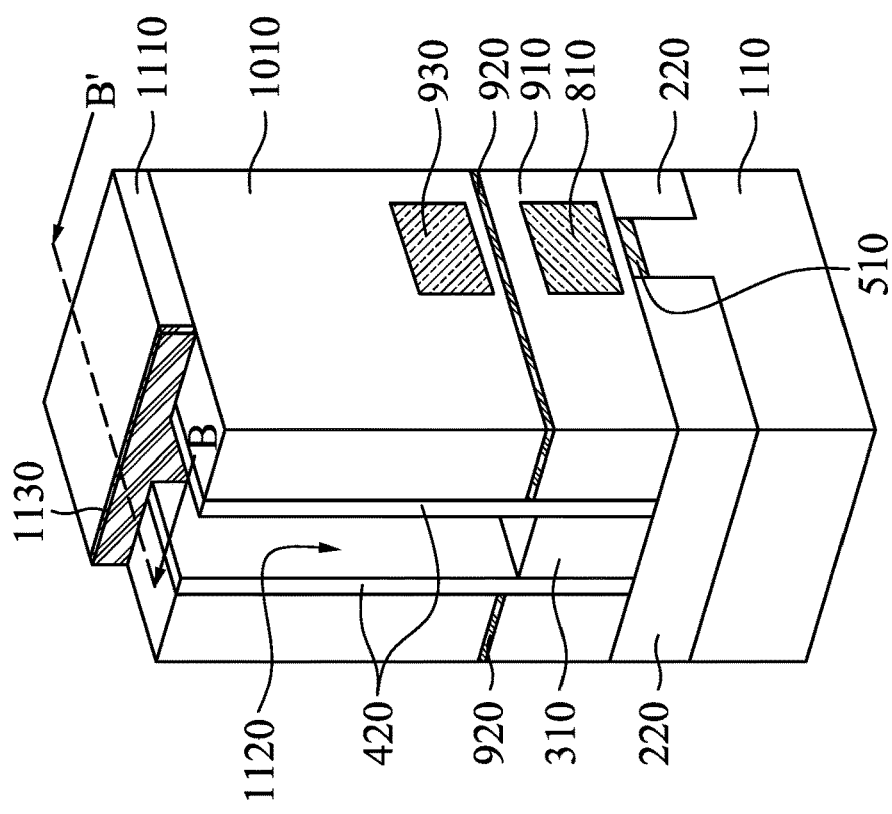

Afterwards, as shown in FIGS. 1K-1 and 1K-2, a patterned hard mask 1110 is formed over the second dummy gate layer 330, the gate spacers 420, and the top ILD 1010, in accordance with some embodiments of the disclosure. FIG. 1K-2 is a cross-sectional view taking along line B-B' of FIG. 1K-1.

In some embodiments, the patterned hard mask 1110 is made of silicon nitride, silicon oxynitride, silicon carbide, silicon carbo-nitride, or the like. The patterned hard mask 1110 covers portions of the second dummy gate layer 330, the gate spacers 420, and the top ILD 1010 while leaves other portions of the second dummy gate layer 330, the gate spacers 420, and the top ILD 1010 uncovered. Specifically, the patterned hard mask 1110 covers the first epitaxy structures 810, the second epitaxy structures 930, and the semiconductor stacks 130 and 150.

The second dummy gate layer 330 and the etch stop layer 320 are patterned by using the patterned hard mask 1110 as a mask to form at least one trench 1120 between the gate spacers 420. Therefore, the trench 1120 exposes the first dummy gate layer 310. However, the trench 1120 does not expose the dummy dielectric layer 230. It should be noted that the size of the trench 1120 is controlled by control the size of the patterned hard mask 1110.

A third inner gate spacer 1130 is formed at least on sidewalls of the second dummy gate layer 330 and the etch stop layer 320 exposed by the trench 1120. In some embodiments, the third inner gate spacers 1130 are formed by the following steps. A dielectric layer is firstly conformally formed on the exposed surfaces of the trench 1120, and then an etching process, such as a dry etching process, is performed to remove portions of the dielectric layer to form the third inner gate spacer 1130 on the sidewalls of the second dummy gate layer 330 and the etch stop layer 320. Furthermore, the third inner gate spacer 1130 may be formed on the sidewall of the patterned hard mask layer 1110. In some embodiments, the third inner gate spacer 1130 is made of SiN, oxide, metal oxide, or other dielectric such as SiCxOyNz. In some embodiments, the third inner gate spacer 1130 is formed by performing an ALD process or another suitable process.

Afterwards, as shown in FIGS. 1L-1 and 1L-2, the remaining first dummy gate layer 310, a portion of the dummy dielectric layer 230, and the semiconductor layer 134 are removed to form a recess 1210, in accordance with some embodiments of the disclosure. FIG. 1L-2 is a cross-sectional view taking along line B-B' of FIG. 1L-1. A first gate stack 1220 is formed and/or filled in the recess 1210. Therefore, the first gate stack 1220 encircles (wraps) the first fin structure 132.

It should be noted that the first gate stack 1220 includes a first portion and a second portion. The first portion is next to sidewall of the second gate stack 1320 (FIG. 1M-2), and the second portion is directly below the second gate stack 1320. In some embodiments, the first gate stack 1220 has a L-shaped structure.

In some embodiments, a first etching process is performed to remove the remaining first dummy gate layer 310, and the portion of the dummy dielectric layer 230 is exposed. A second etching process is then performed to remove the exposed dummy dielectric layer 230, and the first fin structure 132 and the semiconductor layer 134 are exposed. A third etching process is performed to selectively remove the semiconductor layer 134 but not the first fin structure 132. Therefore, the first fin structure 132 is formed on the first inner gate spacer 610.

After the removal of the semiconductor layer 134, the recess 1210 is defined by the isolation structures 220, the first inner gate spacer 610, the etch stop layer 320, the second inner gate spacer 620, the third inner gate spacer 1130, and the gate spacers 420.

The gate spacers 420 are disposed on opposite sides of the first gate stack 1220. The first gate stack 1220 includes a high-k gate dielectric layer 1220a, a work function metal layer 1220b, and a gate electrode 1220c. The high-k gate dielectric layer 1220a is conformally formed in the recess 1210. Therefore, the high-k gate dielectric layer 1220a is in contact with the isolation structures 220, the first inner gate spacer 610, the etch stop layer 320, the second inner gate spacer 620, the third inner gate spacer 1130, the gate spacers 420, and the semiconductor layer 134.

Furthermore, the high-k gate dielectric layer 1220a surrounds the first fin structure 132. In some embodiments, the high-k gate dielectric layer 1220a includes a material such as hafnium oxide ($HfO_2$), zirconium oxide ($ZrO_2$) or lanthanum oxide ($La_2O_3$). In some embodiments, the high-k gate dielectric layer 1220a may be formed by performing an ALD process or another suitable process.

The work function metal layer 1220b is conformally formed on the high-k gate dielectric layer, and the work function metal layer 1220b surrounds the semiconductor layer 134 in some embodiments. The work function metal layer 1220b may include materials such as TiN, TaN, TiAlSi, TiSiN, TiAl, TaAl, or another suitable material. In some embodiments, the work function metal layer 1220b may be formed by performing an ALD process or another suitable process.

The gate electrode 1220c fills the remaining space in the recess 1210. Therefore, the work function metal layer 1220b is in contact with and between the high-k gate dielectric layer 1220a and the gate electrode 1220c. The gate electrode 1220c may include material such as tungsten or aluminum. After the deposition of the high-k gate dielectric layer 1220a, the work function metal layer 1220b, and the gate electrode 1220c, a planarization process, such as a CMP process, may then be performed to remove portions of the high-k gate dielectric layer 1220a, the work function metal layer 1220b, and the gate electrode 1220c outside the recess 1210 to form the first gate stack 1220. In some embodiments, the first gate stack 1220 is a p-type metal gate stack.

Figures 1, 1M, 2:
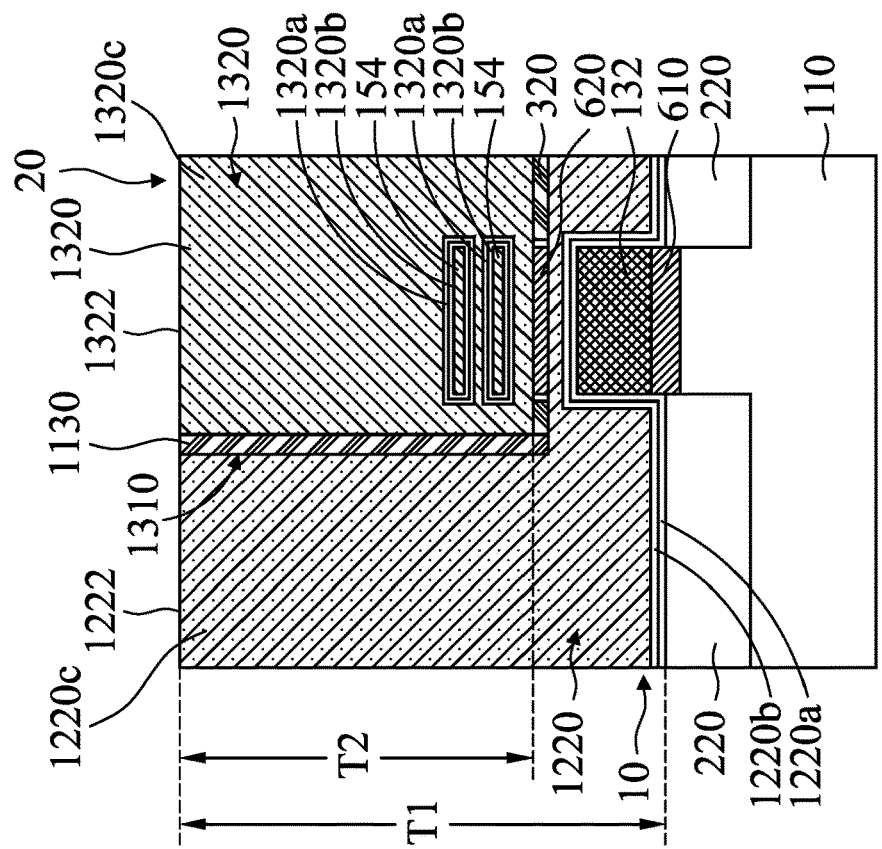
Figures 1, 1M:
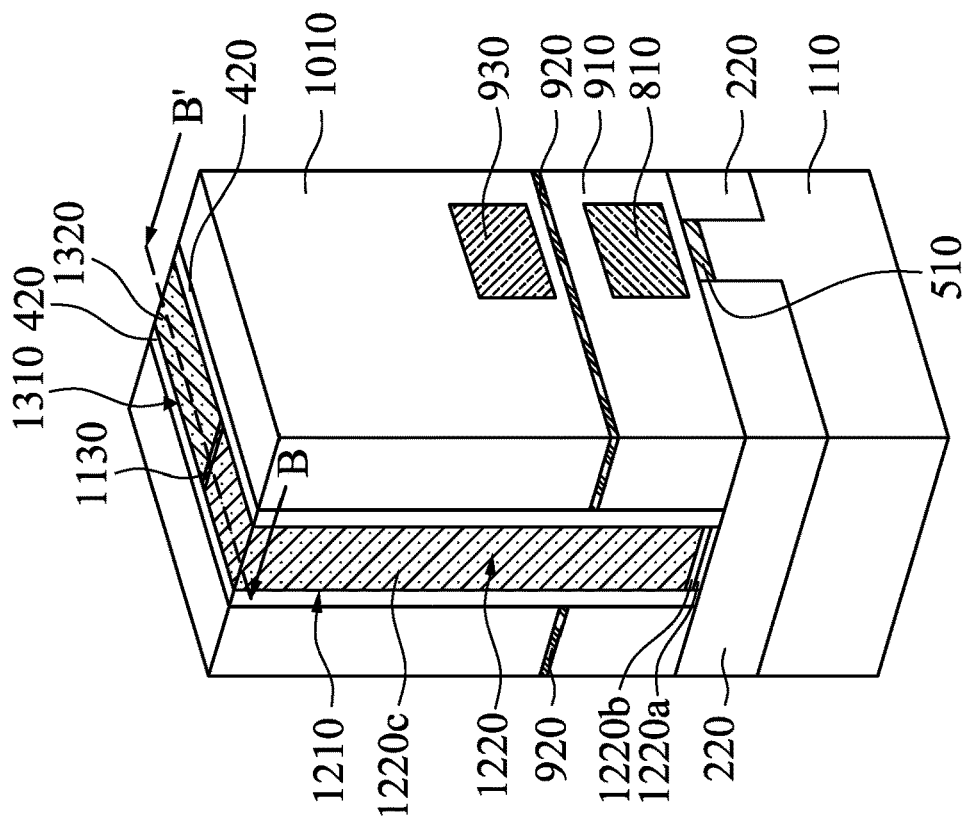
Figure 1O:
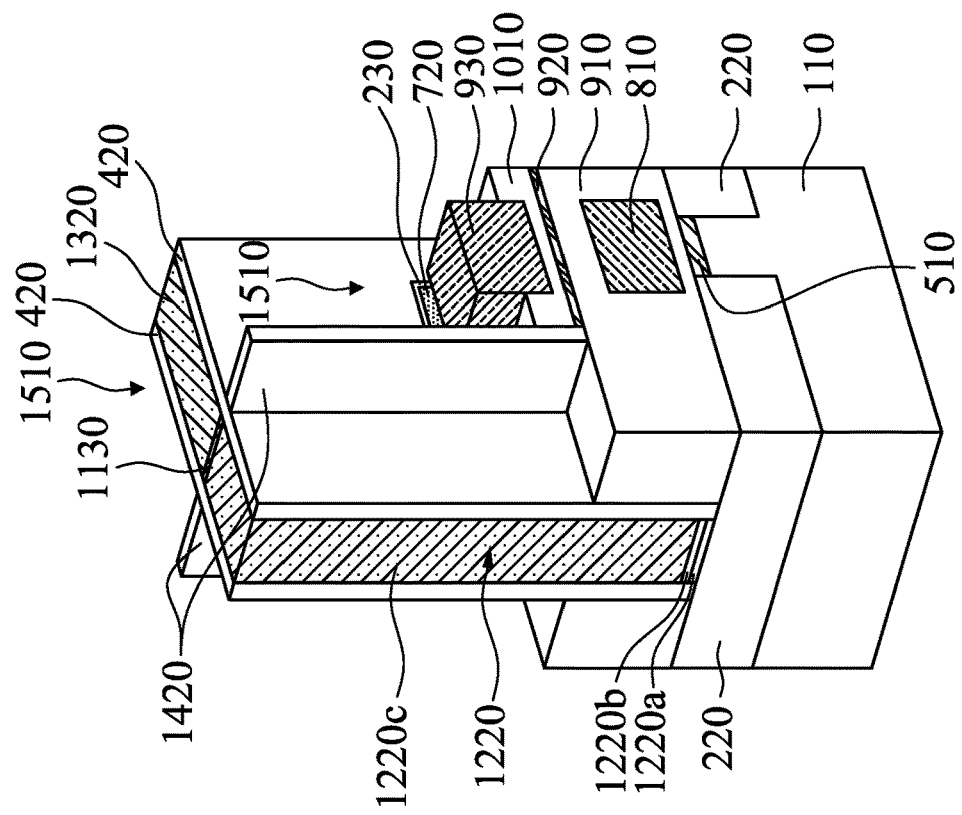

Afterwards, as shown in FIGS. 1M-1 and 1M-2, the remaining second dummy gate layer 330, the remaining dummy dielectric layer 230, and the semiconductor layers 152 are removed to form a recess 1310, in accordance with some embodiments of the disclosure. As a result, the semiconductor layers 154 are exposed. FIG. 1M-2 is a cross-sectional view taking along line B-B' of FIG. 1M-1.

A second gate stack 1320 is formed and/or filled in the recess 1310. Therefore, the second gate stack 1320 encircles (wraps) the semiconductor layers 154 and is formed over the first gate stack 1220. The gate spacers 420 are disposed on opposite sides of the second gate stack 1320.

Furthermore, the second gate stack 1320 wraps the semiconductor layers 154 (or nanostructures 154), the second sidewall spacers 720 are between the second gate stack 1320 and the second epitaxy structures 930 to prevent leakage between second gate stack 1320 and source/drain (S/D) regions.

In some embodiments, the remaining second dummy gate layer 330, the remaining dummy dielectric layer 230, and the semiconductor layers 152 are removed by performing multiple etching processes. In some embodiments, a first etching process is performed to remove the remaining second dummy gate layer 330, and the remaining dummy dielectric layer 230 is exposed. A second etching process is then performed to remove the exposed dummy dielectric layer 230, and the semiconductor layers 152 and 154 are exposed. A third etching process is performed to selectively remove the semiconductor layers 152 but not the semiconductor layers 154. As such, the semiconductor layers 154 remain, are spaced apart from each other, and are suspended over the second inner gate spacer 620.

In some embodiments, the thickness of the etch stop layer 320 can be thick enough to prevent the etch stop layer 320 from removing during the second etching process. After the removal of the semiconductor layers 154, the recess 1310 is defined by the etch stop layer 320, the second inner gate spacer 620, the third inner gate spacer 1130, and the gate spacers 420.

The second gate stack 1320 includes a high-k gate dielectric layer 1320a, a work function metal layer 1320b, and a gate electrode 1320c. The high-k gate dielectric layer 1320a is conformally formed in the recess 1310. In addition, the high-k gate dielectric layer 1320a is in contact with the etch stop layer 320, the second inner gate spacer 620, the third inner gate spacer 1130, the gate spacers 420, and the semiconductor layers 154.

Furthermore, the high-k gate dielectric layer 1320a surrounds the semiconductor layers 154, and spaces between the semiconductor layers 154 are still left after the deposition of the high-k gate dielectric layer 1320a. In some embodiments, the high-k gate dielectric layer 1320a includes a material such as hafnium oxide ($HfO_2$), zirconium oxide ($ZrO_2$) or lanthanum oxide ($La_2O_3$). In some embodiments, the high-k gate dielectric layer 1320a may be formed by performing an ALD process or another suitable process.

The work function metal layer 1320b is conformally formed on the high-k gate dielectric layer, and the work function metal layer 1320b surrounds the semiconductor layers 154 in some embodiments. The work function metal layer 1320b may include materials such as TiN, TaN, TiAlSi, TiSiN, TiAl, TaAl, or another suitable material. In some embodiments, the work function metal layer 1320b may be formed by performing an ALD process or another suitable process.

The gate electrode 1320c fills the remaining space in the recess. Therefore, the work function metal layer 1320b is in contact with and between the high-k gate dielectric layer 1320a and the gate electrode 1320c. The gate electrode 1320c may include material such as tungsten or aluminum. After the deposition of the high-k gate dielectric layer 1320a, the work function metal layer 1320b, and the gate electrode 1320c, a planarization process, such as a chemical mechanical planarization (CMP) process, may then be performed to remove portions of the high-k gate dielectric layer 1320a, the work function metal layer 1320b, and the gate electrode 1320c outside the recess 1310 to form the second gate stack 1320. In FIGS. 1M-1 and 1M-2, the second gate stack 1320 is an n-type metal gate stack.

As shown in FIGS. 1M-1 and 1M-2, the first gate stack 1220 is a p-type metal gate stack, and the second gate stack 1320 is an n-type metal gate stack. In some other embodiments, the first gate stack 1220 is an n-type metal gate stack, and the second gate stack 1320 is a p-type metal gate stack.

As shown in FIGS. 1M-1 and 1M-2, the first fin structure 132, the first epitaxy structures 810, and the first gate stack 1220 form a first device 10, such as a p-type FET (PFET). The semiconductor layers 154, the second epitaxy structures 930, and the second gate stack 1320 form a second device 20, such as an n-type FET (NFET). The first device 10 is a FinFET device, and the second device 20 is horizontal-gate-all-around (HGAA) device. Therefore, the first device 10 and the second device 20 are stacked on the substrate 110, and the first device 10 is disposed between the second device 20 and the substrate 110. The channels of the first device 10 (i.e., the first fin structure 132) is disposed between the substrate 110 and the channels of the second device 20 (i.e., the semiconductor layers 154). In some embodiments, one of the first device 10 and the second device 20 is a logic circuit device, and the other is the static random access memory (SRAM).

The first device 10 is separated from the second device 20 by the etch stop layer 320, the second inner gate spacer 620, and the third inner gate spacer 1130. More specifically, the etch stop layer 320, the second inner gate spacer 620, and the third inner gate spacer 1130 are disposed between and in contact with the first gate stack 1220 and the second gate stack 1320. That is, the first gate stack 1220 is isolated from the second gate stack 1320. Furthermore, the second inner gate spacer 620 is disposed between the first fin structure 132 and the semiconductor layers 154. The second inner gate spacer 620 includes a top surface in direct contact with the second gate stack 1320 and a bottom surface in direct contact with the first gate stack 1220.

The second gate stack 1320 is disposed over the first gate stack 1220. More specifically, the thickness T1 of the first gate stack 1220 is greater than the thickness T2 of the second gate stack 1320. The bottom surface of the first gate stack 1220 is lower than the bottom surface of the second gate stack 1320. The topmost surface of the first gate stack 1220 is higher than the bottom surface of the second gate stack 1320. In some embodiments, the top surface 1222 of the first gate stack 1220 is substantially coplanar with the top surface 1322 of the second gate stack 1320. The isolation structure 220 is disposed between the first gate stack 1220 and the substrate 110, and the second gate stack 1320 is disposed over the isolation structure 220 and is spaced from the isolation structure 220 by the first gate stack 1220.

Figure 1N:
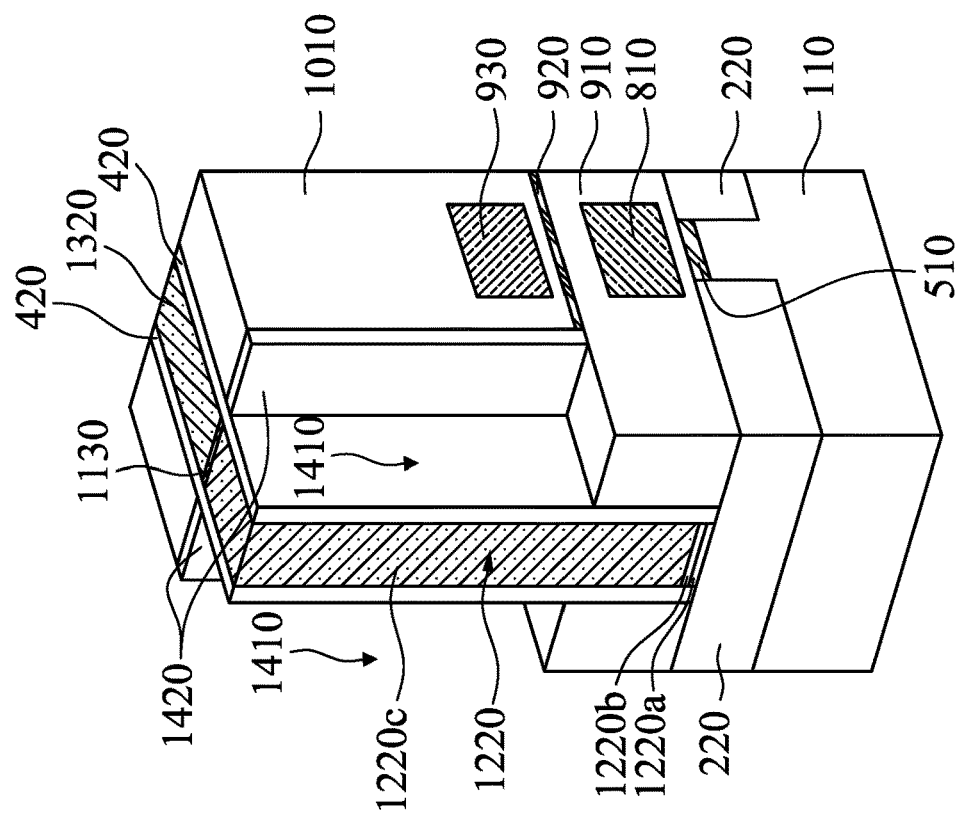
Figure 1Q:
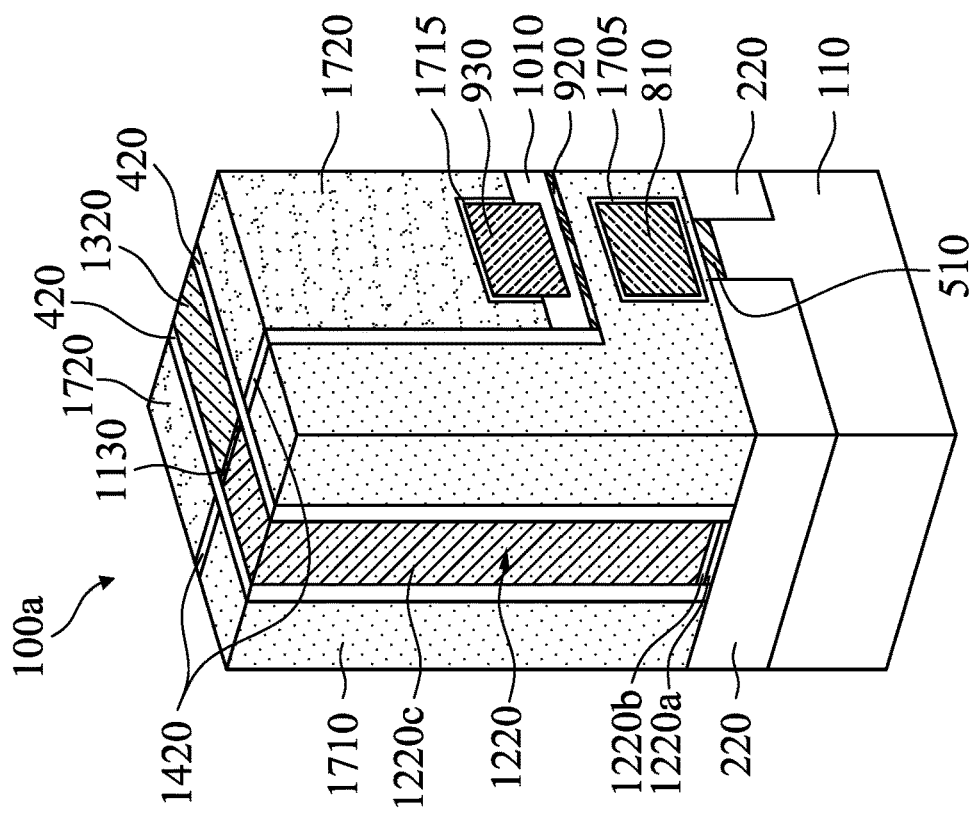

Afterwards, as shown in FIG. 1N, the top ILD 1010 is patterned to form a number of trenches 1410 on opposite sides of the first gate stack 1220, in accordance with some embodiments of the disclosure. A number of contact spacers 1420 are formed at least on sidewalls of the remaining top ILD 1010 and the etch stop layer 920 exposed by the trenches 1410.

In some embodiments, a dielectric layer is conformally formed on the exposed surfaces of the trenches 1410, and then an etching process, such as a dry etching process, is performed to remove portions of the dielectric layer to form the contact spacers 1420 on the sidewalls of the remaining top ILD 1010 and the etch stop layer 920. In some embodiments, the contact spacers 1420 are formed by SiN, oxide, metal oxide, or other dielectric such as SiCxOyNz. In some embodiments, the contact spacers 1420 are formed by performing an ALD process or another suitable process.

Next, as shown in FIG. 1O, the remaining top ILD 1010 is recessed to form a number of trenches 1510 on opposite sides of the second gate stack 1320, in accordance with some embodiments of the disclosure. The trenches 1510 respectively expose at least portions of the second epitaxy structures 930.

In some embodiments, the remaining top ILD 1010 is partially removed, such that a portion of the top ILD 1010 remains on the etch stop layer 920 as shown in FIG. 1O. In some other embodiments, the remaining top ILD 1010 is removed, such that the etch stop layer 920 is exposed by the trenches 1510.

Figure 1P:
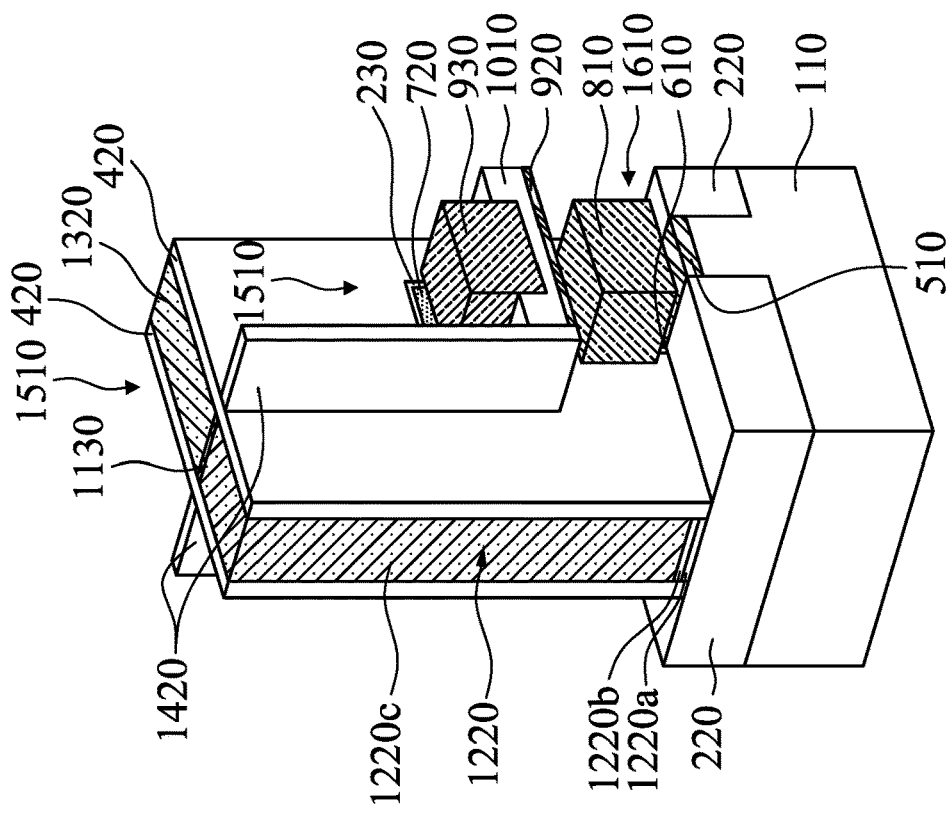

Afterwards, as shown in FIG. 1P, the remaining bottom ILD 910 is removed to form a number of recesses 1610 on opposite sides of the first gate stack 1220, in accordance with some embodiments of the disclosure. As a result, the respective recesses 1610 expose the first epitaxy structures 810, the isolation structures 220, and the insulation layers 510.

Afterwards, as shown in FIG. 1Q, the first epitaxy structures 810 and the second epitaxy structures 930 undergo a silicide process to form a first metal silicide layer 1705 surrounding the first epitaxy structures 810 and a second metal silicide layer 1715 surrounding a portion of the second epitaxy structures 930, in accordance with some embodiments of the disclosure.

In some embodiments, the first metal silicide layer 1705 and the second metal silicide layer 1715 are formed by the following steps. A thin metal layer (not shown) is firstly formed, and the substrate 110 is then heated, which causes silicon and germanium to react with the metal where contacted. In some embodiments, the thin metal layer is made of nickel, platinum, palladium, vanadium, titanium, cobalt, tantalum, ytterbium, zirconium, and combinations thereof. After the reaction, the first metal silicide layer 1705 is formed between the first epitaxy structure 810 and the metal layer, and the second metal silicide layer 1715 is formed between the second epitaxy structures 930 and the metal layer. The un-reacted metal layer is selectively removed through the use of an etchant that attacks metal but does not attack the first metal silicide layer 1705 and the second metal silicide layer 1715.

After the silicide process, a number of first contacts 1710 are respectively formed in the recesses 1610, and a number of second contacts 1720 are respectively formed in the trenches 1510 and over the first contacts 1710. Therefore, the first contacts 1710 are in contact with and wrap the first metal silicide layer 1705 while the second contacts 1720 are in contact with and wrap the second metal silicide layer 1715.

In some embodiments, the first contacts 1710 and the second contacts 1720 are respectively made of metal, such as tungsten (W), cobalt (Co), ruthenium (Ru), aluminum (Al), copper (Cu), or another suitable material. After the deposition of the first contacts 1710 and the second contacts 1720, a planarization process, such as a chemical mechanical planarization (CMP) process, may then be performed. Therefore, the top surface of the first contact 1710 and the top surface of the second contact 1720 are coplanar.

The first contact 1710 is separated from the second contact 1720 by the etch stop layer, the top ILD 1010, and the contact spacer 1420. More specifically, the etch stop layer 920, the top ILD 1010, and the contact spacer 1420 are disposed between and in contact with the first contact 1710 and the second contact 1720. That is, the first contact 1710 is isolated from the second contact 1720. Furthermore, the etch stop layer 920 is disposed between the first epitaxy structure 810 and the second epitaxy structure 930.

In the first embodiment, the first device 10, such as a p-type FET (PFET) is formed over the substrate 110, and the second device 20, such as n-type FET (NFET) is formed over the first device 10. In some embodiments, the first device 10 includes a first fin structure having Si as a channel, and the second device includes a number of nanostructures (nanowires, nanosheets, etc.) having a number of Si channels.

In some embodiments, the semiconductor device structure 100a includes a FinFET device and a nanostructure GAA device stacked together. By applying the second inner gate spacer 620 and third inner gate spacer 1130 between channels of the first device 10 and the second device 20, the channels can be stacked together while isolated from each other. In addition, the second inner gate spacer 620 and third inner gate spacer 1130 further isolates the gate stacks of the first device 10 and the second device 20. Moreover, the first contact 1710 and the second contact 1720 of the first device 10 and the second device 20 are stacked together and isolated from each other. With this configuration, the layout area of the semiconductor device 100a is reduced and the device density thereof is increased.

Figure 2B:
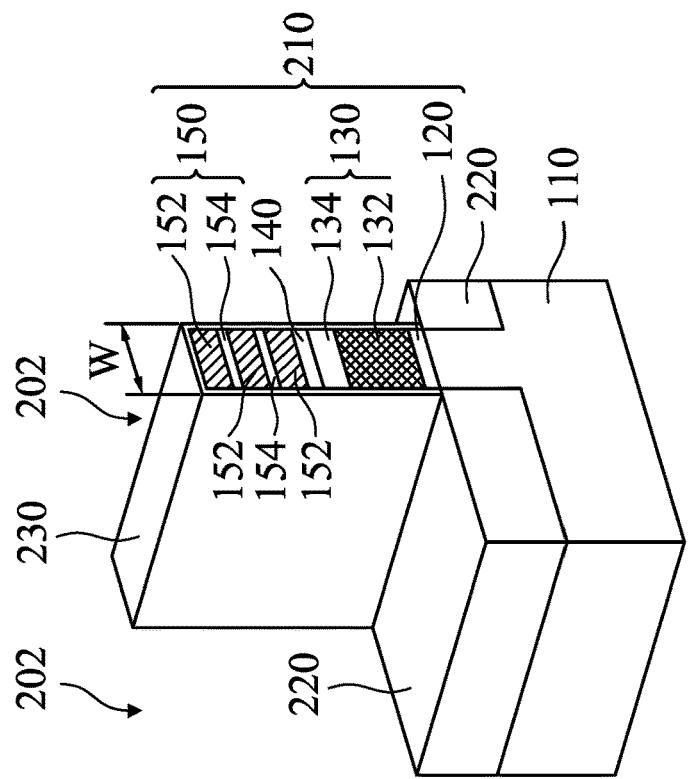
Figure 2A:
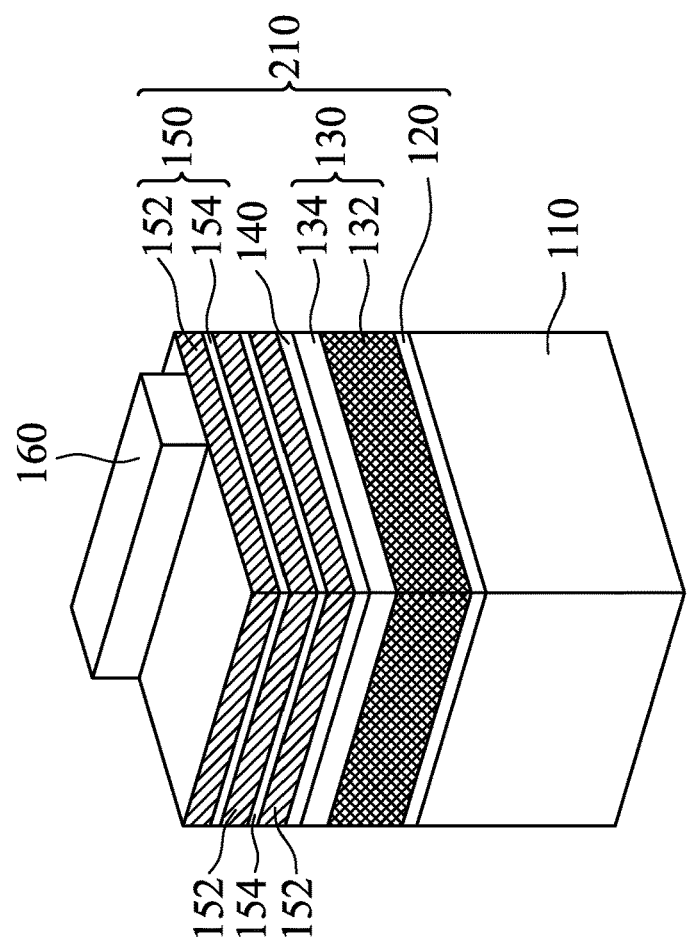
Figure 2F:
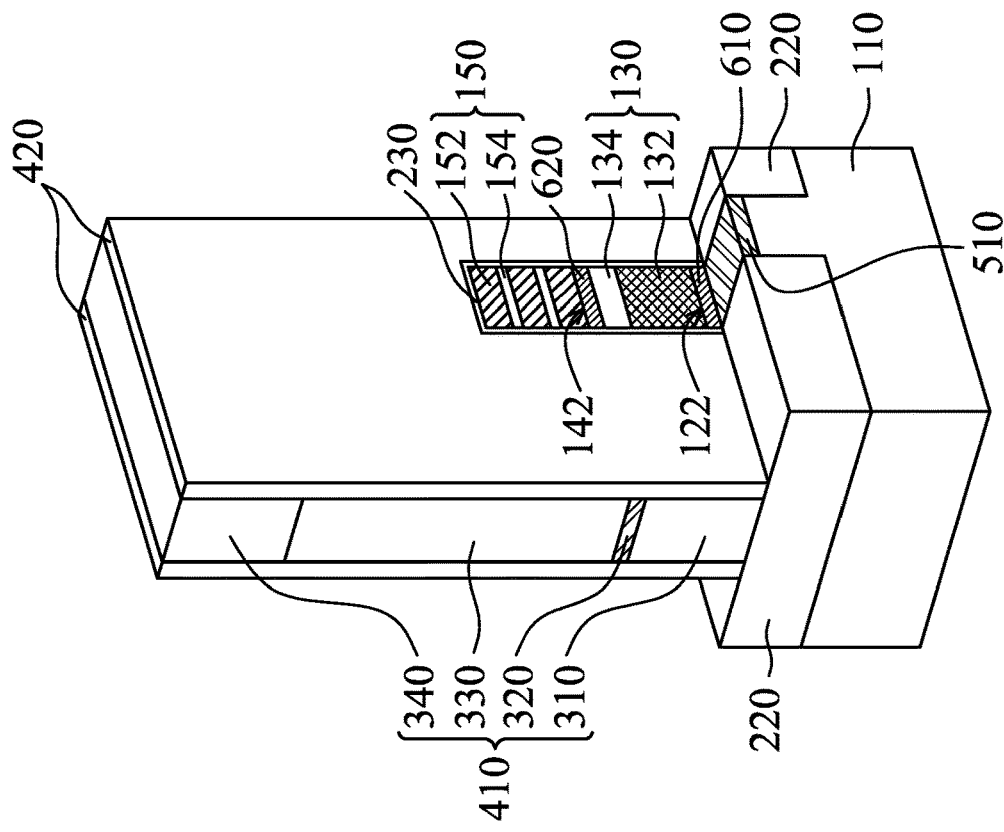
Figure 2E:
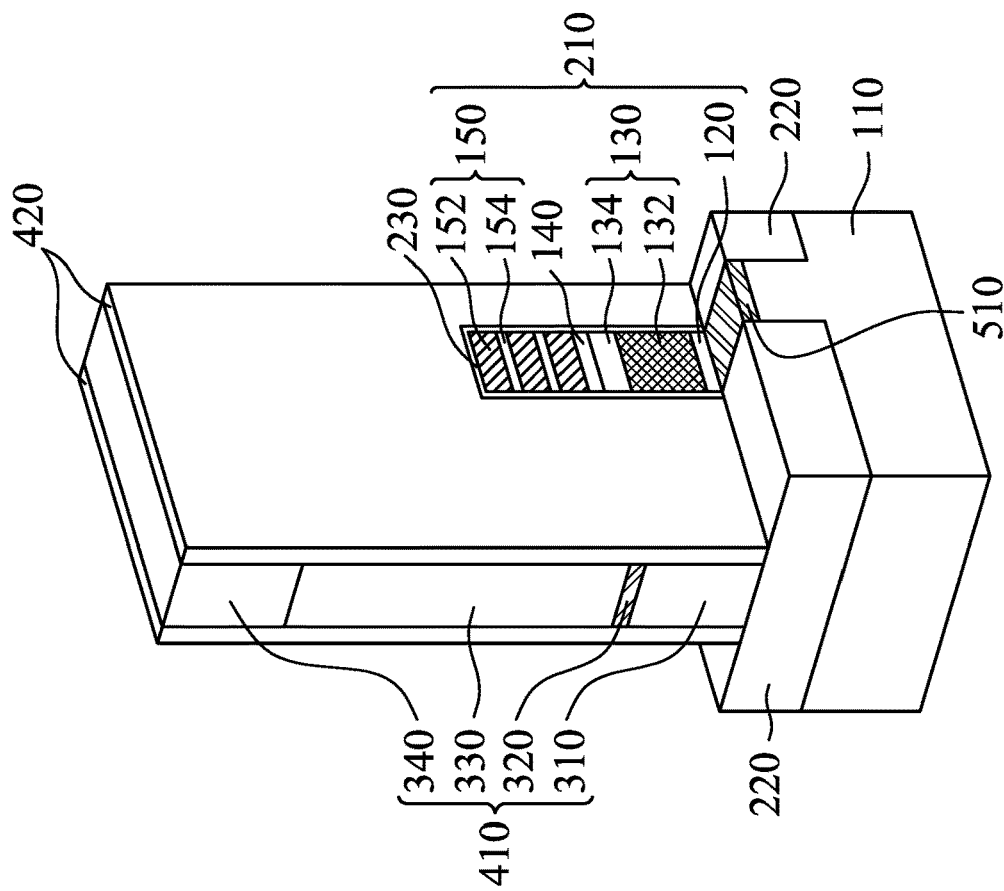
Figures 2, 2H:
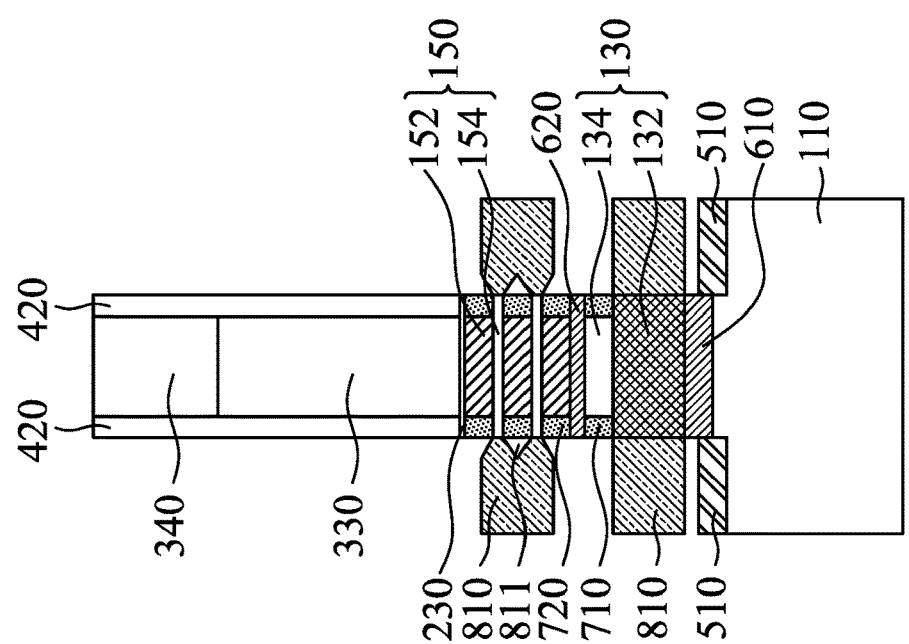
Figures 1, 2H:
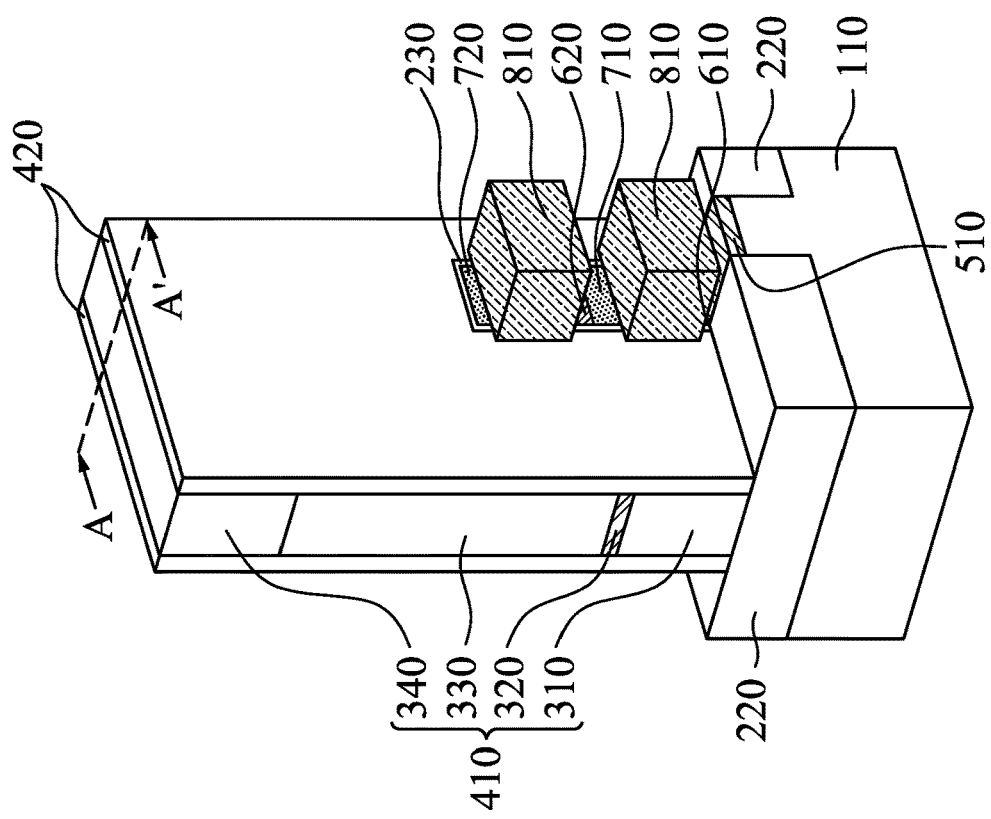
Figure 2J:
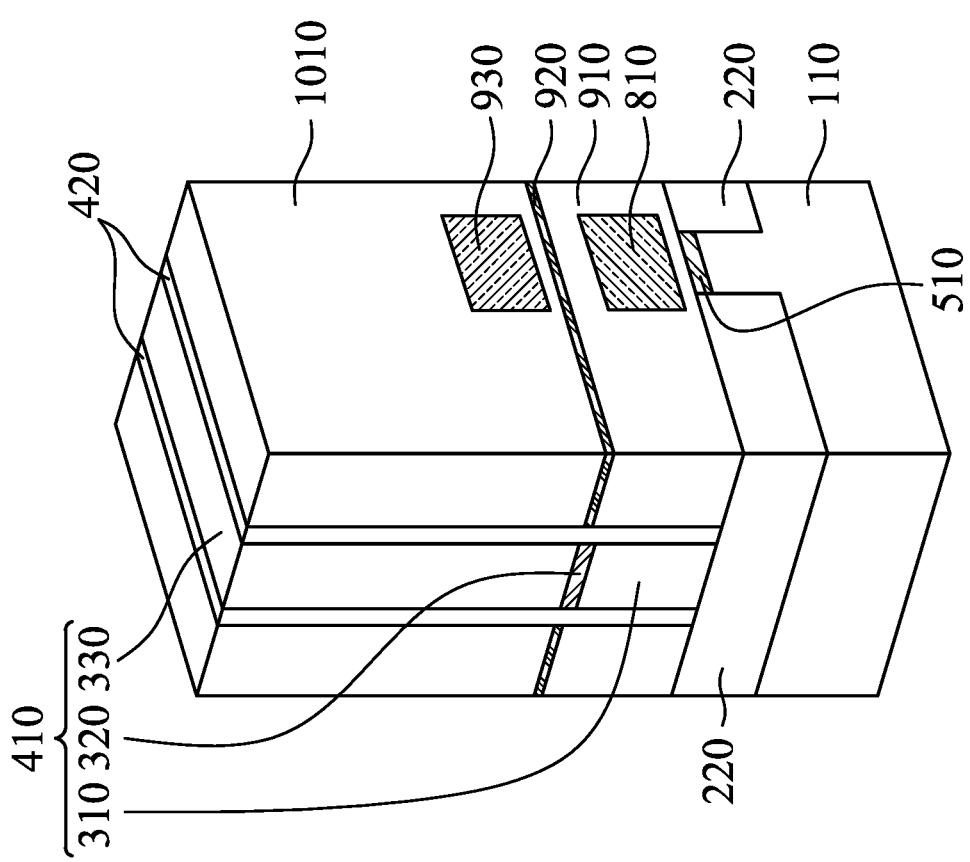
Figures 2, 2K:
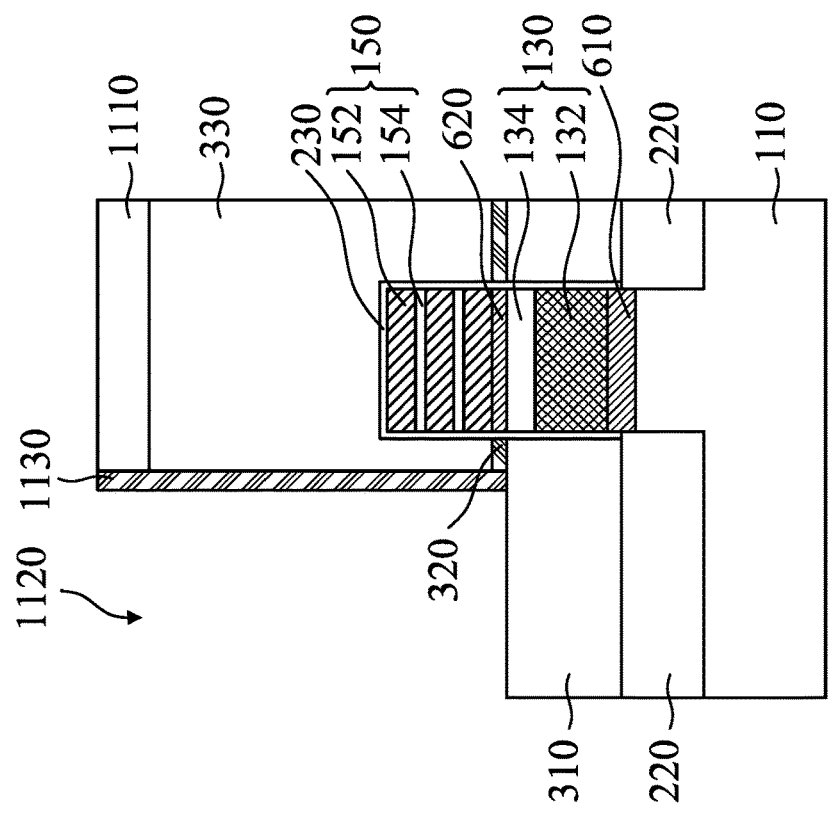
Figures 1, 2K:
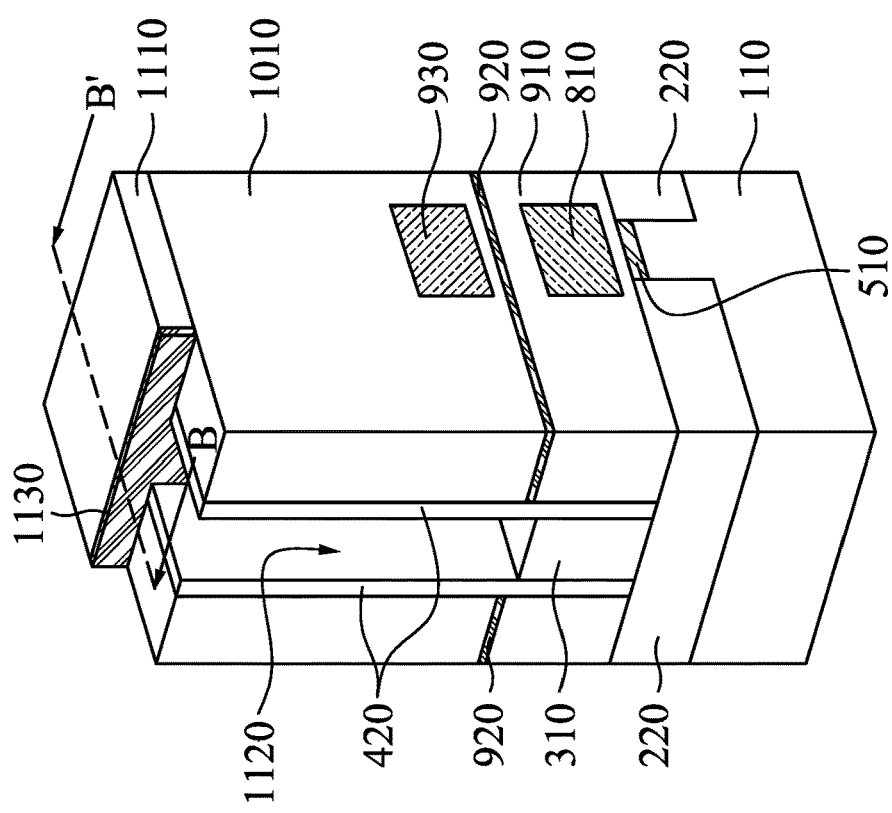
Figures 2, 2L:
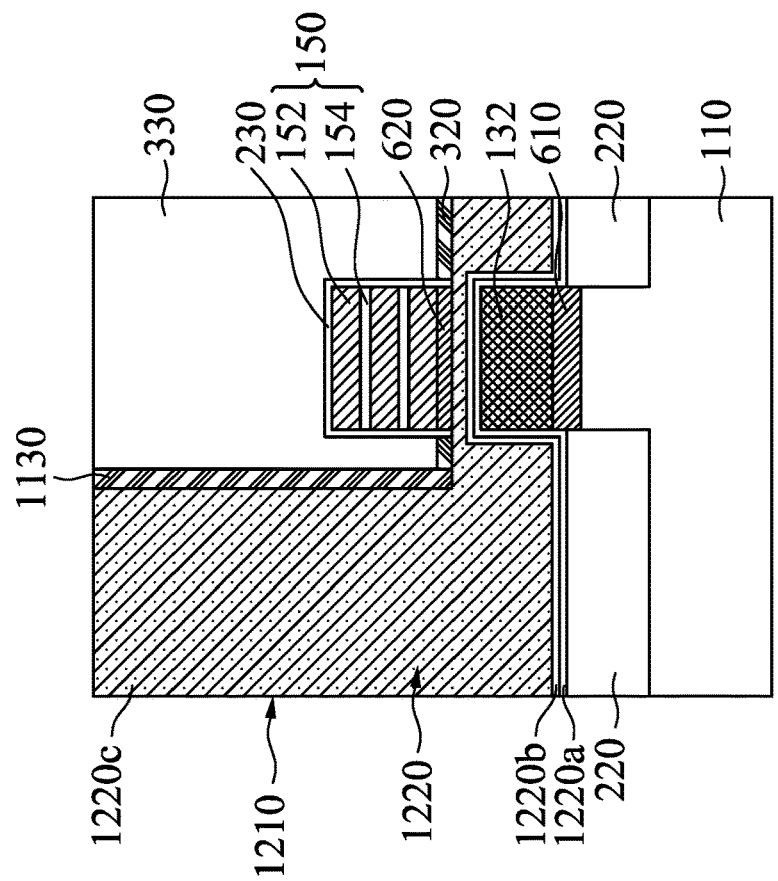
Figures 1, 2L:
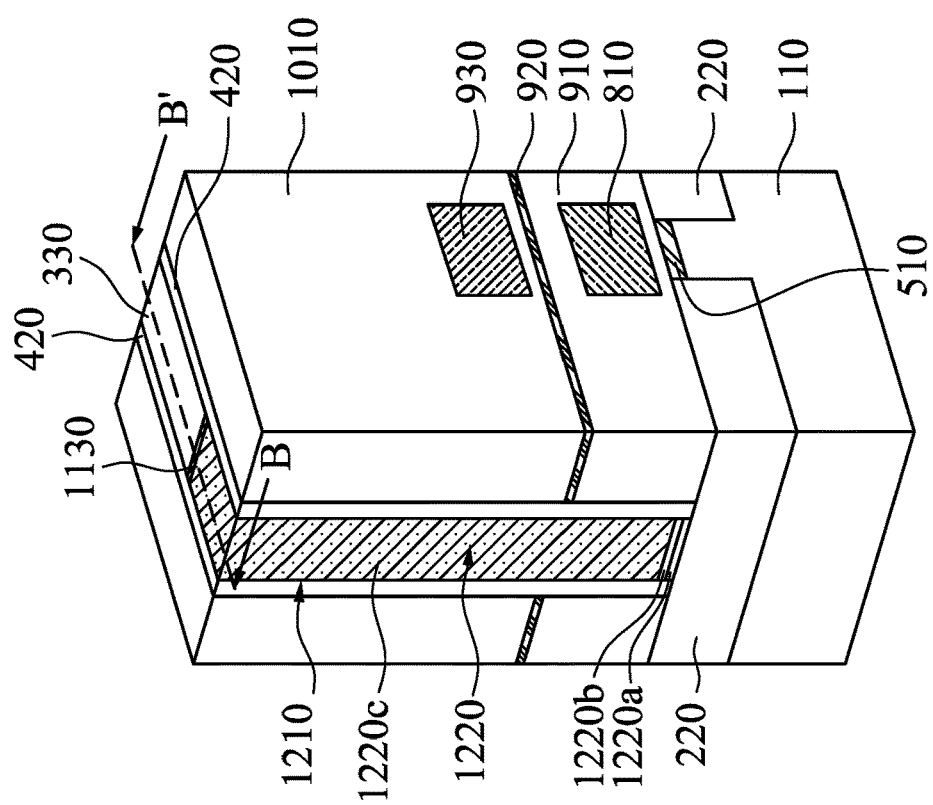
Figures 2, 2M:
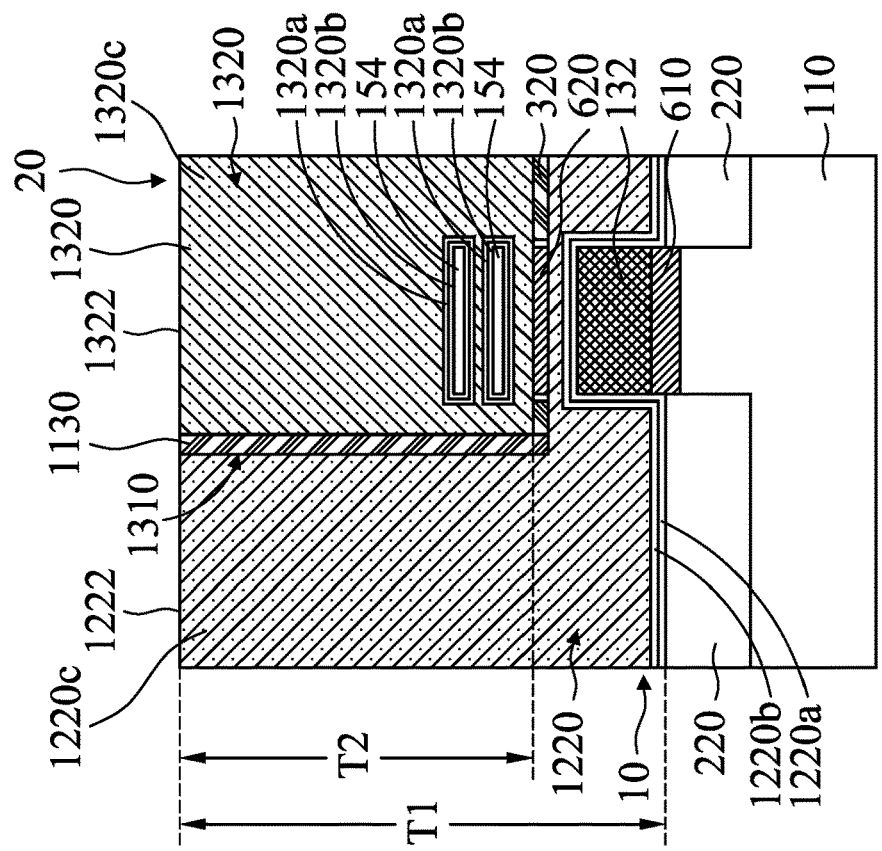
Figures 1, 2M:
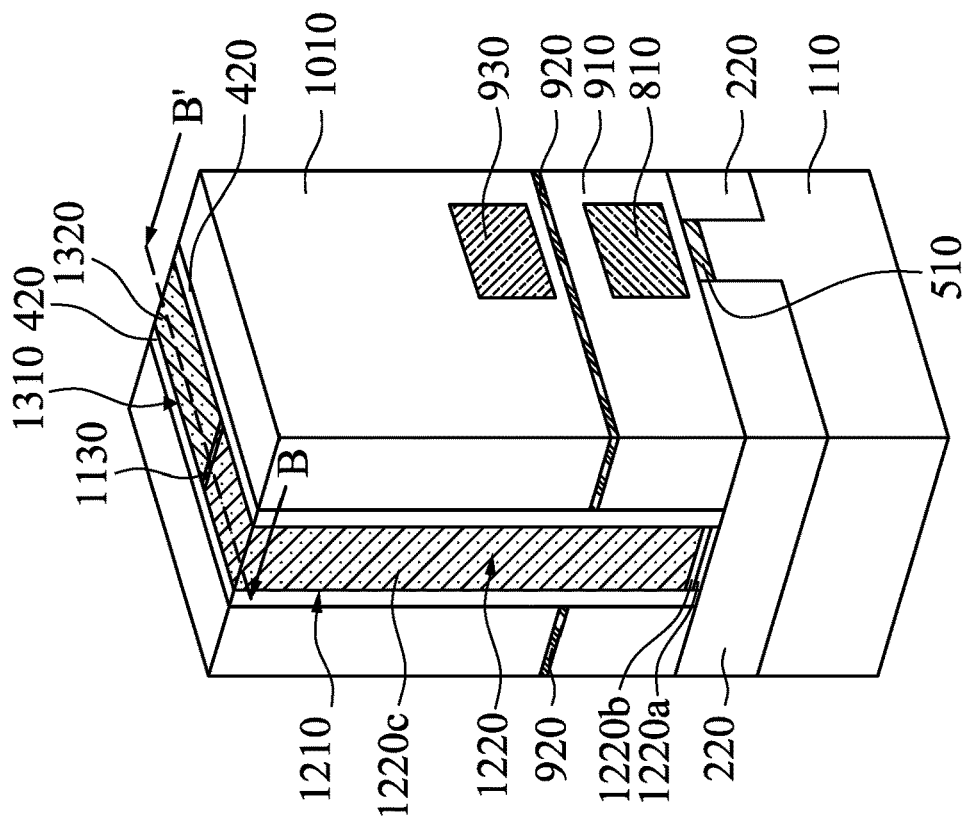
Figure 2N:
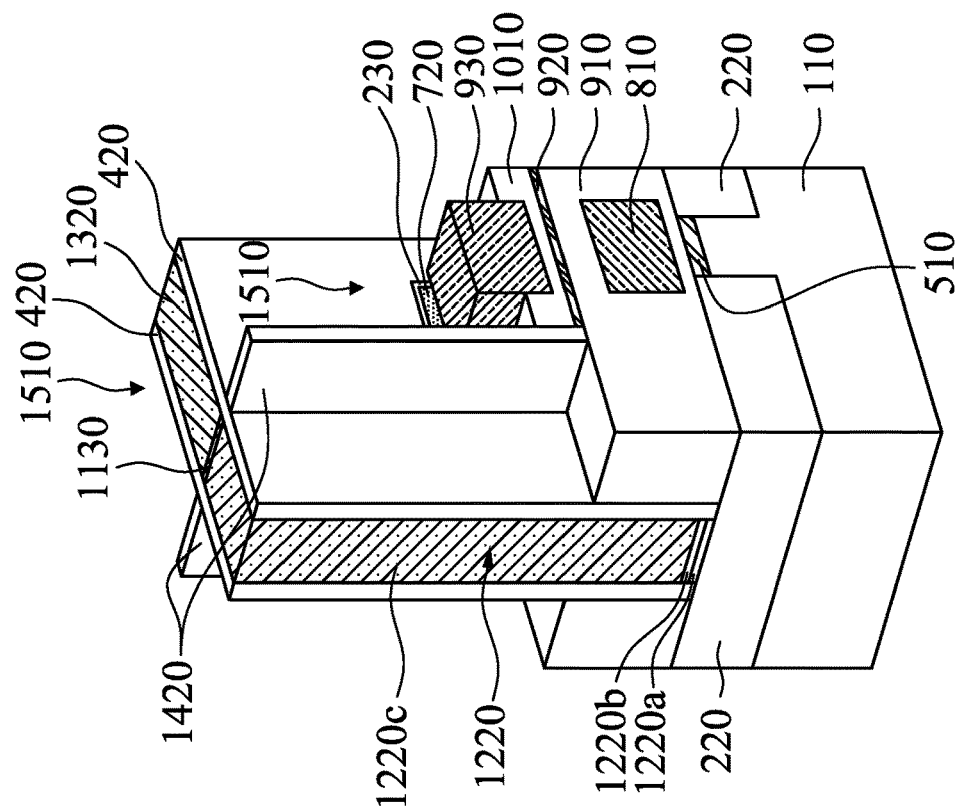
Figure 2O:
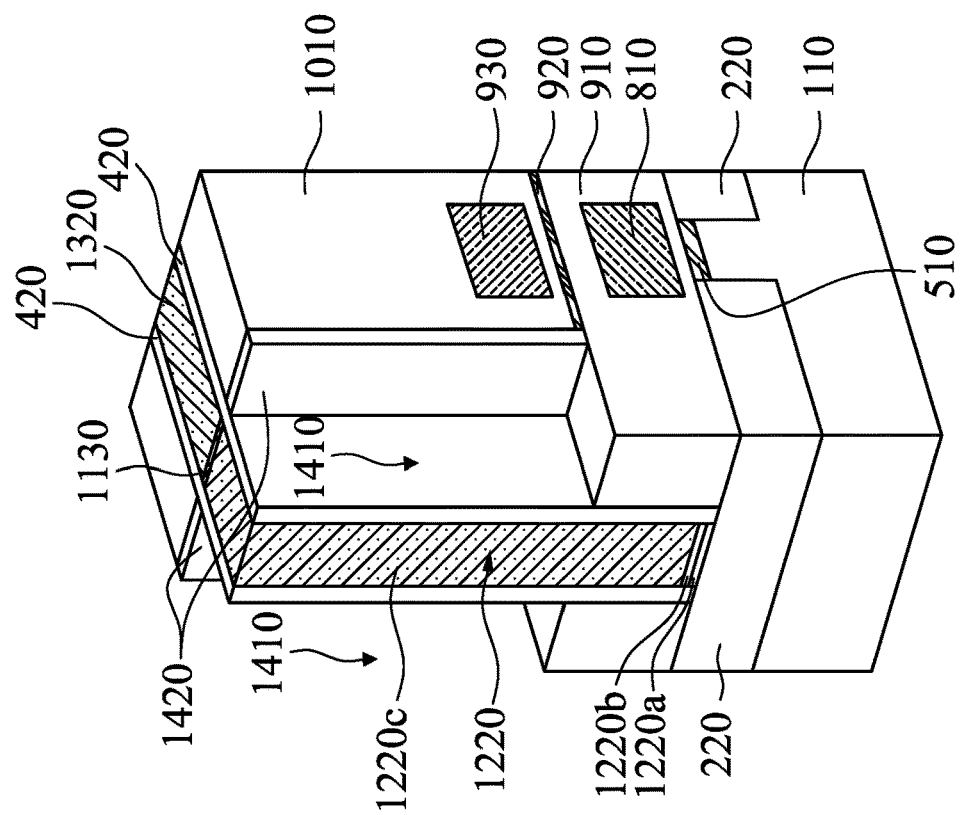
Figure 2Q:
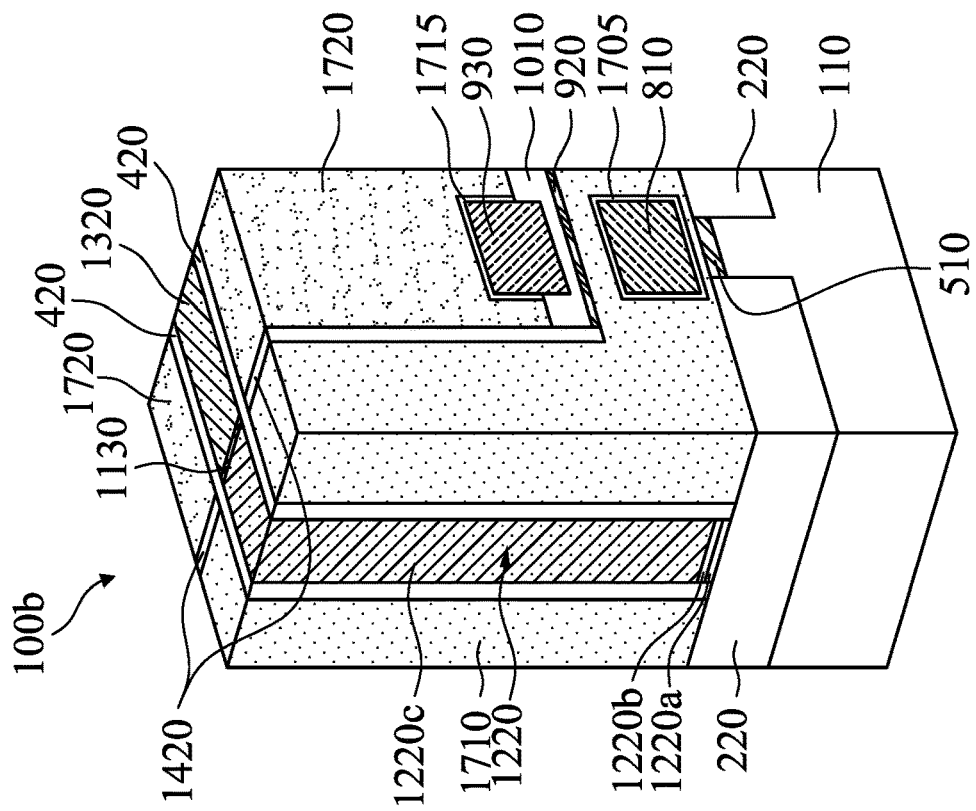
Figure 2P:
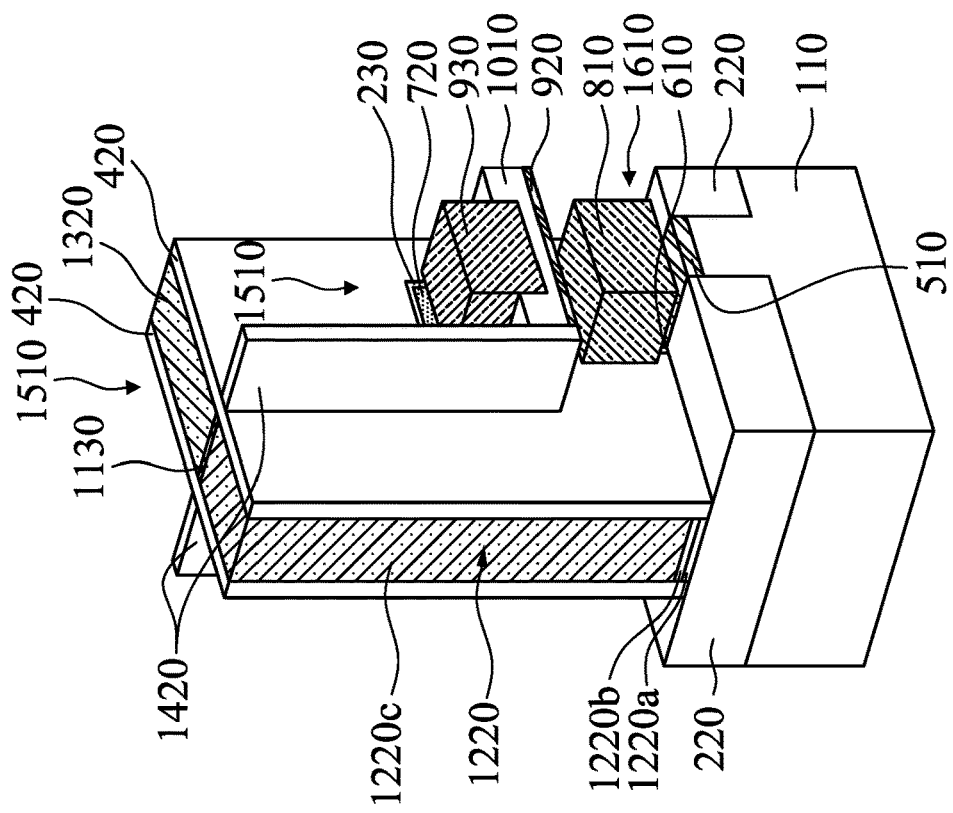

FIGS. 2A-2Q show perspective representations of various stages of forming a semiconductor device structure 100b, in accordance with some embodiments of the disclosure. Some processes and materials used to form the semiconductor device structure 100a are similar to, or the same as, those used to form the semiconductor device structure 100b and are not repeated herein. The semiconductor device structure 100b of FIG. 2Q is similar to the semiconductor device structure 100a of FIG. 1Q, the differences between FIG. 2Q and FIG. 1Q are that the first fin structure 132 is made of SiGe to form the first device 10 (such as p-type FET (PFET)) in FIG. 2Q.

FIG. 2A is similar to, or the same as FIG. 1A, the first fin structure 132 is formed over the first sacrificial layer 120, and the semiconductor layer 134 is formed over the first fin structure 132.

In some embodiments, the first fin structure 132 is made of SiGe layers having a germanium percentage lower than the germanium percentage in the first sacrificial layer 120. In some embodiments, the germanium percentage of the first fin structure 132 is in a range between about 20 percent and about 30 percent. Furthermore, a difference between the germanium percentages of the first sacrificial layer 120 and the germanium percentage of the first fin structure 132 may be greater than about 20 percent or higher.

In some embodiments, the semiconductor layer 134 is made of silicon (Si). In some embodiments, the semiconductor layer 134 is made of silicon that is free from germanium (Ge). In some embodiments, the semiconductor layer 134 is substantially pure silicon layers, for example, with a germanium percentage lower than about 1 percent. Furthermore, the semiconductor layer 134 may be intrinsic, which are not doped with p-type and n-type impurities.

Afterwards, as shown in FIG. 2B, the semiconductor strip 210 is formed, and the isolation structure 220 is formed, in accordance with some embodiments of the disclosure. Subsequently, the dummy dielectric layer 230 is conformally formed to cover the semiconductor strip 210.

Next, as shown in FIG. 2C, the first dummy gate layer 310, the etch stop layer 320 and the second dummy gate layer 330 are formed on the semiconductor strip 210, in accordance with some embodiments of the disclosure. Next, the patterned hard mask 340 is formed over the second dummy gate layer 330.

Afterwards, as shown in FIG. 2D, the dummy gate stack 410 crossing the semiconductor strip 210 is formed, and then the gate spacers 420 are formed on sidewalls of the dummy gate stack 410, in accordance with some embodiments of the disclosure.

Next, as shown in FIG. 2E, a portion of the semiconductor strip 210 and the dummy dielectric layer 230 uncovered by the dummy gate stack 410 and the gate spacers 420 are removed to expose the channel portion of the semiconductor strip 210 and the top surface of the substrate 110, in accordance with some embodiments of the disclosure. Subsequently, the insulation layer 510 is formed on the top surface of the substrate 110.

Afterwards, as shown in FIG. 2F, the first sacrificial layer 120 and the second sacrificial layer 140 are removed to form the opening 122 and the opening 142, in accordance with some embodiments of the disclosure. Next, the first inner gate spacer 610 is formed in the opening 122 and the second inner gate spacer 620 is formed in the opening 142.

Subsequently, as shown in FIGS. 2G-1 and 2G-2, the semiconductor layer 134 and the semiconductor layers 152 are trimmed to form the first sidewall spacers 710 on opposite sides of the semiconductor layer 134, and the second sidewall spacers 720 on opposite sides of the semiconductor layers 152, in accordance with some embodiments of the disclosure. The second inner gate spacer 620 has the top surface in direct contact with the bottom surfaces of the second sidewall spacers 720 and the bottom surface in direct contact with the top surfaces of the first sidewall spacers 710.

It should be noted that, since the materials of the semiconductor layer 134 and semiconductor layers 152 are different from the first fin structure 132 and the semiconductor layers 154, etching rates thereof are different, and the first fin structure 132 and the semiconductor layers 154 remain in place while the semiconductor layer 134 and the semiconductor layers 152 are trimmed.

Next, as shown in FIGS. 2H-1 and 2H-2, the first epitaxy structures 810 are formed on opposite sidewalls of the first fin structure 132 and the semiconductor layers 154, in accordance with some embodiments of the disclosure.

Next, as shown in FIGS. 2I-1 and 2I-2, the bottom ILD 910 is formed to surround the first epitaxy structures 810 in contact with the first fin structure 132 and exposes the first epitaxy structures 810 in contact with the semiconductor layers 154, in accordance with some embodiments of the disclosure. Afterwards, the etch stop layer 920 is formed on the bottom ILD 910, and the second epitaxy structures 930 are formed on opposite sidewalls of the semiconductor layers 154.

Subsequently, as shown in FIG. 2J, the top ILD 1010 is formed on the etch stop layer 920 and at least on opposite sides of the dummy gate stack 410, in accordance with some embodiments of the disclosure.

Afterwards, as shown in FIGS. 2K-1 and 2K-2, the second dummy gate layer 330 and the etch stop layer 320 are patterned by using the patterned hard mask 1110 as a mask to form the trench 1120 between the gate spacers 420, in accordance with some embodiments of the disclosure. The third inner gate spacer 1130 is formed at least on sidewalls of the second dummy gate layer 330 and the etch stop layer 320 exposed by the trench 1120.

Next, as shown in FIGS. 2L-1 and 2L-2, the remaining first dummy gate layer 310, a portion of the dummy dielectric layer 230, and the semiconductor layer 134 are removed to form the recess 1210, in accordance with some embodiments of the disclosure. The first gate stack 1220 is filled in the recess 1210. Since the first fin structure 132 and the semiconductor layer 134 are made of different materials, the semiconductor layer 134 is removed, but the first fin structure 132 remains. The first gate stack 1220 wraps the first fin structure 132.

Subsequently, the processes performed on FIGS. 2M-1-2Q are the same as, or similar to the process performed on FIGS. 1M-1-1Q, and thus are omitted for brevity.

In the second embodiment, the first device 10, such as a p-type FET (PFET) is formed over the substrate 110, and the second device 20, such as n-type FET (NFET) is formed over the first device 10. In some embodiments, the first device 10 includes a first fin structure 132 having SiGe as a channel, and the second device 20 includes a number of nanostructures (such as semiconductor layers 154) having a number of Si channels.

Figure 3B:
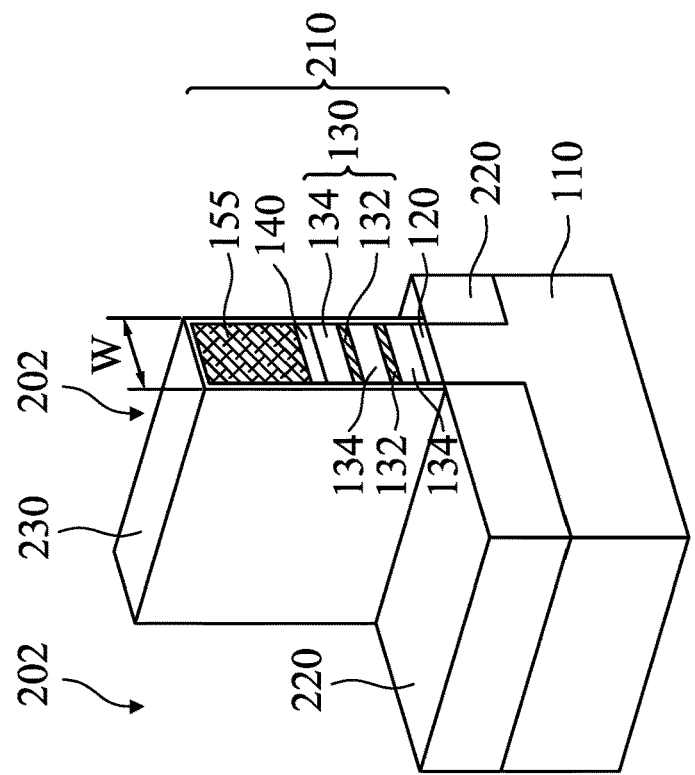
Figure 3A:
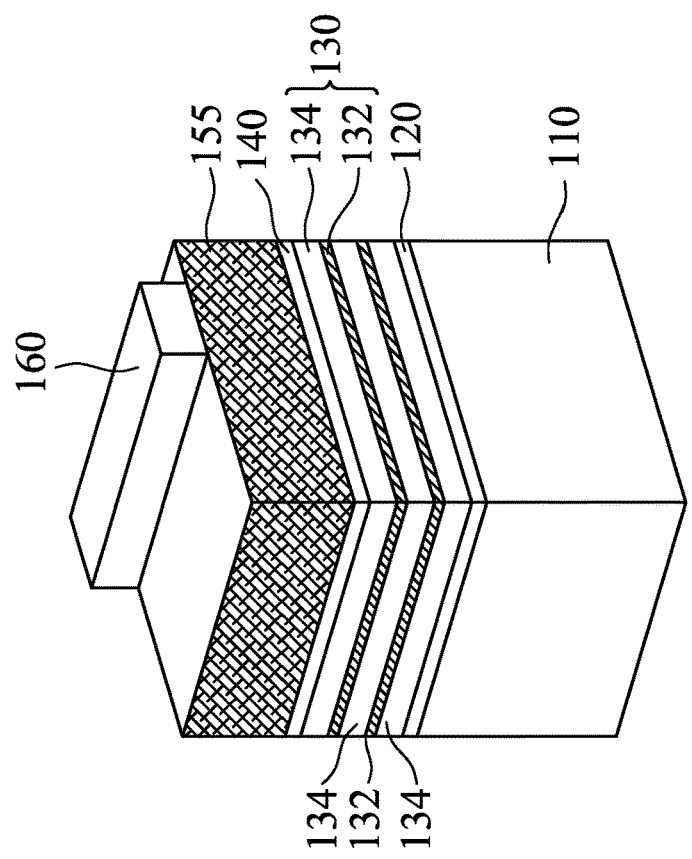
Figures 3C, 3D:
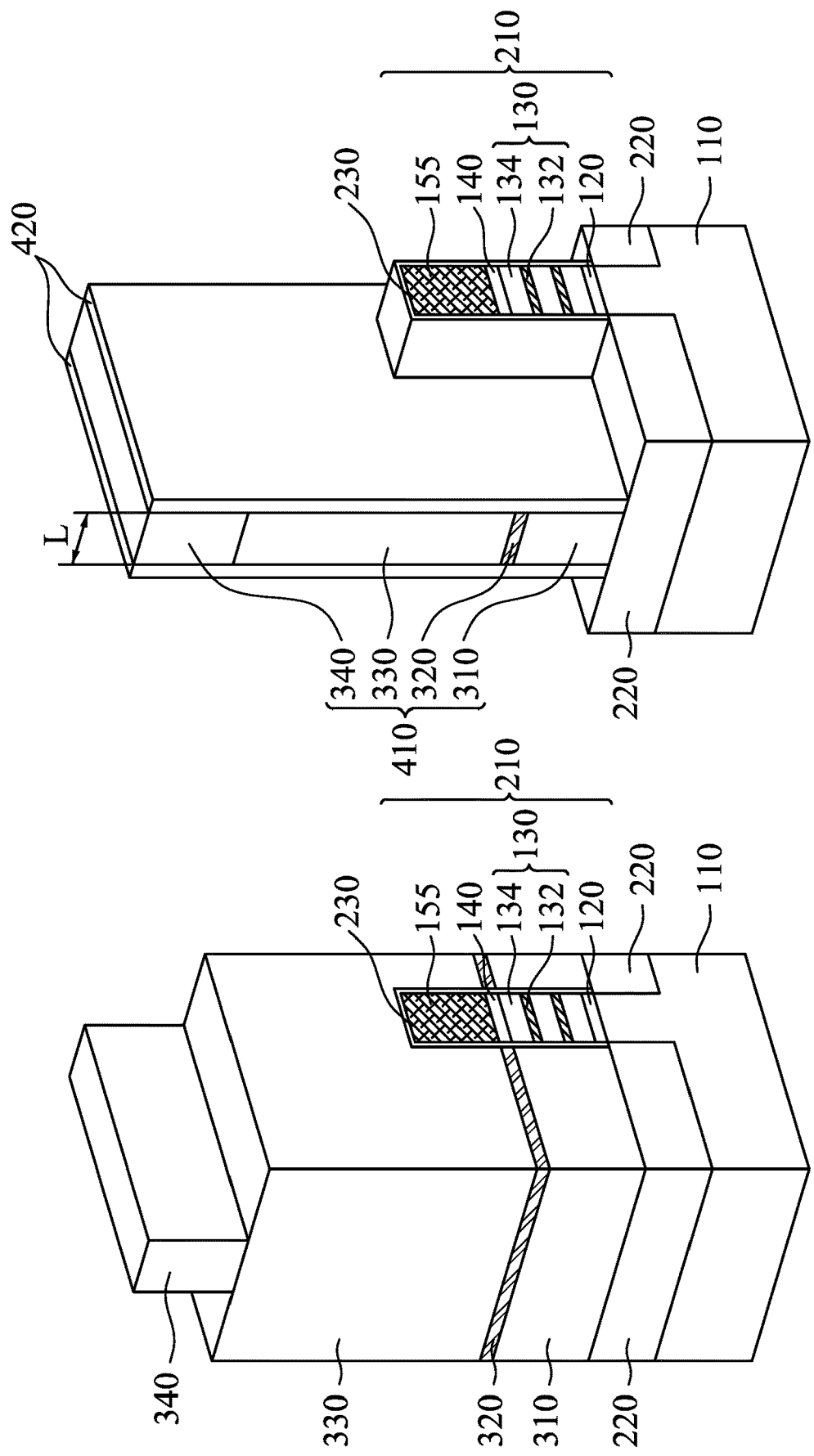
Figure 3F:
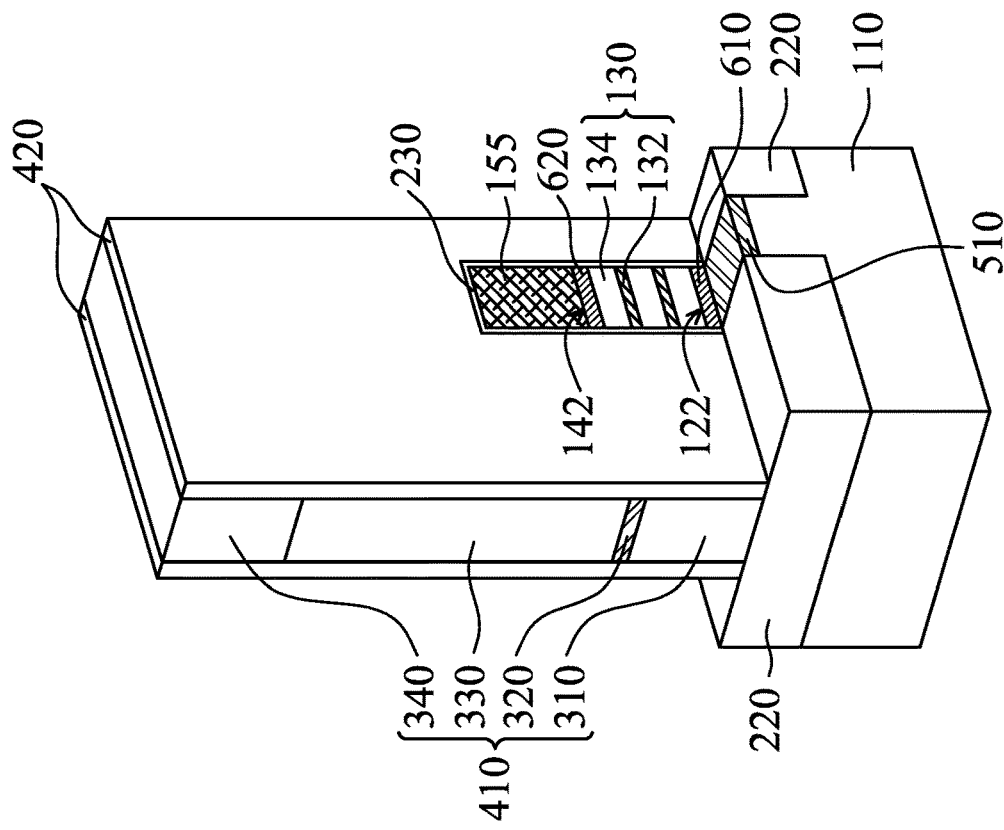
Figure 3E:
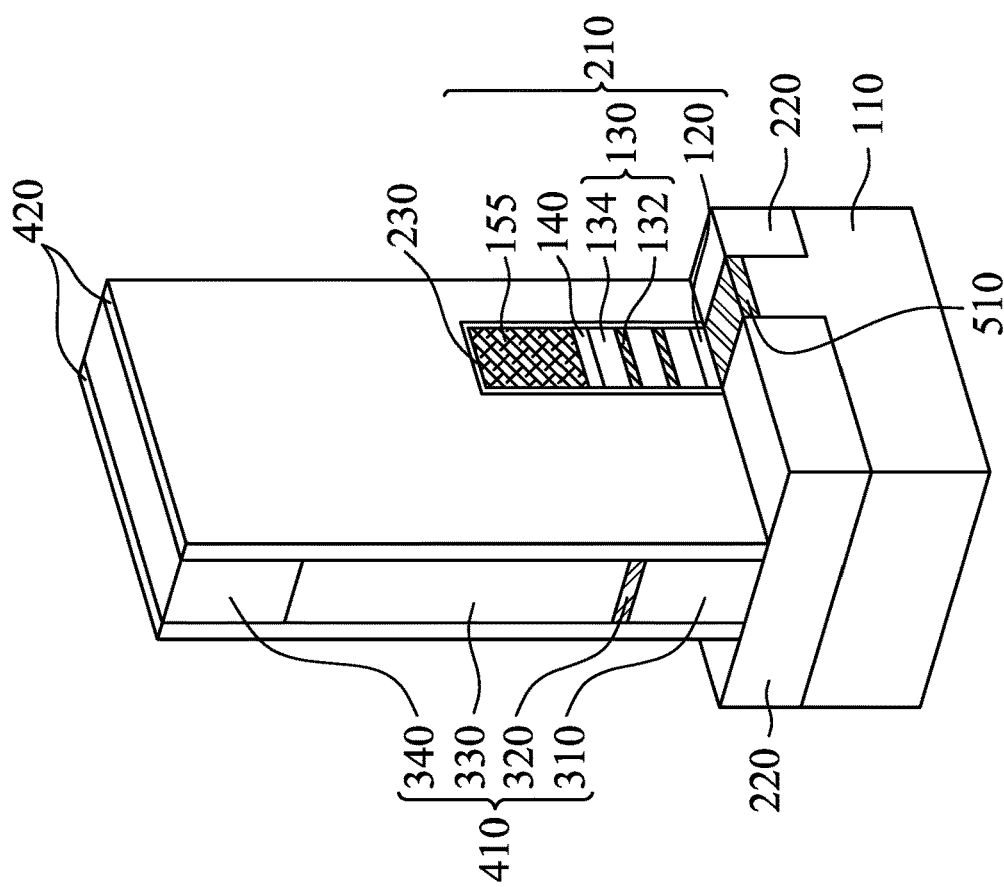
Figures 2, 3G:
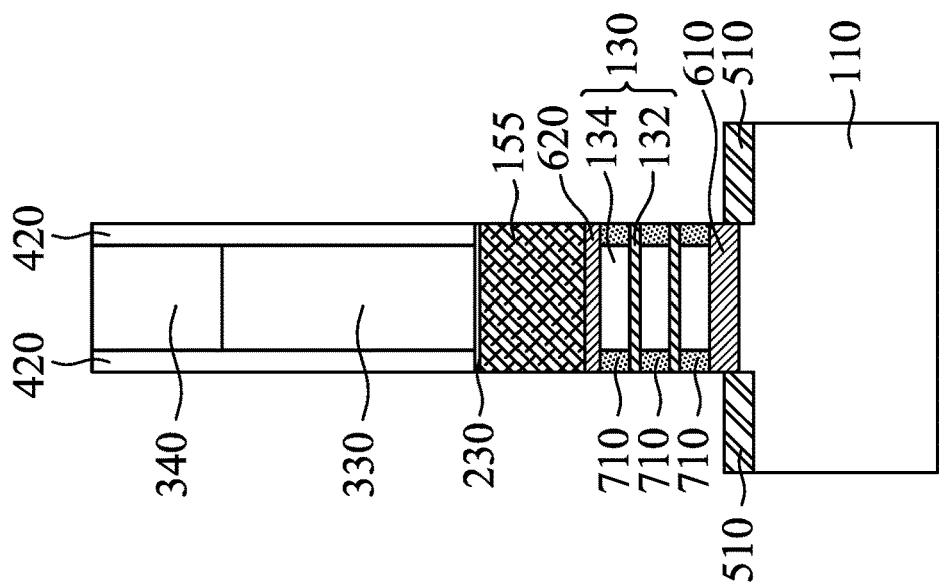
Figures 1, 3G:
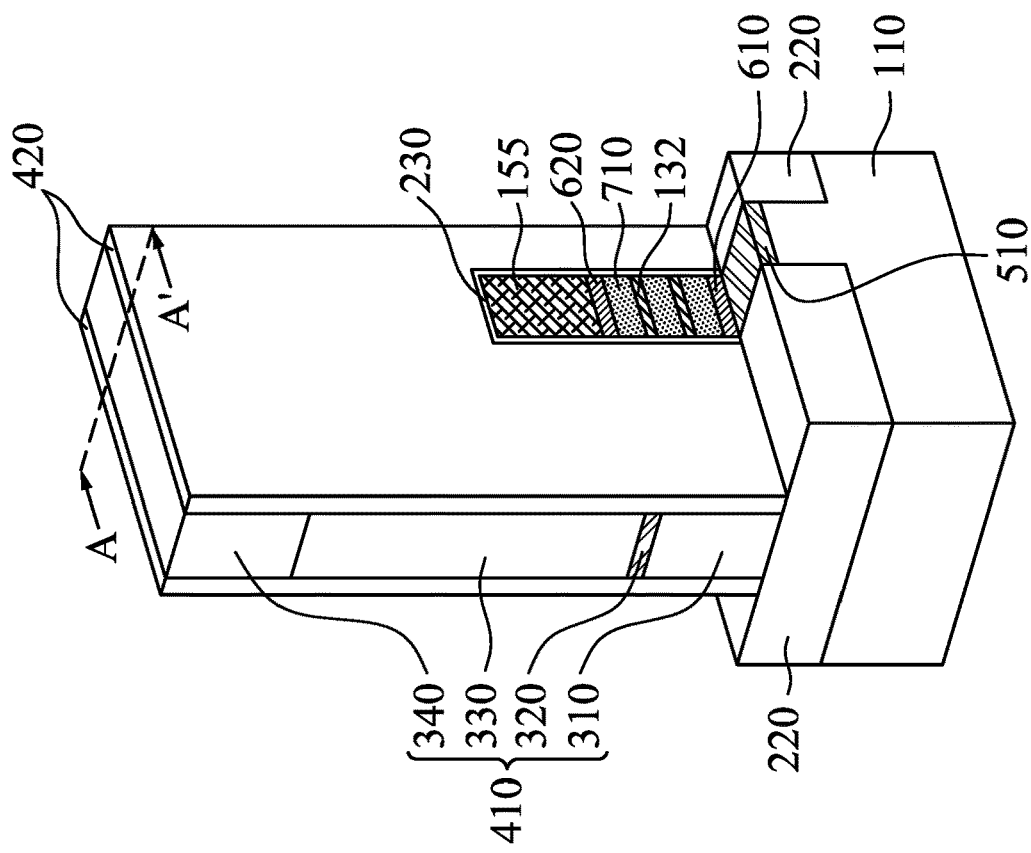
Figures 2, 3H:
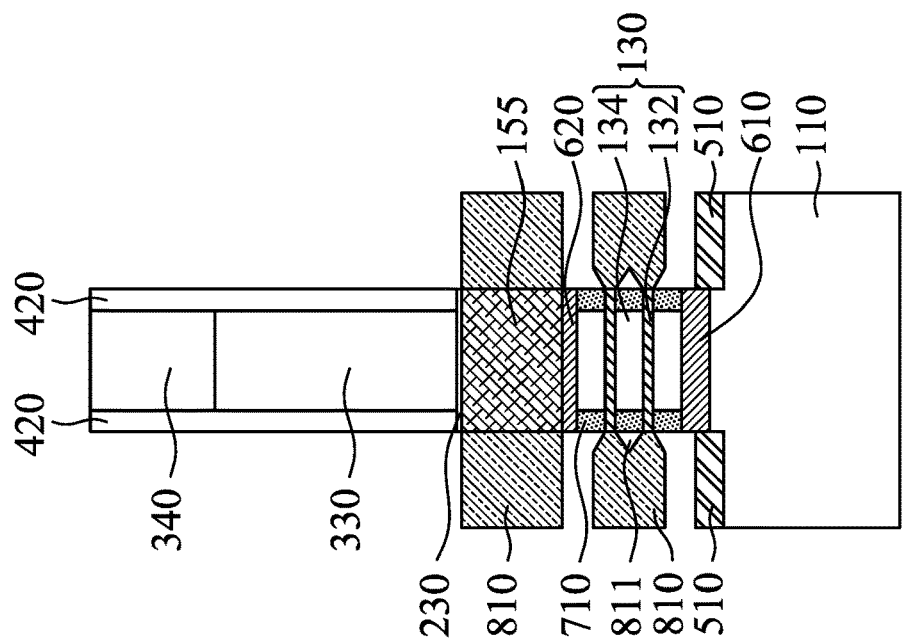
Figures 1, 3H:
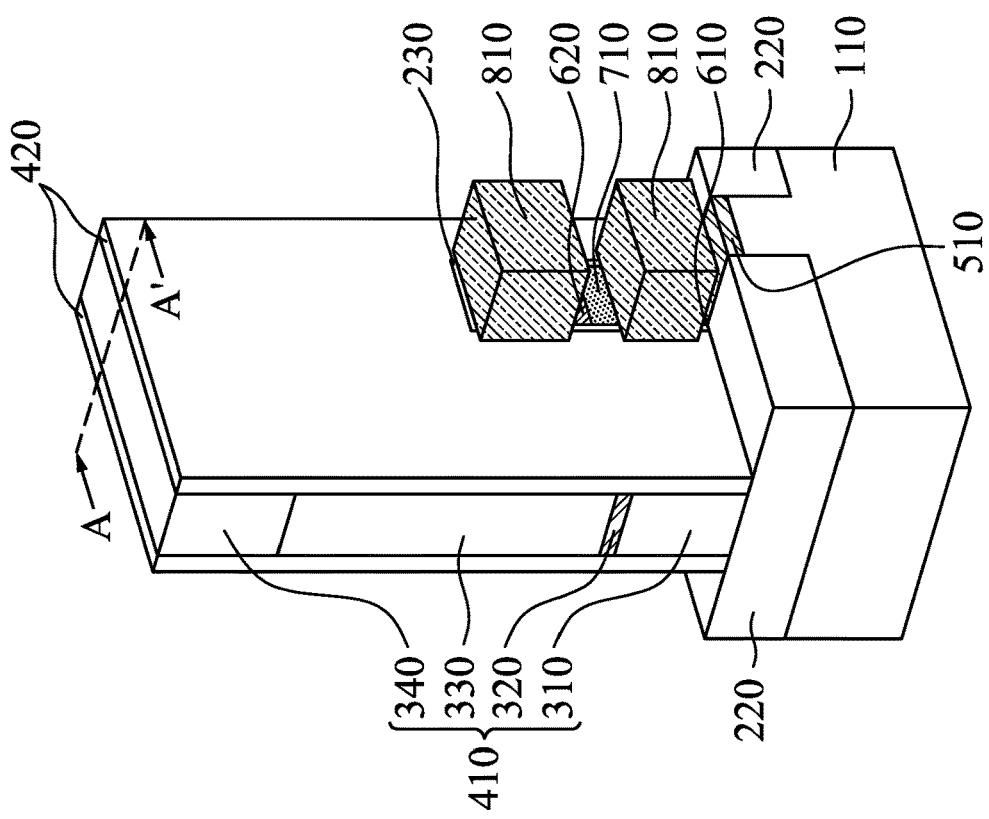
Figure 3J:
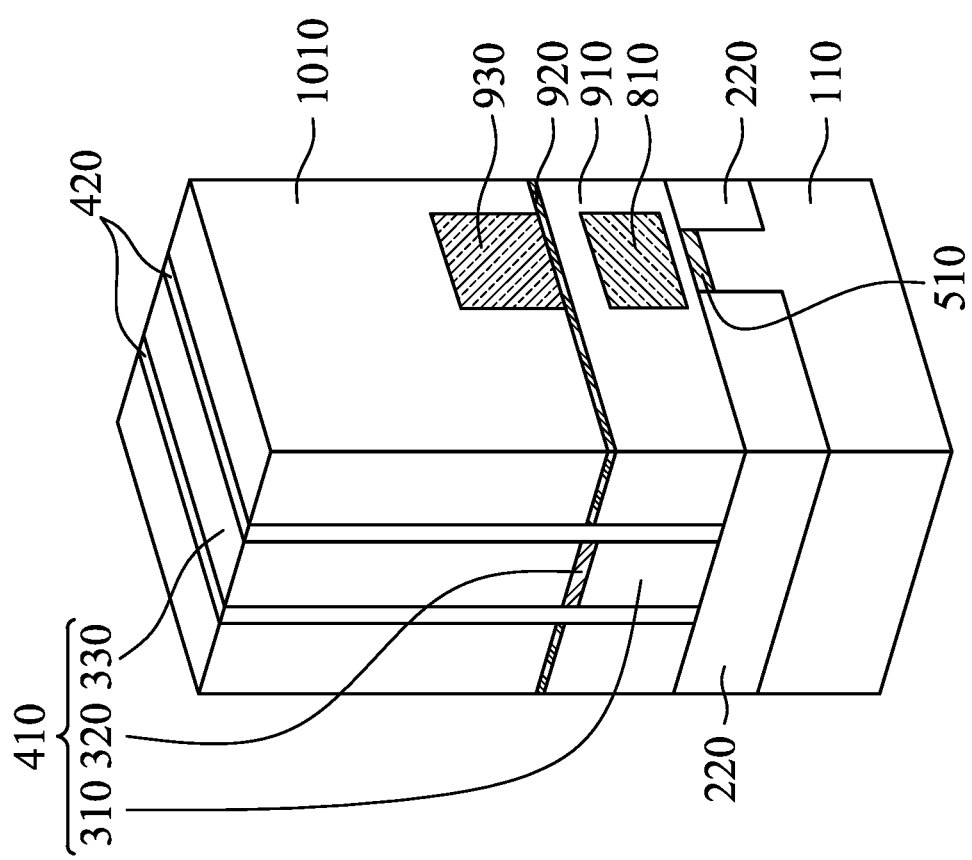
Figures 2, 3M:
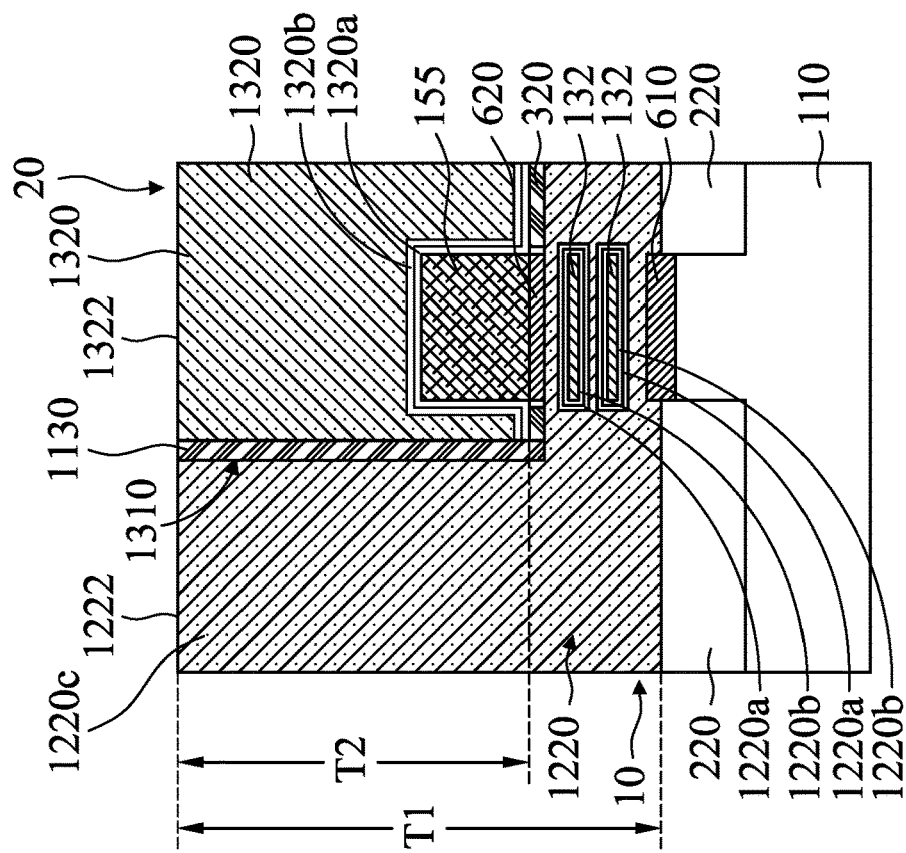
Figures 1, 3M:
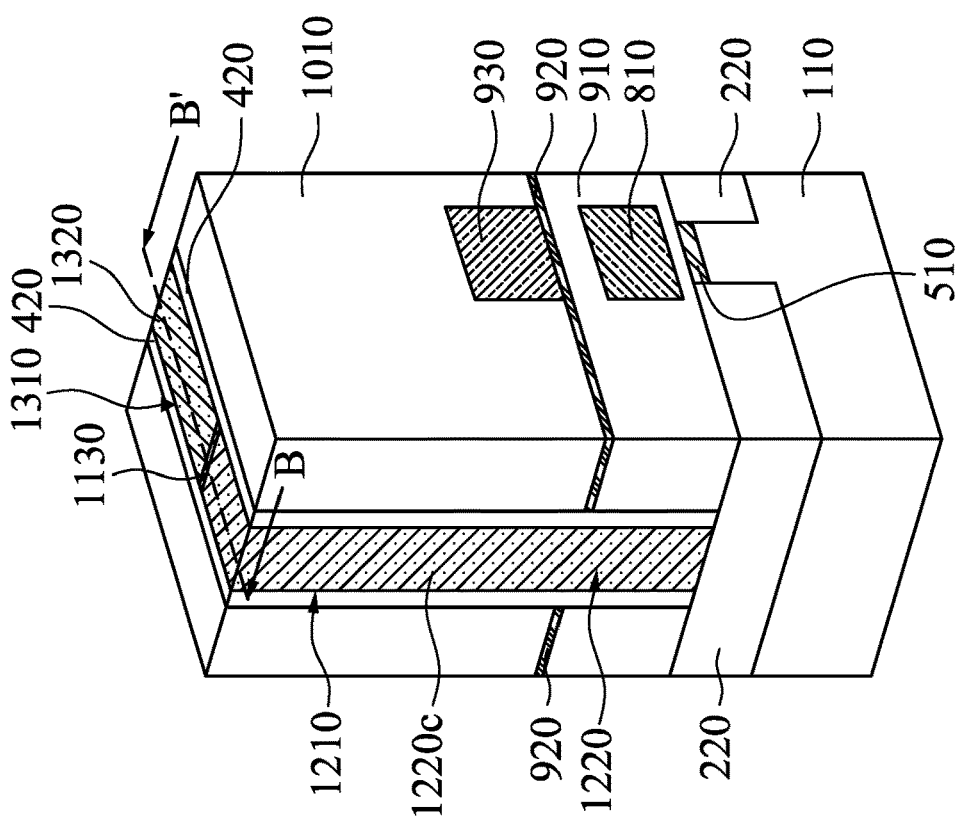
Figure 3O:
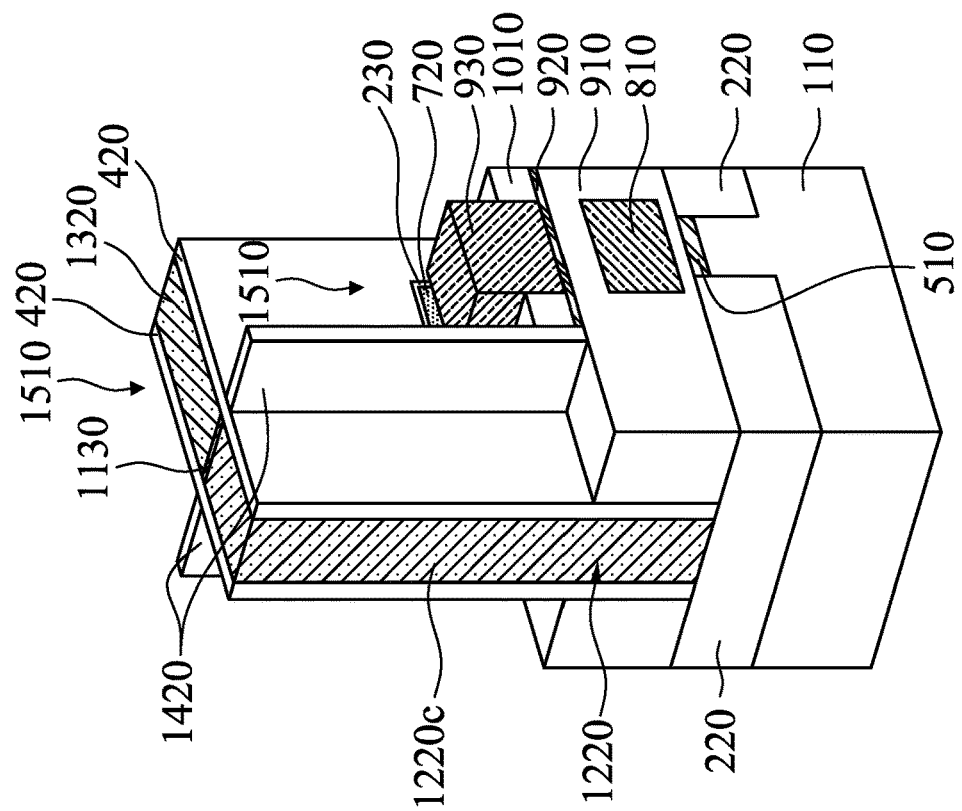
Figure 3N:
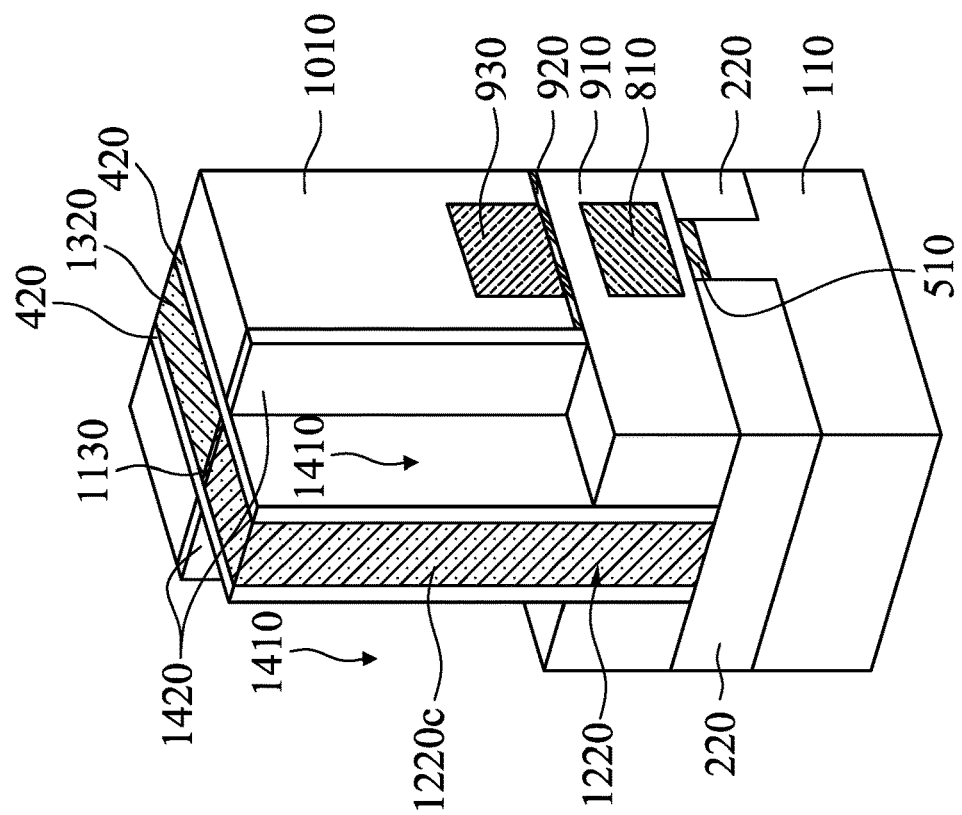
Figure 3Q:
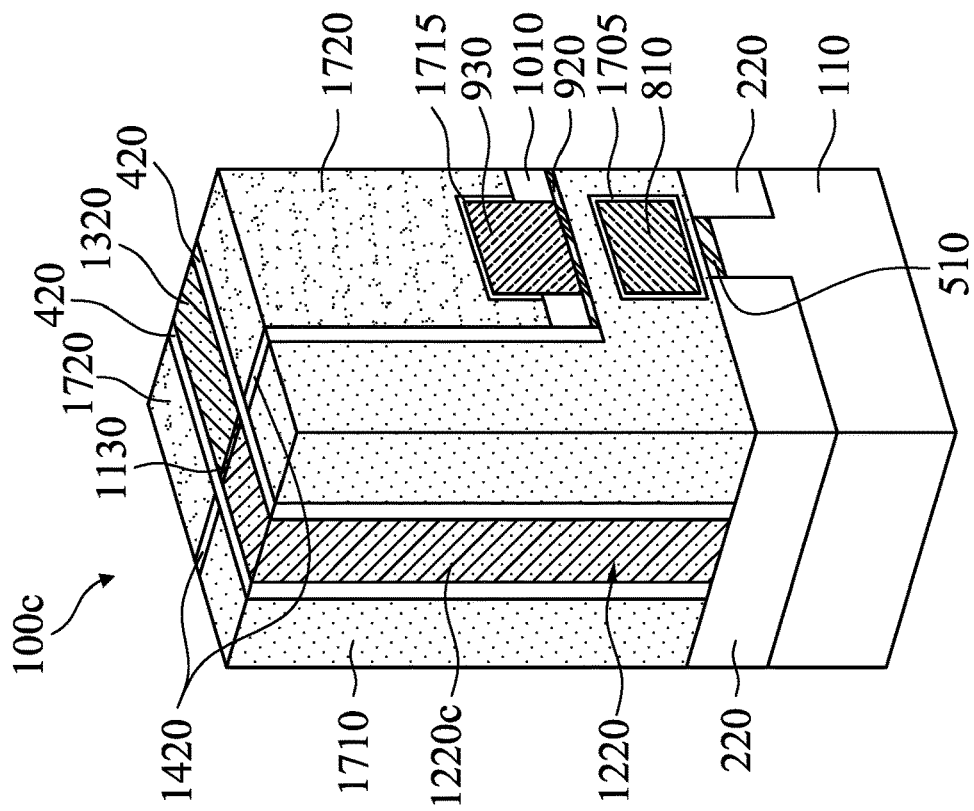
Figure 3P:
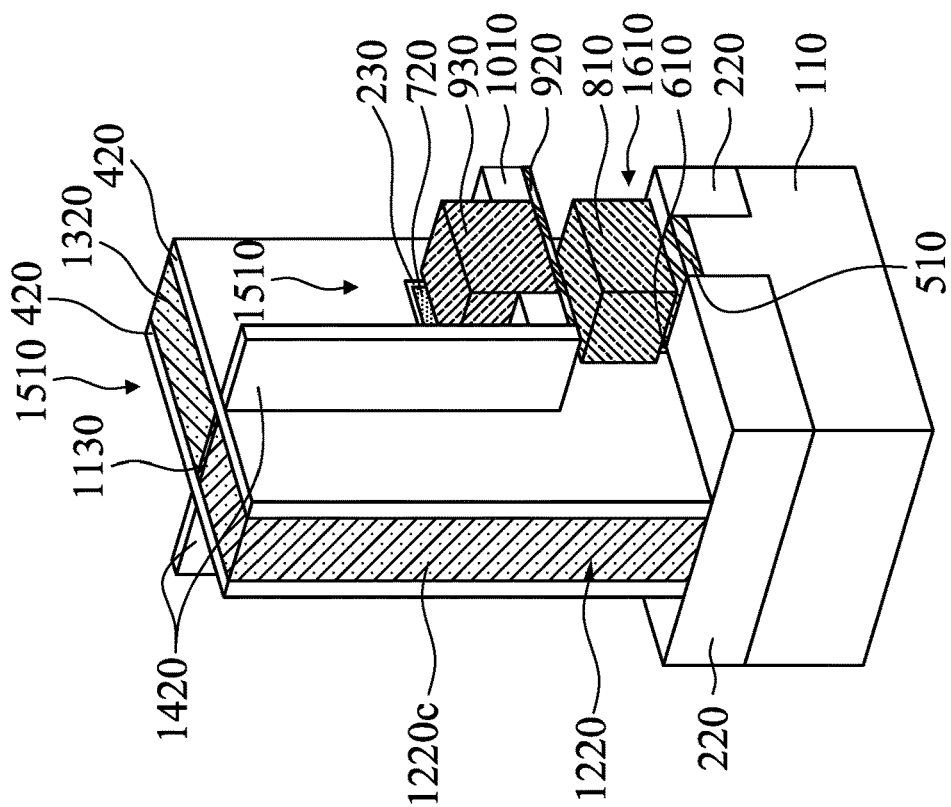

FIGS. 3A-3Q show perspective representations of various stages of forming a semiconductor device structure 100*c*, in accordance with some embodiments of the disclosure. Some processes and materials used to form the semiconductor device structure 100*c* are similar to, or the same as, those used to form the semiconductor device structure 100*a* and are not repeated herein.

As shown in FIG. 3A, the first semiconductor stack 130 is formed over the first sacrificial layer 120. The first semiconductor stack 130 includes the semiconductor layers 132 and the semiconductor layers 134. The second sacrificial layer 140 is formed on the first semiconductor stack 130. A second fin structure 155 is formed over the second sacrificial layer 140. Afterwards, the patterned hard mask 160 is formed over the second fin structure 155. In some embodiments, each of the semiconductor layers 132 is made of Si, and each of the semiconductor layers 134 is made of SiGe.

In some embodiments, the second fin structure 155 is made of silicon (Si). In some embodiments, the second fin structure 155 is made of silicon that is free from germanium (Ge). In some embodiments, the second fin structure 155 is substantially pure silicon layers, for example, with a germanium percentage lower than about 1 percent. Furthermore, the second fin structure 155 may be intrinsic, which are not doped with p-type and n-type impurities.

Next, as shown in FIG. 3B, the substrate 110, the first sacrificial layer 120, the first semiconductor stack 130, the second sacrificial layer 140, the second fin structure 155 are patterned by using the patterned hard mask 160 to form a semiconductor strip 210, in accordance with some embodiments of the disclosure.

Afterwards, as shown in FIG. 3C, the first dummy gate layer 310, the etch stop layer 320 and the second dummy gate layer 330 are formed on the semiconductor strip 210, in accordance with some embodiments of the disclosure. Next, the patterned hard mask 340 is formed over the second dummy gate layer 330.

Afterwards, as shown in FIG. 3D, the dummy gate stack 410 crossing the semiconductor strip 210 is formed, and then the gate spacers 420 are formed on sidewalls of the dummy gate stack 410, in accordance with some embodiments of the disclosure.

Next, as shown in FIG. 3E, a portion of the semiconductor strip 210 and the dummy dielectric layer 230 uncovered by the dummy gate stack 410 and the gate spacers 420 are removed to expose the channel portion of the semiconductor strip 210 and the top surface of the substrate 110, in accordance with some embodiments of the disclosure. Subsequently, the insulation layer 510 is formed on the top surface of the substrate 110.

Subsequently, as shown in FIG. 3F, the first sacrificial layer 120 and the second sacrificial layer 140 are removed to form the opening 122 and the opening 142, in accordance with some embodiments of the disclosure. Next, the first inner gate spacer 610 is formed in the opening 122 and the second inner gate spacer 620 is formed in the opening 142.

Subsequently, as shown in FIGS. 3G-1 and 3G-2, the semiconductor layers 134 are trimmed to form the first sidewall spacers 710 on opposite sides of the semiconductor layer 134, in accordance with some embodiments of the disclosure.

It should be noted that, since the materials of the semiconductor layers 134 are different from the second fin structure 155 and the semiconductor layers 132, etching rates thereof are different, and the second fin structure 155 and the semiconductor layers 132 remain in place while the semiconductor layers 134 are trimmed.

Next, as shown in FIGS. 3H-1 and 3H-2, the first epitaxy structures 810 are formed on opposite sidewalls of the semiconductor layers 132 and the second fin structure 155, in accordance with some embodiments of the disclosure. It should be noted that, since the first epitaxy structures 810 are not in direct contact with the first sidewall spacers 710, and therefore there is an air space 811 between the first epitaxy structures 810 and the first sidewall spacers 710.

Next, as shown in FIGS. 3I-1 and 3I-2, the bottom ILD 910 is formed to surround the first epitaxy structures 810 in contact with the semiconductor layers 134 and exposes the first epitaxy structures 810 in contact with the second fin structure 155, in accordance with some embodiments of the disclosure. Afterwards, the etch stop layer 920 is formed on the bottom ILD 910, and the second epitaxy structures 930 are formed on opposite sidewalls of the second fin structure 155.

Subsequently, as shown in FIG. 3J, the top ILD 1010 is formed on the etch stop layer 920 and at least on opposite sides of the dummy gate stack 410, in accordance with some embodiments of the disclosure.

Afterwards, as shown in FIGS. 3K-1 and 3K-2, the second dummy gate layer 330 and the etch stop layer 320 are patterned by using the patterned hard mask 1110 as a mask to form the trench 1120 between the gate spacers 420, in accordance with some embodiments of the disclosure. The third inner gate spacer 1130 is formed at least on sidewalls of the second dummy gate layer 330 and the etch stop layer 320 exposed by the trench 1120.

Next, as shown in FIGS. 3L-1 and 3L-2, the remaining first dummy gate layer 310, a portion of the dummy dielectric layer 230, and the semiconductor layers 132 are removed to form the recess 1210, in accordance with some embodiments of the disclosure. The first gate stack 1220 is filled in the recess 1210. Since the semiconductor layers 132 and the semiconductor layers 134 are made of different materials, the semiconductor layers 134 are removed, but the semiconductor layers 132 remain. The first gate stack 1220 wraps the semiconductor layers 132.

Afterwards, as shown in FIGS. 3M-1 and 3M-2, the remaining second dummy gate layer 330 and the remaining dummy dielectric layer 230 are removed to form the recess 1310, in accordance with some embodiments of the disclosure. As a result, the second fin structure 155 is exposed. Next, the second gate stack 1320 is formed and/or filled in the recess 1310. Therefore, the second gate stack 1320 encircles (wraps) the second fin structure 155 and is formed over the first gate stack 1220. In some embodiments, the second fin structure 155 is in direct contact with the second gate stack 1320.

As shown in FIGS. 3M-1 and 3M-2, the first gate stack 1220 is a n-type metal gate stack, and the second gate stack 1320 is an p-type metal gate stack. In some other embodiments, the first gate stack 1220 is an p-type metal gate stack, and the second gate stack 1320 is a n-type metal gate stack.

As shown in FIGS. 3M-1 and 3M-2, the semiconductor layers 132, the first epitaxy structures 810, and the first gate stack 1220 form the first device 10, such as an n-type FET (NFET). The second fin structure 155, the second epitaxy structures 930, and the second gate stack 1320 form the second device 20, such as a p-type FET (PFET). The first device 10 has a horizontal-gate-all-around (HGAA) device structure and the second device 20 has a FinFET device. Therefore, the first device 10 and the second device 20 are stacked on the substrate 110, and the first device 10 is disposed between the second device 20 and the substrate 110.

Subsequently, the processes performed on FIGS. 3N-3Q are the same as, or similar to the process performed on FIGS. 1N-1-1Q, and thus are omitted for brevity.

In the third embodiment, the first device 10, such as a n-type FET (NFET) is formed over the substrate 110, and the second device 20, such as p-type FET (PFET) is formed over the first device 10. In some embodiments, the first device 10 includes a number of nanostructures (or called nanowires, nanosheets) having a number of Si channels, and the second device 20 includes the second fin structure 155 having Si as a channel. In some other embodiments, the first device 10 includes a number of nanostructures (nanowires) having a number of Si channels, and the second device 20 includes the second fin structure having SiGe as a channel.

Figure 4B:
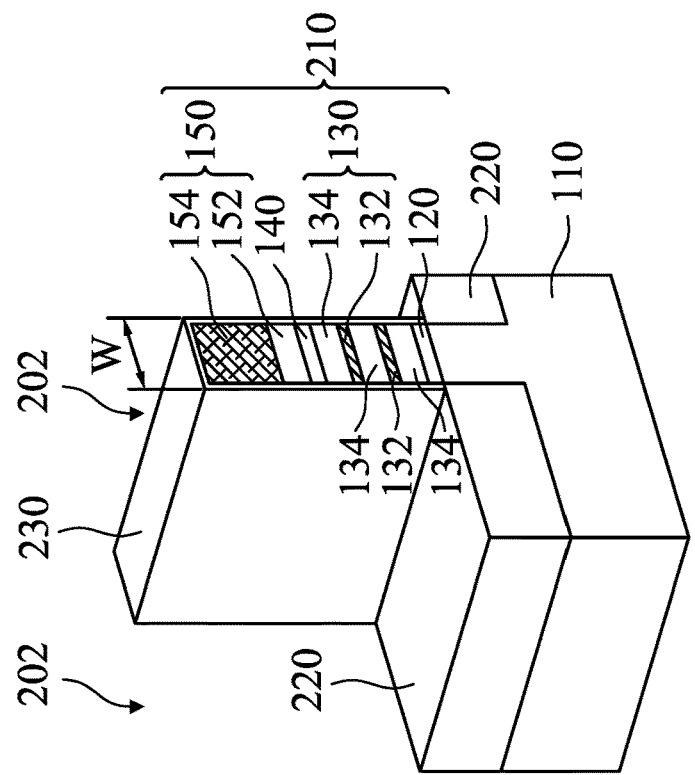
Figure 4A:
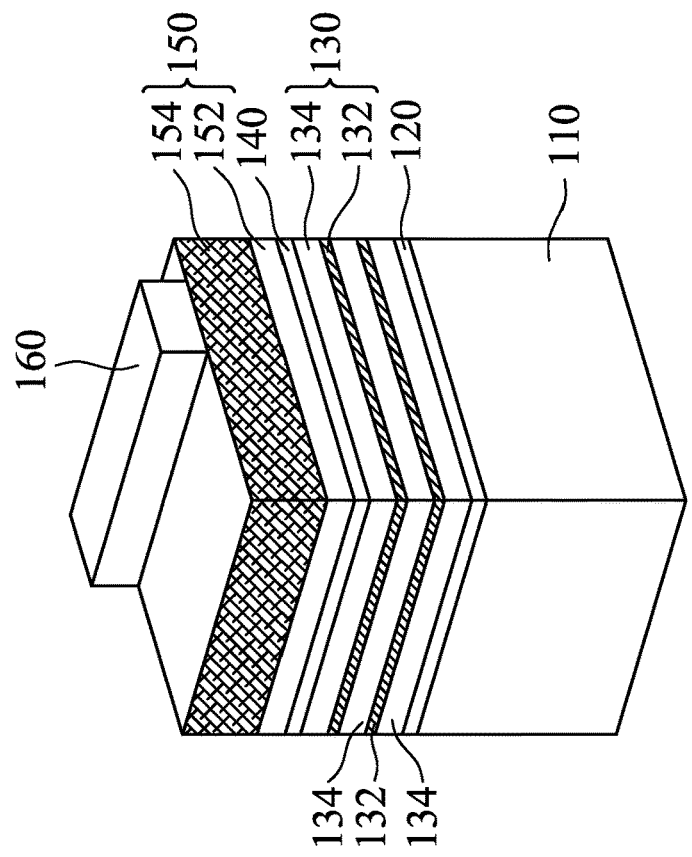
Figures 4C, 4D:
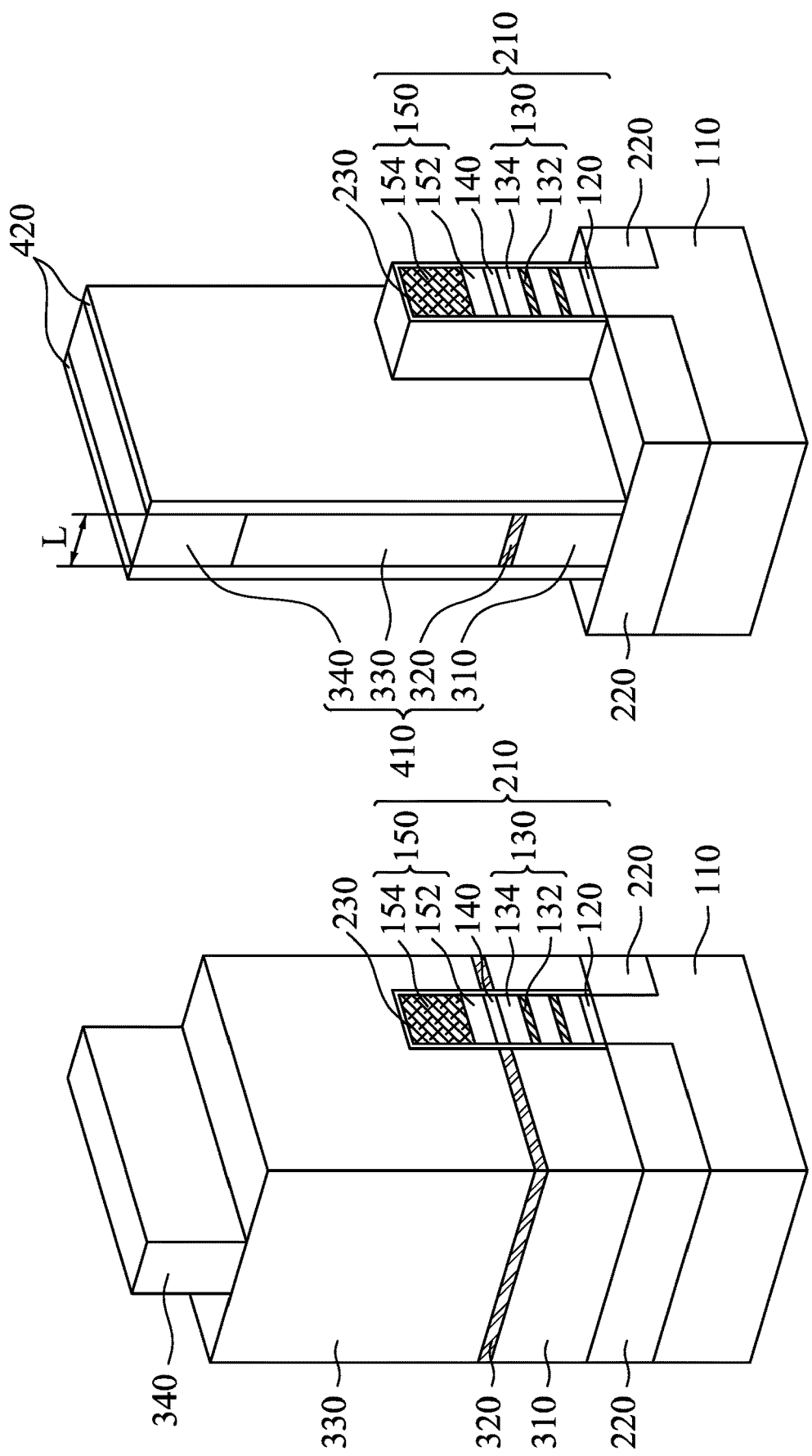
Figure 4F:
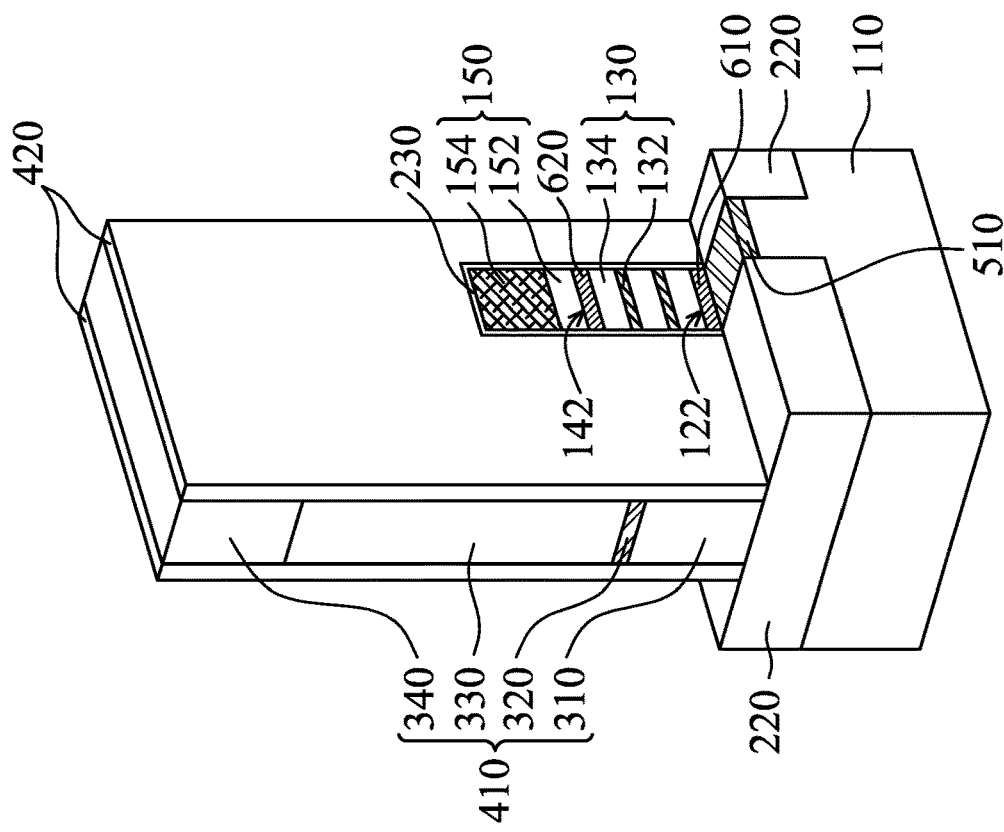
Figure 4E:
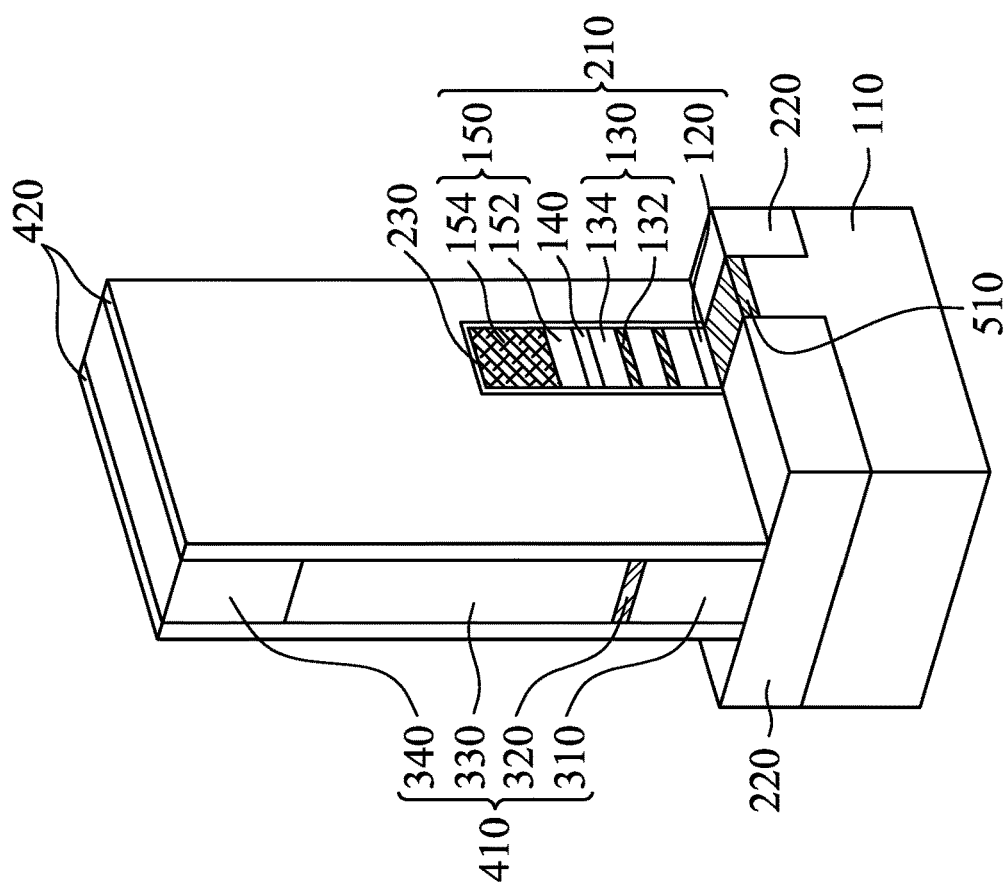
Figures 2, 4G:
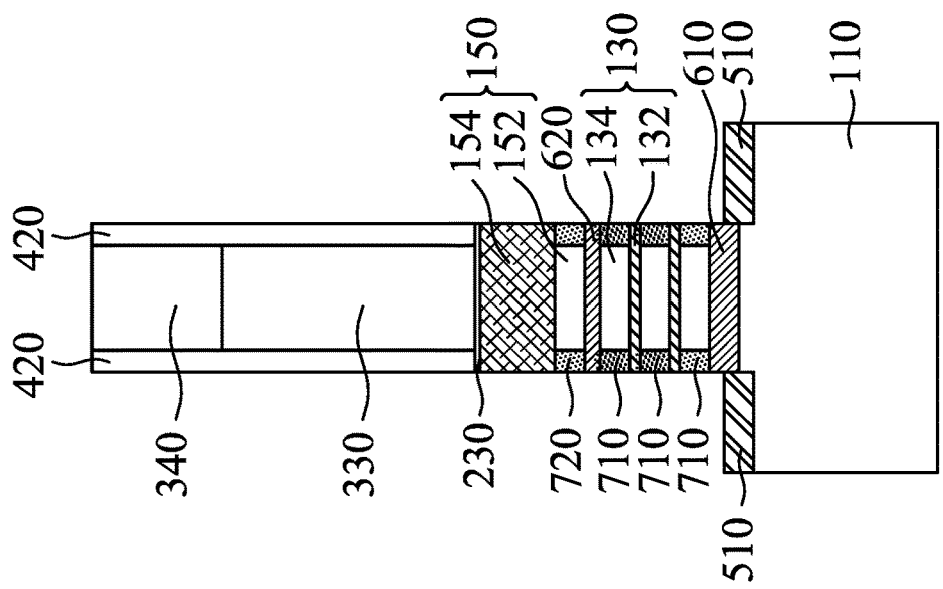
Figures 1, 4G:
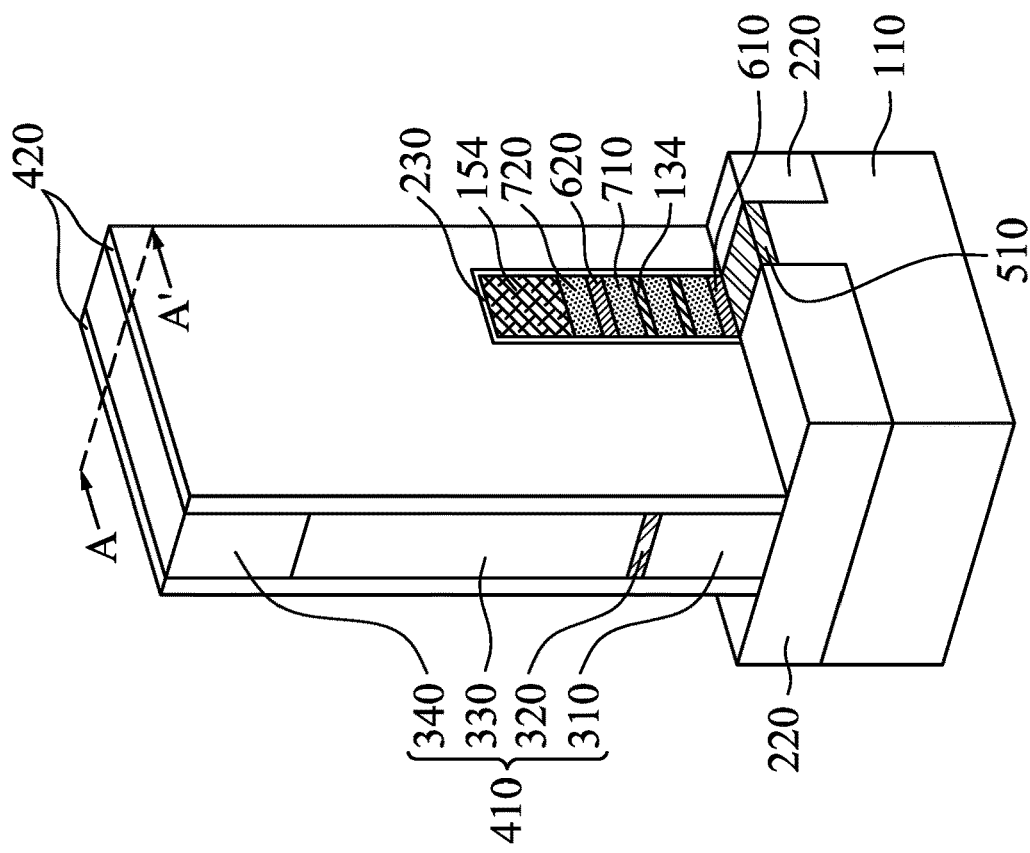
Figures 2, 4H:
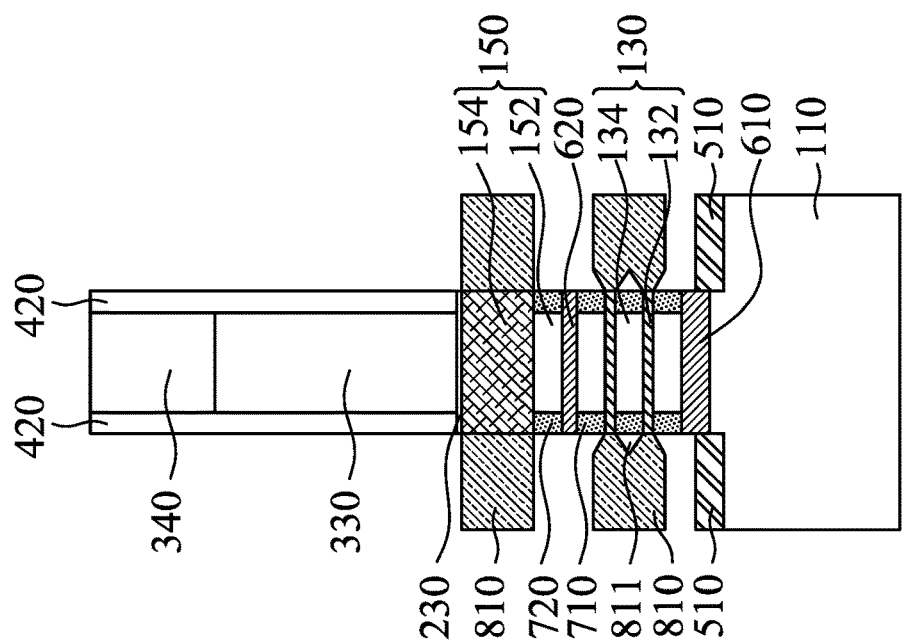
Figures 1, 4H:
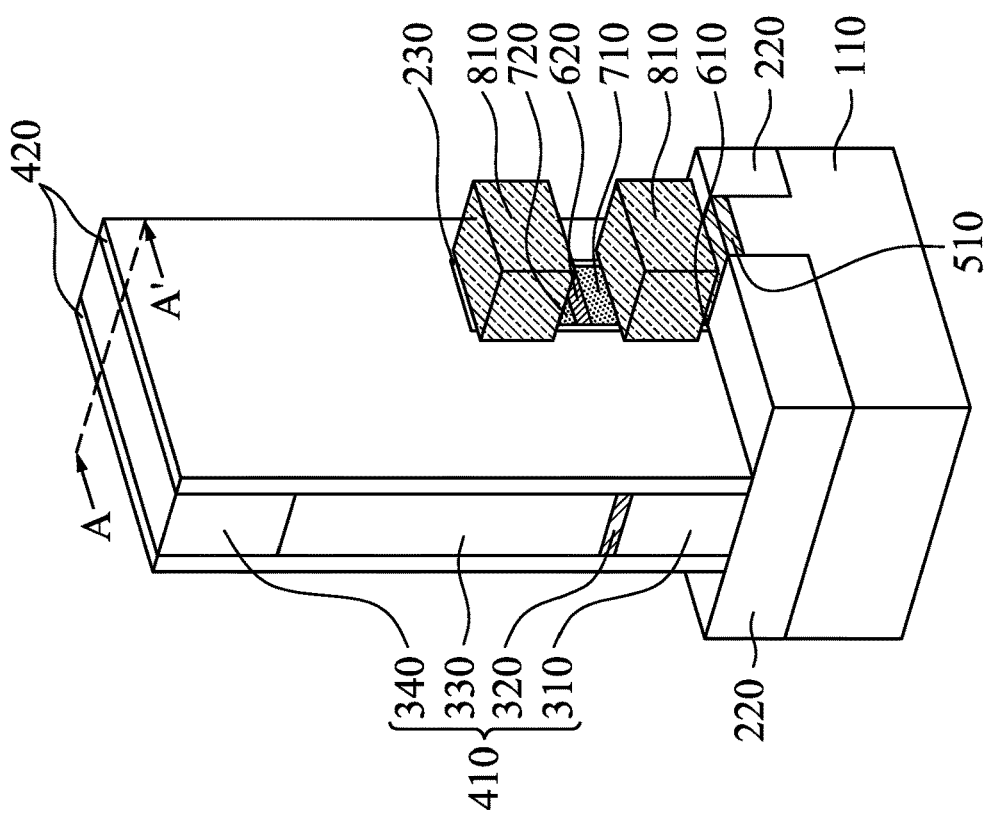
Figures 2, 4I:
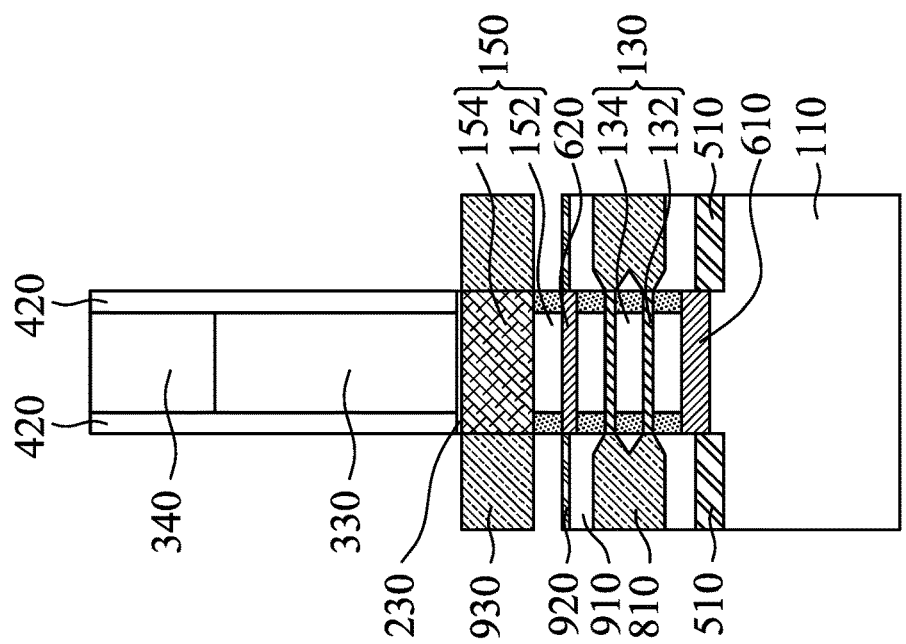
Figures 1, 4I:
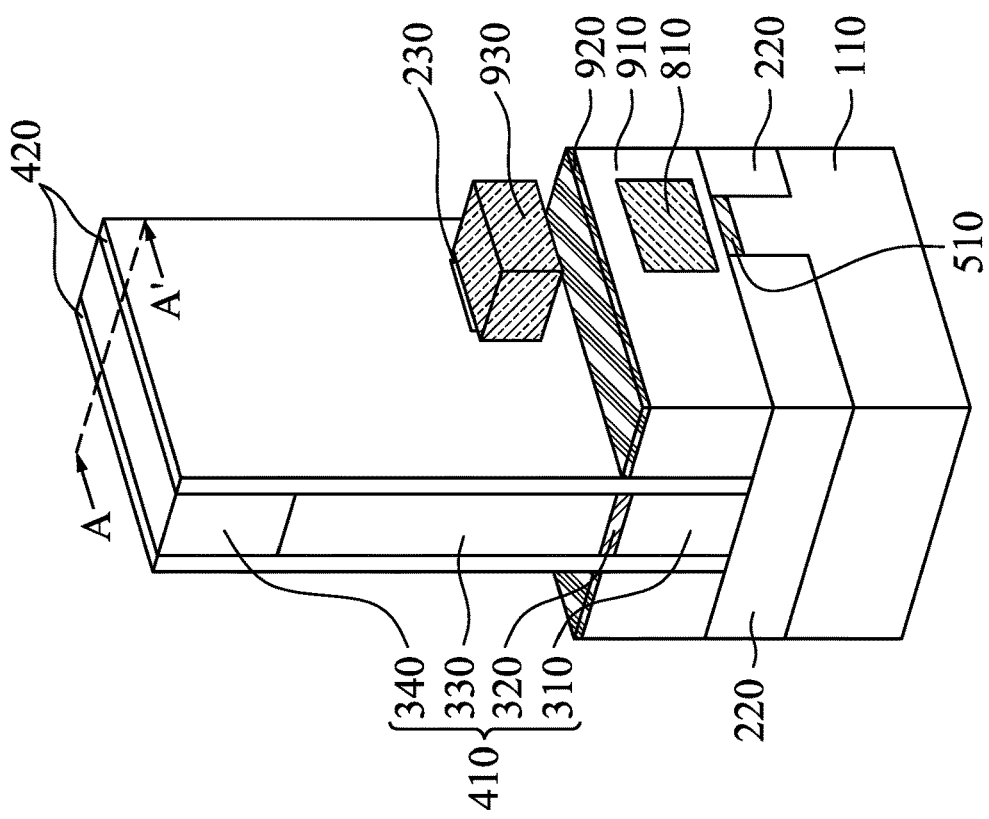
Figure 4J:
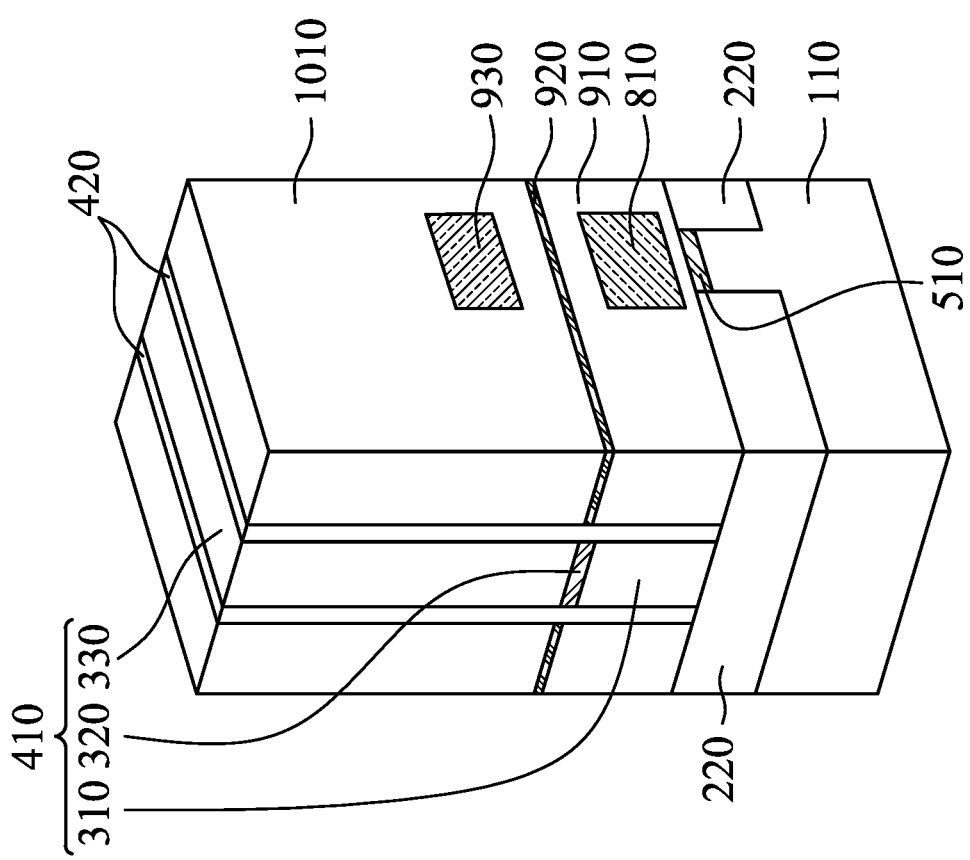
Figures 2, 4K:
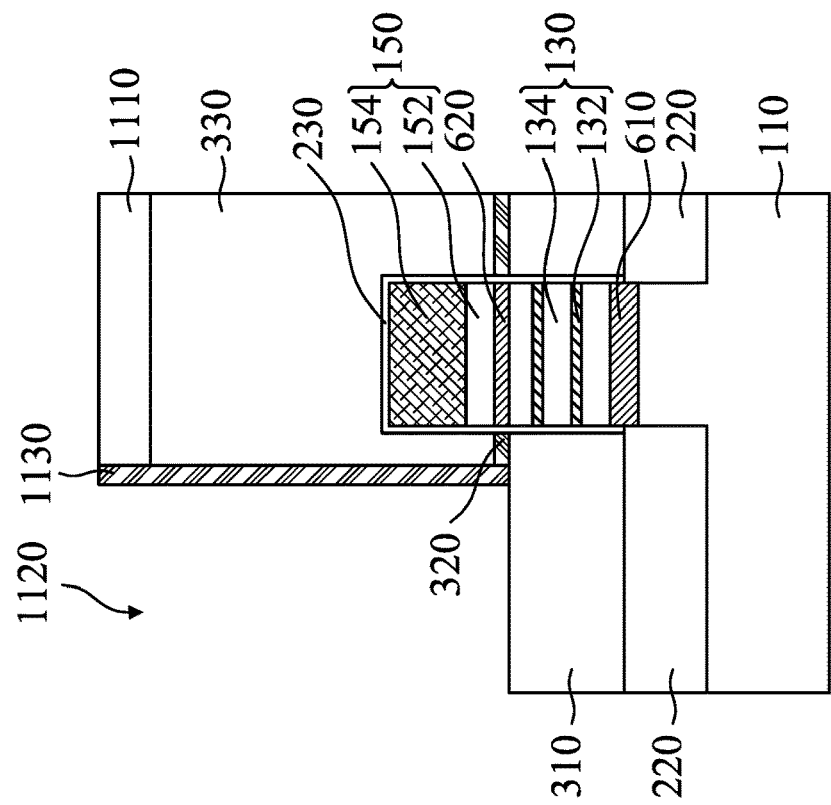
Figures 1, 4K:
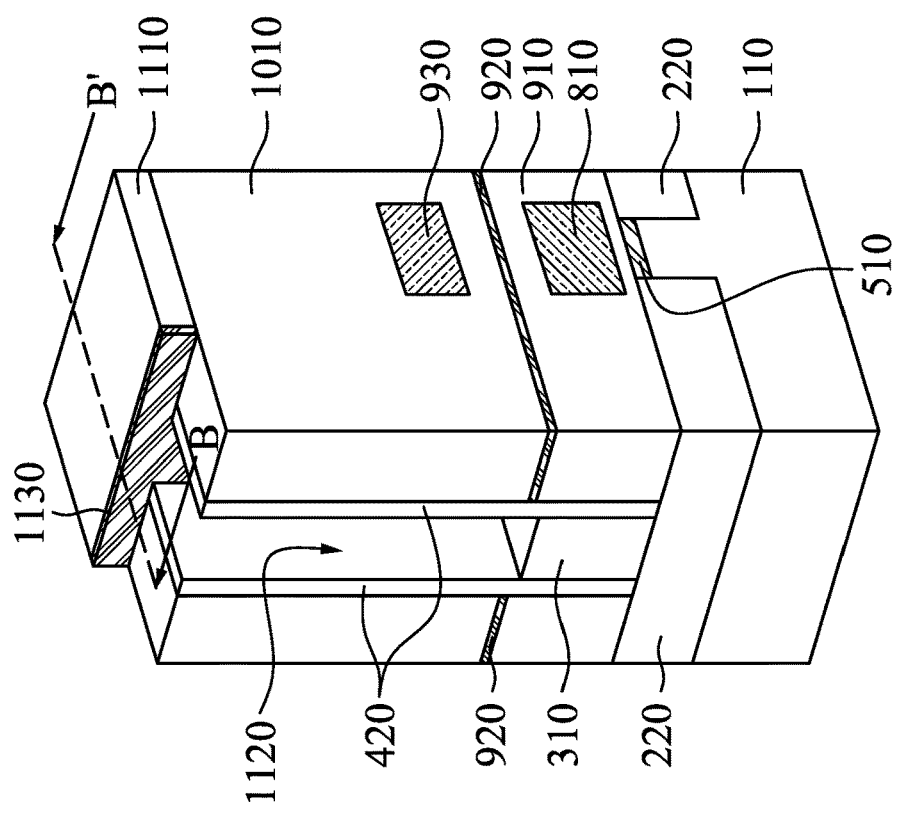
Figures 2, 4M:
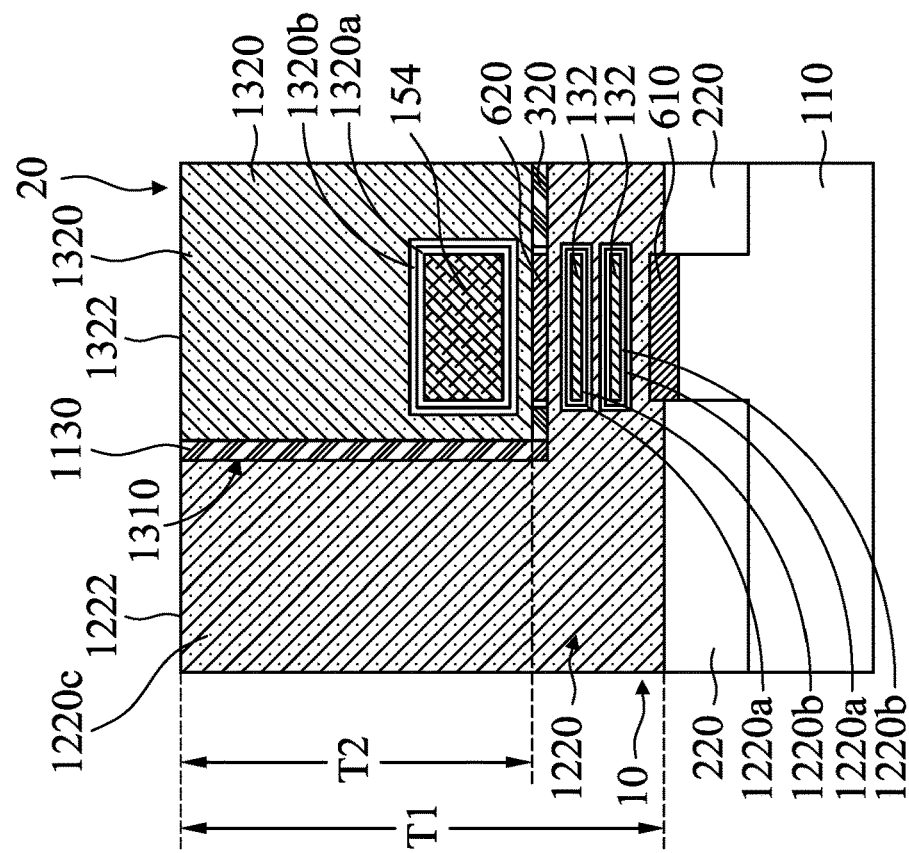
Figures 1, 4M:
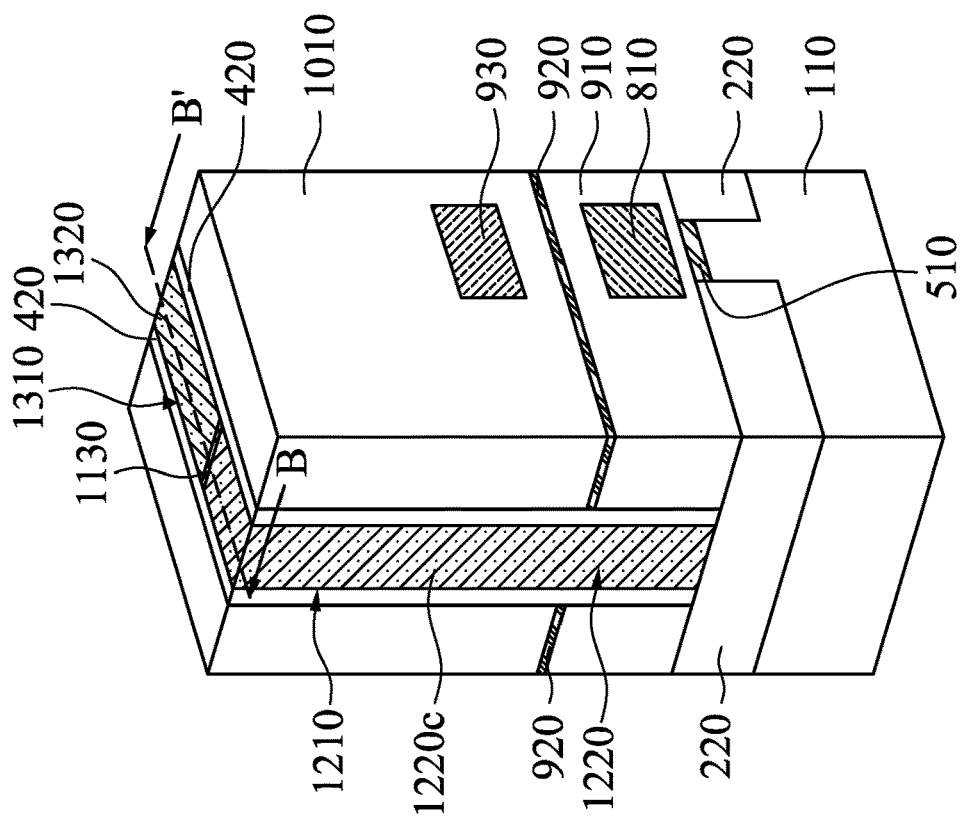
Figure 4O:
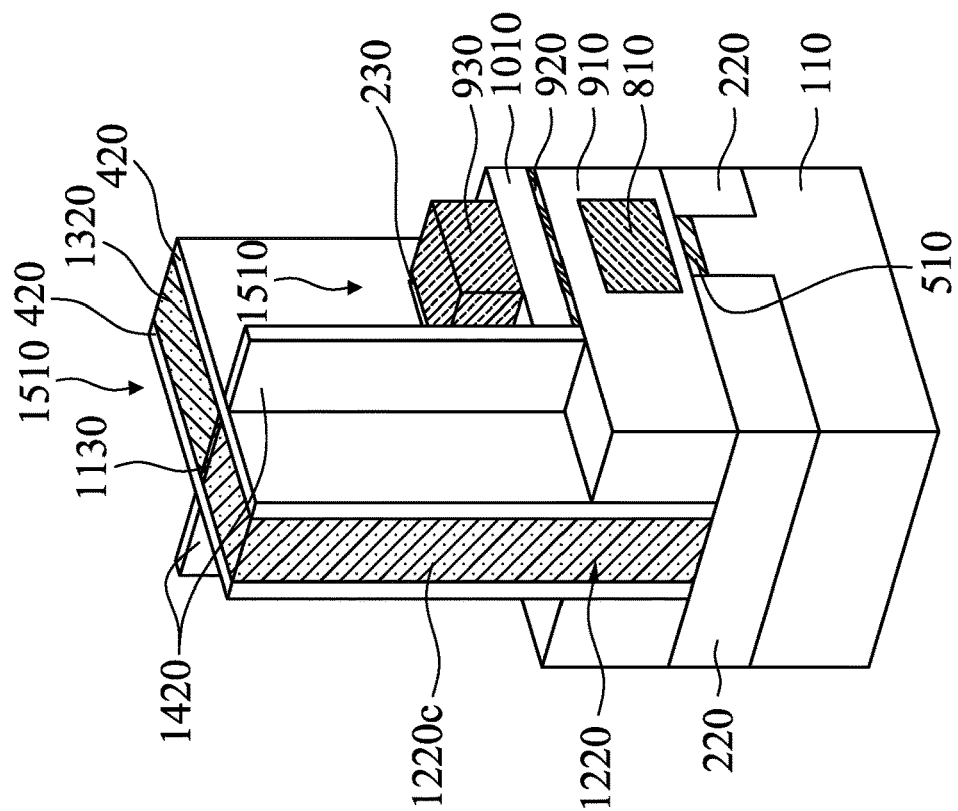
Figure 4N:
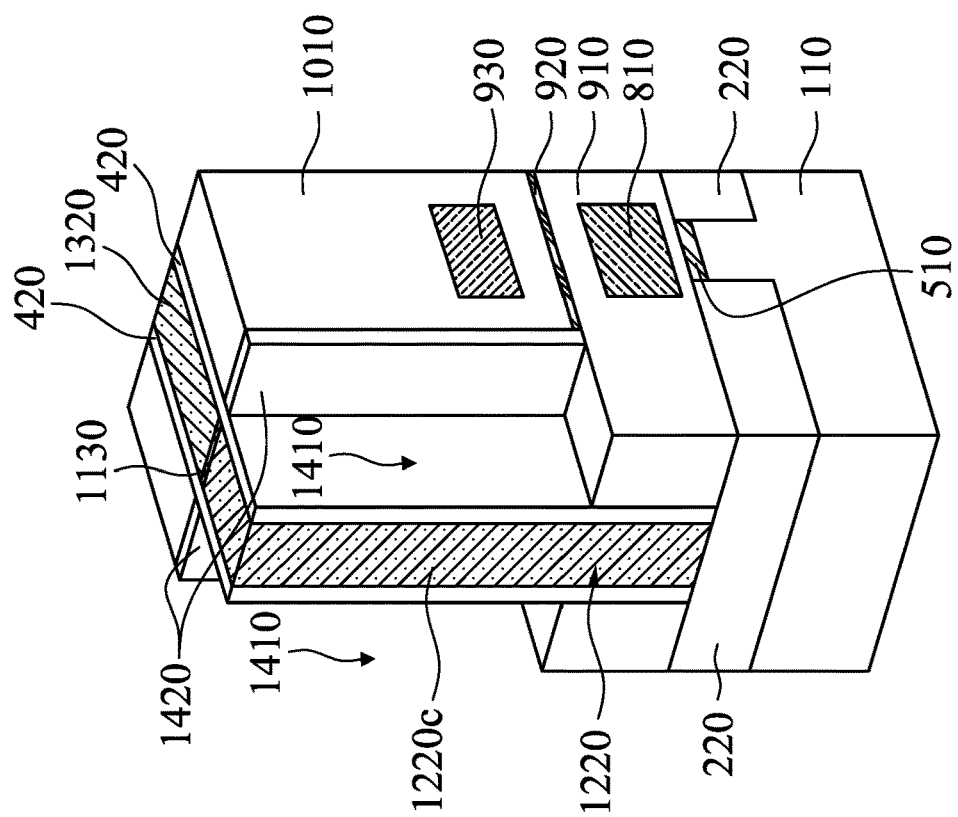
Figure 4Q:
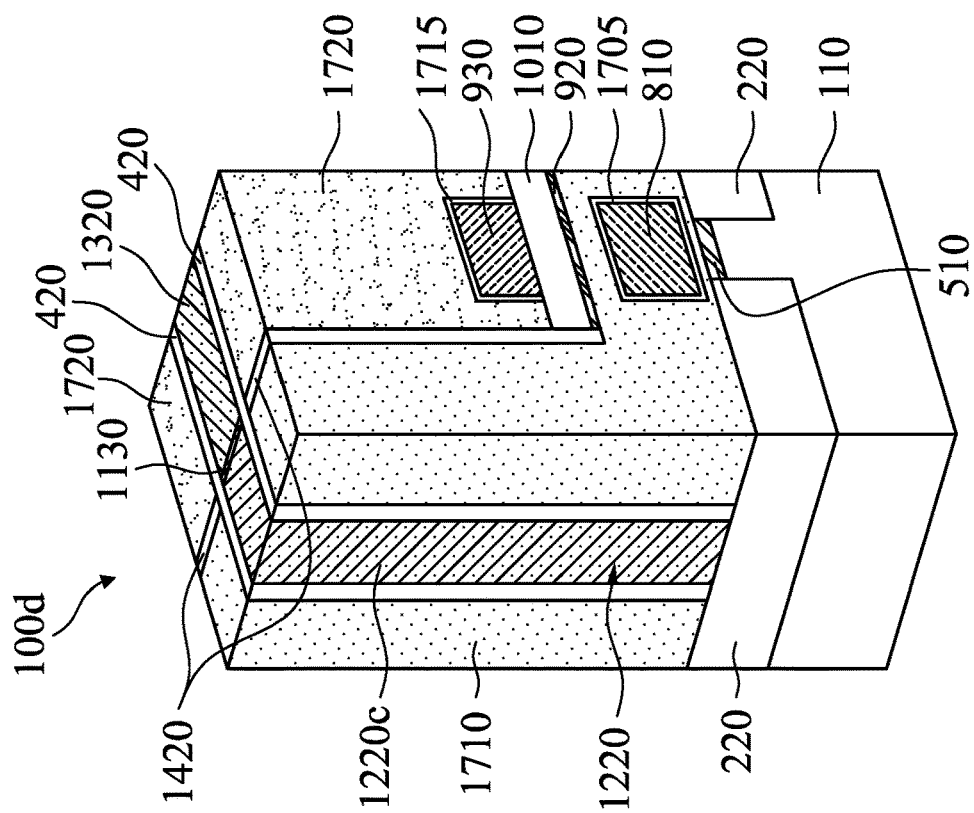
Figure 4P:
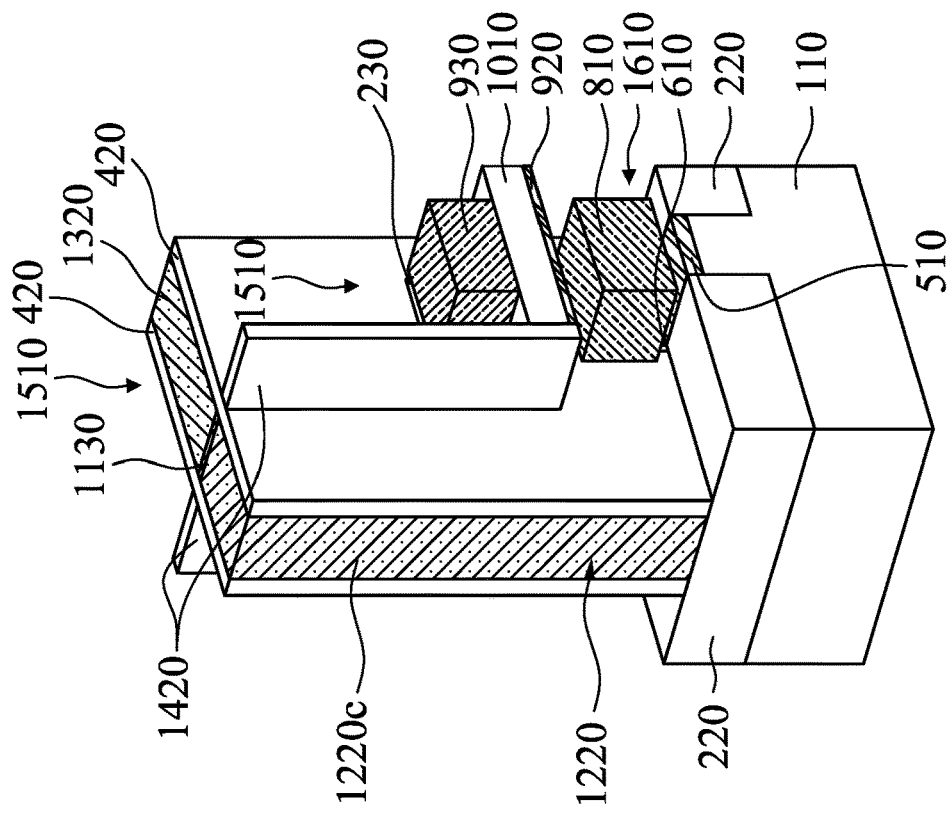

FIGS. 4A-4Q show perspective representations of various stages of forming a semiconductor device structure 100d, in accordance with some embodiments of the disclosure. Some processes and materials used to form the semiconductor device structure 100d are similar to, or the same as, those used to form the semiconductor device structure 100c and are not repeated herein.

As shown in FIG. 4A, the first semiconductor stack 130 is formed over the first sacrificial layer 120, the second semiconductor stack 150 is formed over the second sacrificial layer 140. The second semiconductor stack 150 includes the semiconductor layer 152 and the semiconductor layer 154.

In some embodiments, the semiconductor layer 152 is made of SiGe, and the semiconductor layer 154 is made of Si. In some embodiments, the thickness of the semiconductor layer 152 is smaller than the semiconductor layer 154.

Afterwards, as shown in FIG. 4B, the substrate 110, the first sacrificial layer 120, the first semiconductor stack 130, the second sacrificial layer 140, the second semiconductor stack 150 are patterned by using the patterned hard mask 160 to form the semiconductor strip 210, in accordance with some embodiments of the disclosure.

Afterwards, as shown in FIG. 4C, the first dummy gate layer 310, the etch stop layer 320 and the second dummy gate layer 330 are formed on the semiconductor strip 210, in accordance with some embodiments of the disclosure. Next, the patterned hard mask 340 is formed over the second dummy gate layer 330.

Afterwards, as shown in FIG. 4D, the dummy gate stack 410 crossing the semiconductor strip 210 is formed, and then the gate spacers 420 are formed on sidewalls of the dummy gate stack 410, in accordance with some embodiments of the disclosure.

Next, as shown in FIG. 4E, a portion of the semiconductor strip 210 and the dummy dielectric layer 230 uncovered by the dummy gate stack 410 and the gate spacers 420 are removed to expose the channel portion of the semiconductor strip 210 and the top surface of the substrate 110, in accordance with some embodiments of the disclosure. Subsequently, the insulation layer 510 is formed on the top surface of the substrate 110.

Subsequently, as shown in FIG. 4F, the first sacrificial layer 120 and the second sacrificial layer 140 are removed to form the opening 122 and the opening 142, in accordance with some embodiments of the disclosure. Next, the first inner gate spacer 610 is formed in the opening 122 and the second inner gate spacer 620 is formed in the opening 142.

Subsequently, as shown in FIGS. 4G-1 and 4G-2, the semiconductor layers 134 are trimmed to form the first sidewall spacers 710 on opposite sides of the semiconductor layer 134, the semiconductor layers 152 is trimmed to form the second sidewall spacer 720 below the semiconductor layer 154, in accordance with some embodiments of the disclosure.

It should be noted that, since the materials of the semiconductor layer 152 and semiconductor layers 134 are different from the semiconductor layer 154 and the semiconductor layers 132, etching rates thereof are different, and the semiconductor layer 154 and the semiconductor layers 132 remain in place while the semiconductor layer 152 and the semiconductor layers 134 are trimmed.

Next, as shown in FIGS. 4H-1 and 4H-2, the first epitaxy structures 810 are formed on opposite sidewalls of the semiconductor layers 132 and the semiconductor layer 154, in accordance with some embodiments of the disclosure.

Next, as shown in FIGS. 4I-1 and 4I-2, the bottom ILD 910 is formed to surround the first epitaxy structures 810 in contact with the semiconductor layers 132 and exposes the first epitaxy structures 810 in contact with the second semiconductor layer 154, in accordance with some embodiments of the disclosure. Afterwards, the etch stop layer 920 is formed on the bottom ILD 910, and the second epitaxy structures 930 are formed on opposite sidewalls of the second semiconductor layer 154.

Subsequently, as shown in FIG. 4J, the top ILD 1010 is formed on the etch stop layer 920 and at least on opposite sides of the dummy gate stack 410, in accordance with some embodiments of the disclosure.

Afterwards, as shown in FIGS. 4K-1 and 4K-2, the second dummy gate layer 330 and the etch stop layer 320 are patterned using the patterned hard mask 1110 as a mask to form the trench 1120 between the gate spacers 420, in accordance with some embodiments of the disclosure. The third inner gate spacer 1130 is formed at least on sidewalls of the second dummy gate layer 330 and the etch stop layer 320 exposed by the trench 1120.

Next, as shown in FIGS. 4L-1 and 4L-2, the remaining first dummy gate layer 310, a portion of the dummy dielectric layer 230, and the semiconductor layer 134 are removed to form the recess 1210, in accordance with some embodiments of the disclosure. The first gate stack 1220 is filled in the recess 1210.

Afterwards, as shown in FIGS. 4M-1 and 4M-2, the remaining second dummy gate layer 330, the remaining dummy dielectric layer 230, and the semiconductor layer 152 are removed to form the recess 1310, in accordance with some embodiments of the disclosure. As a result, the semiconductor layer 154 is exposed. Next, the second gate stack 1320 is formed and/or filled in the recess 1310. Therefore, the second gate stack 1320 encircles (wraps) the semiconductor layer 154 and is formed over the first gate stack 1220.

As shown in FIGS. 4M-1 and 4M-2, the first gate stack 1220 is a n-type metal gate stack, and the second gate stack 1320 is an p-type metal gate stack. In some other embodiments, the first gate stack 1220 is an p-type metal gate stack, and the second gate stack 1320 is a n-type metal gate stack.

As shown in FIGS. 4M-1 and 4M-2, the semiconductor layers 132, the first epitaxy structures 810, and the first gate stack 1220 form the first device 10, such as an n-type FET (NFET). The semiconductor layer 154, the second epitaxy structures 930, and the second gate stack 1320 form the second device 20, such as a p-type FET (PFET). The first device 10 has a horizontal-gate-all-around (HGAA) device, and the second device 20 also has a horizontal-gate-all-around (HGAA) device. Therefore, the first device 10 and the second device 20 are stacked on the substrate 110, and the first device 10 is disposed between the second device 20 and the substrate 110.

Subsequently, the processes performed on FIGS. 4N-4Q are the same as, or similar to the process performed on FIGS. 3A-3Q, and thus are omitted for brevity.

In the fourth embodiment, the first device 10, such as a n-type FET (NFET) is formed over the substrate 110, and the second device 20, such as p-type FET (PFET) is formed over the first device 10. In some embodiments, the first device 10 includes a number of nanostructures (or called nanowires or nanosheets) having a number of Si channels, and the second device 20 includes a nanostructure (or called nanowire or nanosheet) having a Si channel. In some other embodiments, the first device 10 includes a number of nanostructures (or called nanowires or nanosheets) having a number of Si channels, and the second device 20 includes a nanostructure (nanowire) having a SiGe channel.

Embodiments for forming a semiconductor device structure and method for formation the same are provided. The FinFET device and the GAA device are stacked in a vertical direction. The FinFET device and the GAA device are isolated from each other by inner gate spacers. By this design, the layout area of the semiconductor device is reduced and the device density thereof is increased.

In some embodiments, a semiconductor device structure is provided. The semiconductor device structure includes a first device formed over a substrate, and the first device includes a first fin structure. The semiconductor device structure also includes a second device formed over or below the first device, and the second device includes a plurality of second nanostructures stacked in a vertical direction.

In some embodiments, a semiconductor device structure is provided. The semiconductor device structure includes a first device formed over a substrate, and the first device includes a first fin structure. The semiconductor device structure includes a first gate stack wrapped around the first fin structure, and a second device formed over the first device. The second device includes a plurality of second nanostructures stacked in a vertical direction. The semiconductor device structure includes a second gate stack wrapped around the second nanostructures, and a topmost surface of the first gate stack is higher than a bottom surface of the second gate stack.

In some embodiments, a semiconductor device structure is provided. The semiconductor device structure includes a plurality of first nanostructures formed over a substrate, and the first nanostructures stacked in a vertical direction. The semiconductor device structure also includes a first gate stack wrapped around the first nanostructures, and a first inner gate spacer formed over the first nanostructures. The semiconductor device structure further includes a second fin structure formed over the first inner gate spacer, and a second gate stack wrapped around the second fin structure.

In some embodiments, a semiconductor device structure is provided. The semiconductor device structure includes a first device formed over a substrate, wherein the first device includes a first fin structure and a first S/D structure (FIG. 1Q, 810) formed over the first fin structure. The semiconductor device structure includes a second device formed over or below the first device, and the second device includes a plurality of second nanostructures stacked in a vertical direction. The semiconductor device structure also includes a second S/D structure formed over the second nanostructures, and the second S/D structure is directly above or below the first S/D structure.

In some embodiments, a semiconductor device structure is provided. The semiconductor device structure includes a first device formed over a substrate, and the first device includes a first fin structure, the first fin structure has a first height. The semiconductor device structure includes a first gate stack wrapped around the first fin structure, and a gate spacer layer formed on a sidewall of the first gate stack. The semiconductor device structure includes a second device formed over the first device, and the second device includes a plurality of second nanostructures stacked in a vertical direction, each of the second nanostructures has a second height, and the first height is greater than the second height. The semiconductor device structure includes a second gate stack wrapped around the second nanostructures, and a first inner gate spacer between the first gate stack and the second gate stack, wherein the first inner gate spacer is perpendicular to the gate spacer layer. In some embodiments, a semiconductor device structure is provided. The semiconductor device structure includes a plurality of first nanostructures formed over a substrate, and the first nanostructures are stacked in a vertical direction. The semiconductor device structure includes a first gate stack wrapped around the first nanostructures, and a first inner gate spacer formed over the first nanostructures. The semiconductor device structure includes a second fin structure formed over the first inner gate spacer, and a second gate stack wrapped around the second fin structure. The first gate stack is different and separated from the second gate stack, and the first inner gate spacer is between the first gate stack and the second gate stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
    a first device formed over a substrate, wherein the first device comprises a first fin structure, and the first fin structure is a single structure having a first height;
    a first S/D structure formed over the first fin structure;
    a first gate stack wrapped around the first fin structure;
    a second device formed over or below the first device, wherein the second device comprises a plurality of second nanostructures stacked in a vertical direction, and each of the second nanostructures has a second height, and the first height is greater than the second height; and
    a second S/D structure formed over the second nanostructures, wherein the second S/D structure is directly above or below the first S/D structure,
    a second gate stack wrapped around the second nanostructures; and
    an inner gate spacer between the first gate stack and the second gate stack, and the inner gate spacer is in direct contact with the first gate stack and the second gate stack.

2. The semiconductor device structure as claimed in claim 1, wherein a bottommost surface of the second gate stack is higher than a bottommost surface of the first gate stack.

3. The semiconductor device structure as claimed in claim 2, wherein a topmost surface of the first gate stack is coplanar with a topmost surface of the second gate stack.

4. The semiconductor device structure as claimed in claim 2, wherein the first gate stack has a L-shaped structure.

5. The semiconductor device structure as claimed in claim 1, further comprising:
    a first contact surrounding the first S/D structure, wherein a portion of the first contact is below the first S/D structure.

6. The semiconductor device structure as claimed in claim 1, further comprising:
    an etch stop layer between the first S/D structure and the second S/D structure.

7. The semiconductor device structure as claimed in claim 6, further comprising:
    a dielectric layer over the etch stop layer; and
    a second contact formed over the dielectric layer, wherein an interface between the dielectric layer and the second contact is lower than a top surface of the second S/D structure.

8. The semiconductor device structure as claimed in claim 1, wherein one of the first S/D structure and the second S/D structure is a P-type device and the other is an N-type device.

9. The semiconductor device structure as claimed in claim 1, wherein one of the first device and the second device is a logic circuit device, and the other is a static random access memory (SRAM).

10. A semiconductor device structure, comprising:
    a first device formed over a substrate, wherein the first device comprises a first fin structure, the first fin structure has a first height;
    a first gate stack wrapped around the first fin structure;
    a gate spacer layer formed on a sidewall of the first gate stack;
    a second device formed over the first device, wherein the second device comprises a plurality of second nanostructures stacked in a vertical direction, each of the second nanostructures has a second height, and the first height is greater than the second height;
    a second gate stack wrapped around the second nanostructures; and
    a first inner gate spacer between the first gate stack and the second gate stack, wherein the first inner gate spacer is perpendicular to the gate spacer layer, the first inner gate spacer has a third height along the vertical direction, and the third height is greater than the first height.

11. The semiconductor device structure as claimed in claim 10, further comprising:
    a second inner gate spacer below the second gate stack, wherein the second inner gate spacer comprises a top surface in direct contact with the second gate stack and a bottom surface in direct contact with the first gate stack.

12. The semiconductor device structure as claimed in claim 10, further comprising:
    a third inner gate spacer below the first fin structure, wherein a top surface of the third inner gate spacer is in direct contact with a bottom surface of the first fin structure.

13. The semiconductor device structure as claimed in claim 10, further comprising:
    a first S/D structure adjacent to the first gate stack; and
    a second S/D structure adjacent to the second gate stack, wherein the second S/D structure is directly above the first S/D structure.

14. The semiconductor device structure as claimed in claim 13, further comprising:
    a first contact surrounding the first S/D structure, wherein the first contact has a L-shaped structure.

15. The semiconductor device structure as claimed in claim 10, wherein one of the first device and the second device is a logic circuit device, and the other is a static random access memory (SRAM).

16. A semiconductor device structure, comprising:
a plurality of first nanostructures formed over a substrate, wherein the first nanostructures are stacked in a vertical direction;
a first gate stack wrapped around the first nanostructures;
a first inner gate spacer formed over the first nanostructures;
a second fin structure formed over the first inner gate spacer; and
a second gate stack wrapped around the second fin structure, wherein the first gate stack is different and separated from the second gate stack, and the first inner gate spacer is between the first gate stack and the second gate stack, and a topmost surface of the first inner gate spacer is in direct contact with a bottommost surface of the second fin structure.

17. The semiconductor device structure as claimed in claim 16, further comprising:
a second inner gate spacer adjacent to the second fin structure, wherein the second inner gate spacer is perpendicular to the first inner gate spacer.

18. The semiconductor device structure as claimed in claim 17, further comprising:
a gate spacer layer adjacent to the first gate stack, wherein the gate spacer layer is in direct contact with the second inner gate spacer.

19. The semiconductor device structure as claimed in claim 16, wherein a bottommost surface of the second gate stack is higher than a bottommost surface of the first gate stack.

20. The semiconductor device structure as claimed in claim 16, wherein a top surface of the first gate stack is substantially coplanar with a top surface of the second gate stack.

* * * * *